(12) United States Patent
Lee et al.

(10) Patent No.: US 10,204,892 B2
(45) Date of Patent: Feb. 12, 2019

(54) SEMICONDUCTOR PACKAGE

(71) Applicant: Samsung Electronics Co., Ltd., Suwon-si (KR)

(72) Inventors: Tae-young Lee, Incheon (KR); Joon-young Oh, Seongnam-si (KR); Sung-wook Hwang, Seongnam-si (KR); Yeoung-jun Cho, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 18 days.

(21) Appl. No.: 15/622,394

(22) Filed: Jun. 14, 2017

(65) Prior Publication Data
US 2017/0358564 A1    Dec. 14, 2017

(30) Foreign Application Priority Data

Jun. 14, 2016  (KR) .................. 10-2016-0073835

(51) Int. Cl.
*H01L 23/00* (2006.01)
*H01L 23/31* (2006.01)
(Continued)

(52) U.S. Cl.
CPC .......... *H01L 25/18* (2013.01); *H01L 23/3121* (2013.01); *H01L 24/33* (2013.01);
(Continued)

(58) Field of Classification Search
CPC . H01L 25/18; H01L 23/3121; H01L 25/0657; H01L 25/0652; H01L 24/33; H01L 24/49
See application file for complete search history.

(56) References Cited

U.S. PATENT DOCUMENTS 6,930,378 B1 * 8/2005 St. Amand .......... H01L 25/0657
                                                              257/685
6,933,597 B1    8/2005 Poddar et al.
(Continued)

FOREIGN PATENT DOCUMENTS

JP          2004-158536      6/2004
JP            5880664        3/2016

*Primary Examiner* — Tom Thomas
*Assistant Examiner* — Benjamin Tzu-Hung Liu
(74) *Attorney, Agent, or Firm* — Muir Patent Law, PLLC

(57) ABSTRACT

A semiconductor package may be composed of a variety of different types of semiconductor chips of different sizes and support structures stacked within the semiconductor package. Semiconductor chips having a larger chip size may be stacked above smaller semiconductor chips. Smaller chips may be included in a layer of the semiconductor package along with a support structure which may assist supporting upper semiconductor chips, such as during a wire bonding process connecting bonding wires to chip pads of the semiconductor chips above the support structure. Use of different thicknesses of die attach film may allow for a further reduction in height of the semiconductor package. When implemented as a package housing a memory controller, DRAM semiconductor chips and non-volatile memory chips, locating the memory controller in a lower layer of the semiconductor package facilitates usage of the package substrate as a redistribution layer to provide communications between the memory controller and the DRAM and non-volatile memory chips.

19 Claims, 43 Drawing Sheets

(51) Int. Cl.
*H01L 25/18* (2006.01)
*H01L 25/065* (2006.01)

(52) U.S. Cl.
CPC .......... *H01L 24/49* (2013.01); *H01L 25/0652* (2013.01); *H01L 25/0657* (2013.01); *H01L 23/3128* (2013.01); *H01L 24/16* (2013.01); *H01L 24/32* (2013.01); *H01L 24/48* (2013.01); *H01L 24/73* (2013.01); *H01L 24/83* (2013.01); *H01L 2224/02381* (2013.01); *H01L 2224/04042* (2013.01); *H01L 2224/16227* (2013.01); *H01L 2224/32145* (2013.01); *H01L 2224/32225* (2013.01); *H01L 2224/48091* (2013.01); *H01L 2224/48145* (2013.01); *H01L 2224/48227* (2013.01); *H01L 2224/49105* (2013.01); *H01L 2224/49175* (2013.01); *H01L 2224/73204* (2013.01); *H01L 2224/73253* (2013.01); *H01L 2224/73265* (2013.01); *H01L 2224/83191* (2013.01); *H01L 2225/0651* (2013.01); *H01L 2225/06506* (2013.01); *H01L 2225/06517* (2013.01); *H01L 2225/06527* (2013.01); *H01L 2225/06562* (2013.01); *H01L 2225/06575* (2013.01); *H01L 2924/00014* (2013.01); *H01L 2924/1431* (2013.01); *H01L 2924/1436* (2013.01); *H01L 2924/1438* (2013.01); *H01L 2924/1461* (2013.01); *H01L 2924/157* (2013.01); *H01L 2924/1579* (2013.01); *H01L 2924/15311* (2013.01); *H01L 2924/15787* (2013.01); *H01L 2924/181* (2013.01); *H01L 2924/19107* (2013.01); *H01L 2924/37001* (2013.01)

(56) References Cited

U.S. PATENT DOCUMENTS

| | | | |
|---|---|---|---|
| 7,161,249 | B2 | 1/2007 | Shim et al. |
| 7,859,119 | B1 | 12/2010 | St Amand et al. |
| 7,928,551 | B2 | 4/2011 | Fujiwara et al. |
| 7,989,941 | B2 | 8/2011 | Chin et al. |
| 8,169,058 | B2 | 5/2012 | Pagaila et al. |
| 8,729,688 | B2 | 5/2014 | Jung et al. |
| 8,803,336 | B2 | 8/2014 | Lee et al. |
| 8,881,389 | B2 | 11/2014 | Kanapathippillai et al. |
| 8,941,999 | B2 | 1/2015 | Haba et al. |
| 9,177,886 | B2 | 11/2015 | Ko et al. |
| 2003/0127719 | A1 | 7/2003 | Chang |
| 2007/0287227 | A1 | 12/2007 | Huddleston et al. |
| 2009/0166887 | A1* | 7/2009 | Upadhyayula ........ H01L 21/561 257/777 |
| 2009/0200652 | A1* | 8/2009 | Oh ...................... H01L 25/0657 257/686 |
| 2011/0089575 | A1 | 4/2011 | Lee |
| 2013/0015589 | A1* | 1/2013 | Liao .................... H01L 25/0657 257/777 |
| 2013/0277831 | A1 | 10/2013 | Yoon et al. |
| 2014/0071610 | A1 | 3/2014 | Kanapathippillai et al. |

* cited by examiner

SEMICONDUCTOR PACKAGE

CROSS-REFERENCE TO RELATED APPLICATION

This application claims the benefit of Korean Patent Application No. 10-2016-0073835, filed on Jun. 14, 2016 in the Korean Intellectual Property Office, the disclosure of which is herein incorporated by reference in its entirety.

BACKGROUND

The inventive concept relates to a semiconductor package, and more particularly, to a semiconductor package having a plurality of stacked semiconductor chips.

As the electronic industry rapidly advances and the requirements of users increase, electronic devices are becoming more and more miniaturized and lightweight and increased in their capacity. Therefore, semiconductor packages containing a plurality of semiconductor chips are being developed to support these electronic devices. Also, semiconductor packages packaging a variety of different kinds of semiconductor chips are being manufactured. However, it is typical different kinds of semiconductor chips will have different sizes, and thus packaging a stack of different sized chips provides a challenge to provide appropriate package protection and yield without unnecessarily increasing the package size.

SUMMARY

The inventive concept provides a semiconductor package with reliability, in which various kinds of semiconductor chips having various sizes are stacked.

According to some embodiments, a multi-chip semiconductor device package may comprise a package substrate housing different types of semiconductor chips having different sizes and one or more support structures. In some examples, the multi-chip semiconductor device package may comprise a DRAM layer comprising a first DRAM semiconductor chip confined within a first area with respect to a top down view; a memory controller layer comprising a memory controller semiconductor chip confined within a second area with respect to a top down view, and a first support structure spaced apart from the memory controller semiconductor chip, wherein top surfaces of the memory controller semiconductor chip and the first support structure are substantially coplanar and wherein the support structure does not comprise any logic circuitry; a nonvolatile memory layer comprising a stack of nonvolatile memory semiconductor chips, a first nonvolatile memory semiconductor chip of the nonvolatile memory semiconductor chips confined within a third area with respect to a top down view; and an encapsulant about the sides and above the semiconductor chips of the DRAM layer, the memory controller layer and the nonvolatile memory layer. One of the DRAM layer and the memory controller layer may be a first layer of the semiconductor package, and the other of the DRAM layer and the memory controller layer may be a second layer of the semiconductor package, and the nonvolatile memory layer may be a third layer of the semiconductor package, where the first layer is on the package substrate, the second layer is on the first layer and the third layer is on the second layer, and the third area is larger than the first area and larger than the second area.

In some examples, different thicknesses of die attach film may be used to attach chips within the semiconductor package.

In some examples, the memory controller may communicate with the DRAM and non-volatile memory chips through wiring of the package substrate.

BRIEF DESCRIPTION OF THE DRAWINGS

Embodiments of the inventive concept will be more clearly understood from the following detailed description taken in conjunction with the accompanying drawings in which:

FIG. 9B is a cross-sectional view of the semiconductor package of FIG. 9A;

DETAILED DESCRIPTION OF THE EMBODIMENTS

Figure 1A:
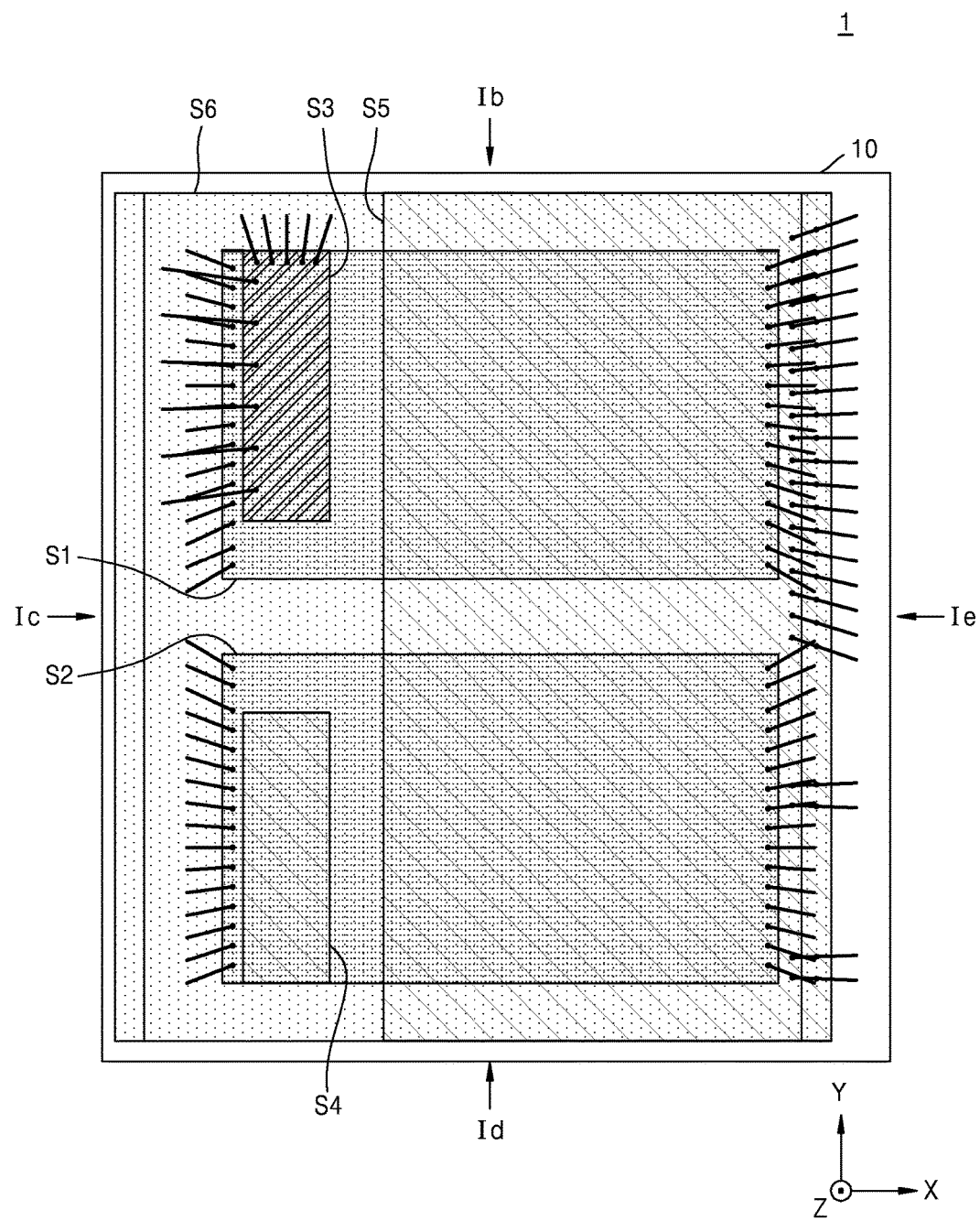
FIG. 1A is a plan layout illustrating a main portion of a semiconductor package according to an embodiment.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

In the present specification, a layer of a package denotes volume of the package extending from a first height to a second height above a main surface of a package substrate (such as floors of a building). For example, a volume extending from an upper surface of the package substrate to a first level may comprise a first layer of the package, an area from the first level to a second level higher than the first level comprise a second layer of the package, etc. Use of "first," "second" etc. does not indicate an order of the layers unless context indicates otherwise (e.g., a third layer may be interposed between a first package layer and second package layer. The package layers may have several components and layers therein.

In the present specification, a structure denotes one semiconductor chip, a plurality of semiconductor chips which are the same kind and stacked, or a supporter. The plurality of semiconductor chips which are the same kind and stacked may be, for example, a structure and may comprise a plurality of semiconductor chips which are stacked and aligned with each other in a vertical direction or a plurality of semiconductor chips which have a stair structure and are stacked. In some embodiments, the plurality of semiconductor chips that are the same kind and stacked may be a plurality of memory semiconductor chips which are stacked for providing a high capacity. In the present specification, a structure may further include die attach film(s) for attaching a semiconductor chip or a supporter to a lower surface of the structure.

Moreover, in the present specification, when a plurality of structures are disposed in a layer, the plurality of structures disposed in the layer may each be referred to as a sub-structure, and the plurality of sub-structures may be spaced apart from each other.

A semiconductor package may have independent structures disposed in respective layers. For example, the semiconductor package may include at least one first structure located in a first layer on a main surface of a package substrate, at least one second structure disposed on the at least one first structure and located in a second layer, and at least one third structure disposed on the at least one second structure and located in a third layer. In this case, the at least one first structure located in the first layer may support the at least one second structure located in the second layer, and the at least one second structure located in the second layer may support the at least one third structure located in the third layer.

In some embodiments, a semiconductor package may include at least one the first structure, at least one the second structure, at least one the third structure, and at least one extension structure located over the first layer and the second layer, and at least one the second structure located in the second layer and the extension structure located over the first layer and the second layer may support the third structure located in the third layer.

Uppermost surfaces of structures that are located in the same layer may be coplanar and may correspond to an uppermost level of a corresponding layer. "Coplanar" or "substantially coplanar" as used in this disclosure contemplates an acceptable deviation from a geometric plane, such as 5 um. Coplanar surfaces thus may lie within 5 um of a certain height. For example, uppermost surfaces of a plurality of structures located in the first layer may be located within 5 um of a first height, and uppermost surfaces of a plurality of structures located in the second layer may be located within 5 um of a second height.

An uppermost surface of a structure located over two or more layers, like the extension structure, may be located on a plane of an uppermost level of an uppermost layer. For example, an uppermost surface of a structure located over the first layer and the second layer may be located on the second level.

Hereinafter, embodiments will be described in detail with reference to the accompanying drawings.

FIG. 1A is a plan layout illustrating a main portion of a semiconductor package 1 according to an embodiment, and FIGS. 1B to 1E are different cross-sectional views of the semiconductor package 1 of FIG. 1A. In detail, FIGS. 1B to 1E are cross-sectional views of portions adjacent the four different sides of the semiconductor package 1 illustrated in FIG. 1A, respectively corresponding to views Ib, Ic, Id and Ie denoted in FIG. 1.

Referring to FIGS. 1A to 1E, the semiconductor package 1 may include a package substrate 10 and a plurality of structures S1 to S6 which are stacked to be disposed in a first layer L1, a second layer L2, and a third layer L3 on the package substrate 10.

The package substrate 10 may be, for example, a printed circuit board (PCB), a ceramic substrate, or an interposer. When the package substrate 10 is a PCB, the package substrate 10 may include a substrate base 12, an upper pads (not shown) and lower pads 14 respectively disposed on an upper surface and a lower surface of the substrate base 12. The upper pads and the lower pads 14 may be exposed by a solder resist layer (not shown) covering the upper surface and lower surface of the substrate base 12. The substrate base 12 may be formed of at least one material selected from among phenol resin, epoxy resin, and polyimide. For example, the substrate base 12 may include at least one material selected from among FR4, tetrafunctional epoxy, polyphenylene ether, epoxy/polyphenylene oxide, bismaleimide triazine (BT), thermount, cyanate ester, polyimide, and liquid crystal polymer. The upper pads and the lower pads 14 may each be formed of conductive metal, such as copper (Cu), nickel, stainless steel, beryllium Cu, and/or the like. The substrate base 10 may include internal wiring (not shown) that electrically connects various ones of the upper pads and the lower pads 14. The internal wiring may include wiring that connects upper pads to corresponding lower pads and ma include wiring that connect upper pads to other upper pads. The wiring may be disposed in several layers of the substrate base 12 and may be formed as patterned wiring on several layers of the substrate base 12 and interconnected by conductive vias through such layers of the substrate base 12. The upper pads and the lower pads 14 may be portions, exposed by the solder resist layer, of a circuit wiring which is formed by coating a Cu foil on the upper surface and lower surface of the substrate base 12 and then patterning the Cu foil.

When the package substrate 10 is an interposer, the package substrate 10 may include the substrate base 12 formed from a semiconductor material, with the upper pads (not shown) and the lower pads 14 respectively disposed on the upper surface and lower surface of the substrate base 12. The substrate base 12 may be a portion of a silicon wafer (e.g., crystalline silicon) or other crystalline semiconductor material. Also, internal wiring (not shown) may be disposed on the upper surface and lower surfaces of the substrate base 12 and may have through vias (not shown) that electrically connects various ones of the upper pads to the lower pads 14.

An external connection terminals 16 may be attached to the lower pad 14 of the package substrate 10. The external connection terminals 16 may be, for example, a solder bump or a solder ball. The external connection terminals 16 are terminals of the package 1 to provide power to (e.g., positive, negative and/or ground voltages) and electrical signal communications between the package 1 (and the various semiconductor chips therein) and an external device to which package 1 may be electrically connected via the external connection terminals 16.

A first structure comprising substructures S1 and S2 is disposed in the first layer L1 and attached to the package substrate 10. The first sub-structure S1 and the second sub-structure S2 may be disposed on the package substrate 10 and spaced apart from each other.

The first sub-structure S1 and the second sub-structure S2 may each include a plurality of first semiconductor chips 110, which are stacked. In this example, the first sub-structure S1 and the second sub-structure S2 each include a plurality of first semiconductor chips 110 which are stacked so that edges of the first semiconductor chips 110 are aligned with each other as shown in FIGS. 1B to 1E.

FIGS. 1A to 1E illustrate that the first sub-structure S1 and the second sub-structure S2 each include two first semiconductor chips 110 which are stacked, but the present embodiment is not limited thereto. For example, the first sub-structure S1 and the second sub-structure S2 may each comprise only one semiconductor chip 110, or the first sub-structure S1 and the second sub-structure S2 may each include three or more first stacked semiconductor chips 110.

A semiconductor substrate of in the first semiconductor chip 110 may be formed of a crystalline semiconductor material such as, for example, silicon (Si), germanium (Ge), or a compound semiconductor, such as, Si carbide (SiC), gallium arsenide (GaAs), indium arsenide (InAs), or indium phosphide (InP). Alternatively, the semiconductor substrate included in the first semiconductor chip 110 may be a silicon-on-insulator (SOI) structure. For example, the semiconductor substrate of the first semiconductor chip 110 may be a buried oxide (BOX) layer. The semiconductor substrate of in the first semiconductor chip 110 may include a conductive region. The conductive region may be, for example, an impurity-doped well. The semiconductor substrate of in the first semiconductor chip 110 may have various isolation structures such as a shallow trench isolation (STI) structure.

The first semiconductor chip 110 may include a plurality of various kinds of individual devices. The plurality of individual devices may include metal-oxide-semiconductor field effect transistors (MOSFET) (planar and/or fin-type) forming complementary metal-oxide-semiconductor (CMOS) logic circuits, sensors and/or other active or passive electronic components connected to form various microelectronic devices, such as, e.g. memory. In certain embodiments the microelectronic device(s) of the semiconductor chip 110 may be a large scale integration (LSI) device, an image sensor (e.g., a CMOS imaging sensor (CIS)), a micro-electro-mechanical system (MEMS) component, an active device, and/or a passive device. The individual devices within the semiconductor chip 110 may be electrically connected to each other by conductive wiring (formed from patterned layer(s) of conductive material(s) and/or conductive plug(s)). The individual devices may be electrically separated from other adjacent individual devices by insulation layers.

Each of the first semiconductor chips 110 may have its active surface (the surface where the plurality of individual devices are formed) facing away from the package substrate 10 (facing upward as shown in FIGS. 1B to 1E).

The first semiconductor chips 110 of the first and second sub-structures S1 and S2 may be, for example, the same kind of memory semiconductor chips and may be identical memory semiconductor chips (i.e., same circuit design made by the same manufacturing recipe). In some embodiments, each of the first semiconductor chips 110 may be a memory chip having higher access speeds than other memory chips in the semiconductor package 1 and/or may function as a cache memory of the semiconductor package 1. For example, the first semiconductor chips 110 may be a volatile memory chips such as dynamic random access memory (DRAM), but are not limited thereto. In some embodiments, the first semiconductor chip 110 may be a high bandwidth memory (HBM) DRAM semiconductor chip.

Each of the first semiconductor chips 110 may be electrically connected to the package substrate 10 through first bonding wires 112. Lowermost ones of the first semiconductor chips 110 may be attached to the package substrate 10 by a first die attach film 114 while remaining ones of the first semiconductor chips 110 may be attached to a lower first semiconductor chip 110 by a second die attach film 116.

The second die attach film 116 may be thicker than the first die attach film 114. In this example, a portion of the first bonding wires 112 that electrically connect the package substrate 10 to the lowermost first semiconductor chips 110 disposed may be buried in the corresponding second die attach film 116 on the corresponding lowermost first semiconductor chip. The relatively thicker second die attach film 116 may provide sufficient spacing between the stacked first semiconductor chips 110 to avoid contact between the first bonding wires 112 connected to the lowermost first semiconductor chips 110 and the first semiconductor chips 110 stacked on the lowermost first semiconductor chips 110. In alternatives to this embodiment and other embodiments having similar structure to the stack of first semiconductor chips 110, the first semiconductor chips 110 may be stacked in a staggered fashion (where edges are not aligned to expose chip pads of lower chips, such as a stair step fashion) first bonding wire 112 may not be buried in the first die attach film 114.

An uppermost surface of the first structure S1, S2 (i.e., an uppermost surface of each of the first and second sub-structures S1 and S2) disposed in the first layer L1 may be coplanar (as discussed above), and falling on a plane spaced apart and parallel with a main surface of the package substrate 10. The first and second sub-structures S1 and S2 may have the same thickness (same vertical height). That is, a thickness to which the first semiconductor chip 110, the first die attach film 114, and the second die attach film 116 configuring the first sub-structure S1 are stacked may be equal to a thickness to which the first semiconductor chip 110, the first die attach film 114, and the second die attach film 116 configuring the second sub-structure S2 are stacked.

A second structure S3, S4, S5 disposed in the second layer L2 may be attached to the first structure S1 and S2. The second structure S3, S4, S5 may include a third sub-structure S3, a fourth sub-structure S4, and a fifth sub-structure S5. The third sub-structure S3, the fourth sub-structure S4, and the fifth sub-structure S5 may be disposed on the first structure S1, S2 and spaced apart from each other.

The third sub-structure S3 may be attached to the first sub-structure S1. The third structure S3 may be attached to the first sub-structure S1 and confined within the boundaries of the first sub-structure S1 (with respect to a top down view) so as not to protrude over edges of the first sub-structure S1. The fourth sub-structure S4 may be attached to the second sub-structure S2. The fourth structure S4 may be attached to the second sub-structure S2 and confined within the boundaries of the second sub-structure S2 (with respect to a top down view) so as not to protrude over edges of the second sub-structure S2.

The third sub-structure S3 and the fourth sub-structure S4 may be symmetrically positioned with respect to a center line of the package 1 (here, a line passing through the center of the package and parallel to edges of the package 1). The third sub-structure S3 and fourth sub-structure S4 may be formed of monolithic structures having the same geometric shape with the same dimensions (in this example, the same rectangular prism).

The fifth sub-structure S5 may be attached over the first sub-structure S1 and the second sub-structure S2. The fifth sub-structure S5 may be attached to and extend over both the first sub-structure S1 and the second sub-structure S2 to protrude past outside edges the first sub-structure S1 and the second sub-structure S2. Therefore, a portions of the fifth sub-structure S5 may be attached to the first sub-structure S1 and the second sub-structure S2 and other portions of the fifth substructure S5 may overhang the first sub-structure S1 and the second sub-structure S2.

The first structure S1, S2 disposed in the first layer L1 may function as a support that supports the second structure S3, S4, S5 disposed in the second layer L2. In this example, the first sub-structure S1 and the second sub-structure S2 may respectively support the third sub-structure S3 and the fourth sub-structure S4, and the first sub-structure S1 and the second sub-structure S2 may support the fifth sub-structure S5.

The third sub-structure S3 may comprise a second semiconductor chip 210 which may comprise features as described with respect to the first semiconductor chip 110. The second semiconductor chip 210 may be a memory controller for a plurality of third semiconductor chips 310 to be described below. The second semiconductor chip 210 may provide a protocol and an interface between a host and the third semiconductor chips 310. The second semiconductor chip 210 may provide a standard protocol, such as parallel advanced technology attachment (PATA), serial advanced technology attachment (SATA), small computer system interface (SCSI), or peripheral component interconnection express (PICe), for the interface between the host and the third semiconductor chips 310. The second semiconductor chip 210 may be configured to perform wear leveling, garbage collection, bad block management, and error correcting code (ECC) coding and decoding with respect to the third semiconductor chips 310 and data stored therein.

The second semiconductor chip 210 may be electrically connected to the package substrate 10 through second bonding wires 212. The second semiconductor chip 210 may be attached to the first sub-structure S1 (i.e., the first semiconductor chip 110) by a third die attach film 214. The active surface of the second semiconductor chip 210 may face away from the package substrate 10 (e.g., face upwardly).

The second bonding wires 212 may be connected to chip pads of the second semiconductor chip 210 on the top surface of the second semiconductor chip 210 adjacent to one or more side edges of the second semiconductor chip 210. One side of the second semiconductor chip 210 connected to the second bonding wire 212 may be aligned with one side of the first sub-structure S1 (i.e., a side of the first semiconductor chip 110) (e.g., to occupy the same (x,y) coordinates) and thus overlap with respect to a top down view). Thus, the third sub-structure S3 may not protrude past side edges of the first sub-structure S1.

The fourth sub-structure S4 may comprise a first supporter 710. The first supporter 710 may be a monolithic structure formed of, for example, ceramic or a semiconductor material such as crystalline silicon or the like. The first supporter 710 may be attached to the second sub-structure S2 (i.e., the first semiconductor chip 110) by a fourth die attach film 712.

The second semiconductor chip 210 of the third sub-structure S3 and first supporter 710 of the fourth sub-structure S4 may be symmetrically positioned with respect to a center line of the package 1 (here, a line passing through the center of the package and parallel to edges of the package 1). The second semiconductor chip 210 of the third sub-structure S3 and first supporter 710 of the fourth sub-structure S4 may be monolithic structures having the same geometric shape with the same dimensions (in this example, the same rectangular prism). The second semiconductor chip 210 of the third sub-structure S3 and first supporter 710 of the fourth sub-structure S4 may have a relatively low coefficient of thermal expansion (CTE) such as a linear coefficient α ($10^{-6}$/K) below 8. The second semiconductor chip 210 of the third sub-structure S3 and first supporter 710 of the fourth sub-structure S4 may have substantially similar coefficients of thermal expansion (CTE) such as within a range of n to n+4 (where n is an integer), for example, having a linear coefficient α ($10^{-6}$/K) between 2 and 6. The first supporter 710 may consist of crystalline semiconductor material that is the same crystalline semiconductor material that forms the substrate of the second semiconductor chip 210. For example, the first supporter 710 and the substrate of the second semiconductor chip 210 may be crystalline silicon. The first supporter 710 may not include any electronic circuitry. The first supporter 710 may not be electrically connected to other portions of the package. The first supporter 710 may not have any logic circuits (e.g., logic gates, such as NAND or NOR gates). The first supporter 710 may not have any transistors formed there. In some examples, the first supporter 710 may comprise wiring on an outer surface and/or in through vias extending between top and bottom surfaces of the first supporter 710, where such wiring may be used to provide signal or power connections to other chips of the package 1. It will also be apparent that a supporter may be formed as a semiconductor chip having active integrated circuits (an semiconductor IC) per the choice of the package design. Other supporters described herein (including supporters of other embodiments), may have one or more of the features of the first supporter 710 described herein, including both the individual features of the supporter 710 described in this paragraph as well as the features of the supporter relative to one or more semiconductor chips within the same package layer of such other supporter (such as size, dimensions, CTE, etc).

The fifth sub-structure S5 may comprise a second supporter 720. The second supporter 720 may include, for example, ceramic or a semiconductor substrate such as silicon or the like. The second supporter 720 may be attached over the first sub-structure S1 and the second sub-structure S2 by a fifth die attach film 714. That is, the second supporter 720 may be attached to first semiconductor chips 110 of each of the first sub-structure S1 and the second sub-structure S2 by the fifth die attach film 714.

Figure 1B:
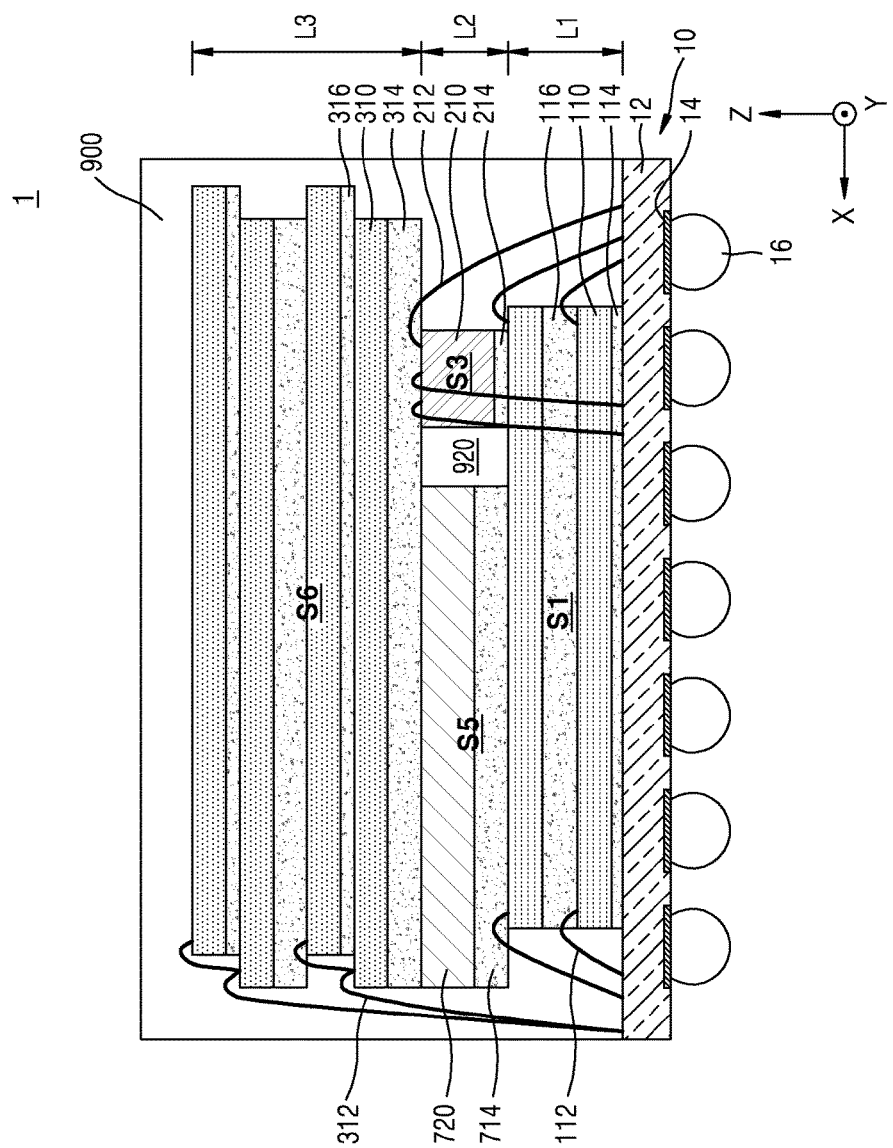
FIGS. 1B to 1E are cross-sectional views of the semiconductor package of FIG. 1A in different side directions.
Figure 1C:
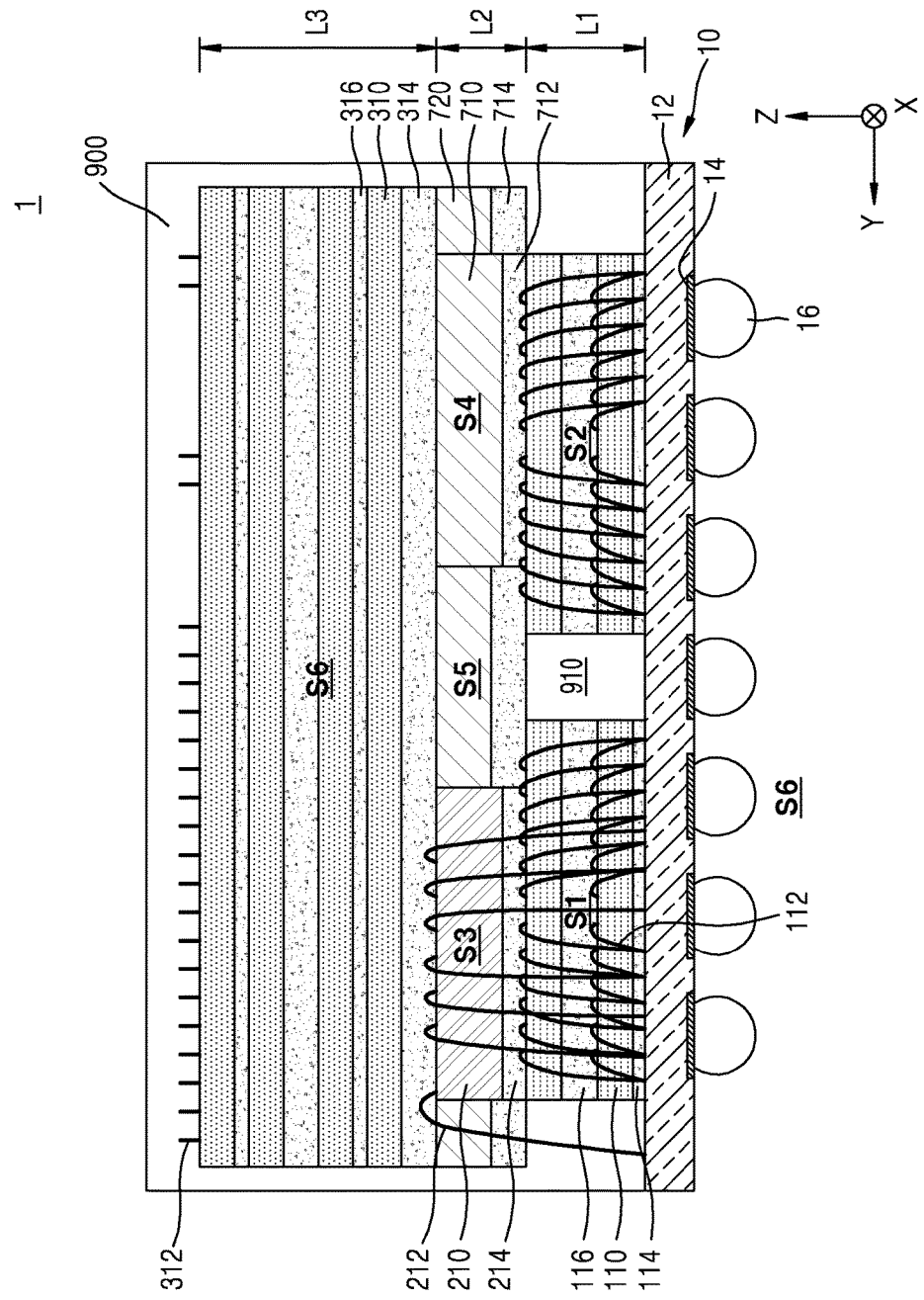

The fifth die attach film 714 may be thicker than the third die attach film 214 and the fourth die attach film 712 (see FIG. 1C, e.g.). Portions of first bonding wires 112, which electrically connect the package substrate 10 to chip pads of the upper first semiconductor chips 110 may be buried in the fifth die attach film 714 (see, e.g., FIGS. 1B and 1D). The first bonding wires 112 may not be buried in the third die attach film 214 and the fourth die attach film 712.

When the fifth die attach film 714 is thicker than the third die attach film 214 and the fourth die attach film 712, the second semiconductor chip 210 and the first supporter 710 may be thicker than the second supporter 720.

In some embodiments, the third die attach film 214 and the fourth die attach film 712 may have a thickness which is equal to that of the third die attach film 214. In this case, the second semiconductor chip 210, the first supporter 710, and the second supporter 720 may have the same thickness.

An uppermost surface of the second structure S3 to S5 (i.e., an uppermost surface of each of the third to fifth sub-structures S3 to S5) disposed in the second layer L2 may be on a plane of the same level from the main surface of the package substrate 10. The third to fifth sub-structures S3 to S5 may have the same thickness. That is, a thickness to which the second semiconductor chip 210 included in the third sub-structure S3 and the third die attach film 214 are stacked, a thickness to which the first supporter 710 included in the fourth sub-structure S4 and the fourth die attach film 714 are stacked, and a thickness to which the second supporter 720 included in the fifth sub-structure S5 and the fifth die attach film 714 are stacked may be equal.

A third structure S6 disposed in the third layer L3 may be attached to the second structure S3 to S5. The third structure S6 may be attached over the third sub-structure S3, the fourth sub-structure S4, and the fifth sub-structure S5. In some embodiments, the third structure S6 disposed in the third layer L3 may comprise only one sub-structure.

The third structure S6 may be attached over the third sub-structure S3, the fourth sub-structure S4, and the fifth sub-structure S5 to protrude over outside edges of the third sub-structure S3 and the fourth sub-structure S4 but not to protrude past at least one outside edge of the fifth sub-structure S5 to the outside. Therefore, portions of the third structure S6 may be attached to the third sub-structure S3 and the fourth sub-structure S4 and to overhang the outside edges of third sub-structure S3 and the fourth sub-structure S4.

The second structure S3 to S5 disposed in the second layer L2 may function as a support that supports the third structure S6 disposed in the third layer L3. In detail, the third sub-structure S3, the fourth sub-structure S4, and the fifth sub-structure S5 may support the third structure S6.

In the semiconductor package 1, the first sub-structure S1 and the second sub-structure S2 of the first layer L1 may function as a support for the third sub-structure S3 and fourth sub-structure S4 of the second layer L2, and the third to fifth sub-structures S3 to S5 of the second layer L2 may function as a support for the fifth structure S5 of the third layer L3. That is, two or more sub-structures may function as a support for a structure thereon between the package substrate 10 and the third layer L3, namely, in the first layer L1 and the second layer L2.

The third structure S6 may comprise one or more third semiconductor chip 310 which may include features as described with respect to the first semiconductor chip 110. The third semiconductor chip 310 may be a nonvolatile memory semiconductor chip. The third semiconductor chip 310 may be, for example, NAND flash memory, resistive random access memory (RRAM), magnetoresistive RAM (MRAM), phase-change RAM (PRAM), or ferroelectric RAM (FRAM).

The third structure S6 may comprise a stack of a plurality of the third semiconductor chips 310. In some embodiments, the third structure S6 may comprise the plurality of third semiconductor chips 310 which are stacked in a stair structure, but this is merely an example. A form where the plurality of third semiconductor chips 310 included in the third structure S6 are stacked is not limited thereto. FIGS. 1A to 1E illustrate that the third structure S6 includes four stacked third semiconductor chips 310 (please address others), but the third structure S6 is not limited thereto. For example, the third structure S6 may comprise one third semiconductor chip 310 or may comprise two, three, or five or more stacked third semiconductor chips 310.

The third semiconductor chips 310 may each be electrically connected to the package substrate 10 through third bonding wires 312. Each of the third semiconductor chips 310 may be attached to the second structure S3 to S5 or may be attached to another third semiconductor chip 310 by a sixth die attach film 314 or a seventh die attach film 316. In each of the third semiconductor chips 310, an active surface where a plurality of individual devices are provided may face away from the package substrate 10.

The sixth die attach film 314 may be thicker than the seventh die attach film 316. Portions of the second bonding wires 212 and portions of the third bonding wires 312 may be buried in the sixth die attach film 314. The second bonding wires 212 or the third bonding wires 312 may not be buried in the seventh die attach film 316.

A thickness of the semiconductor package 1 is reduced by using the relatively thick sixth die attach film 314 as a die attach film, in which portions of the second bonding wires 212 and portions of the third bonding wires 312 are buried, among a plurality of die attach films for attaching the third semiconductor chips 310 to a lower side and by using the relatively thin seventh die attach film 316 as a die attach film in which the second bonding wires 212 and the third bonding wires 312 are not buried.

The third bonding wires 312 may be connected to chip pads of the third semiconductor chips on a top surface of the third semiconductor chips adjacent to one or more sides of the third semiconductor chips 310. A side surface of a lowermost third semiconductor chip 310 connected to the third bonding wires 312 may be aligned to match a side surface of the fifth sub-structure S5 (also comprising a side surface of the second supporter 720) with respect to a top down view. That is, at least one side surface of the third structure S6 may be aligned to match a side surface of the fifth sub-structure S5 with respect to a top down view (e.g., share the same (x,y) coordinates).

Figure 1D:
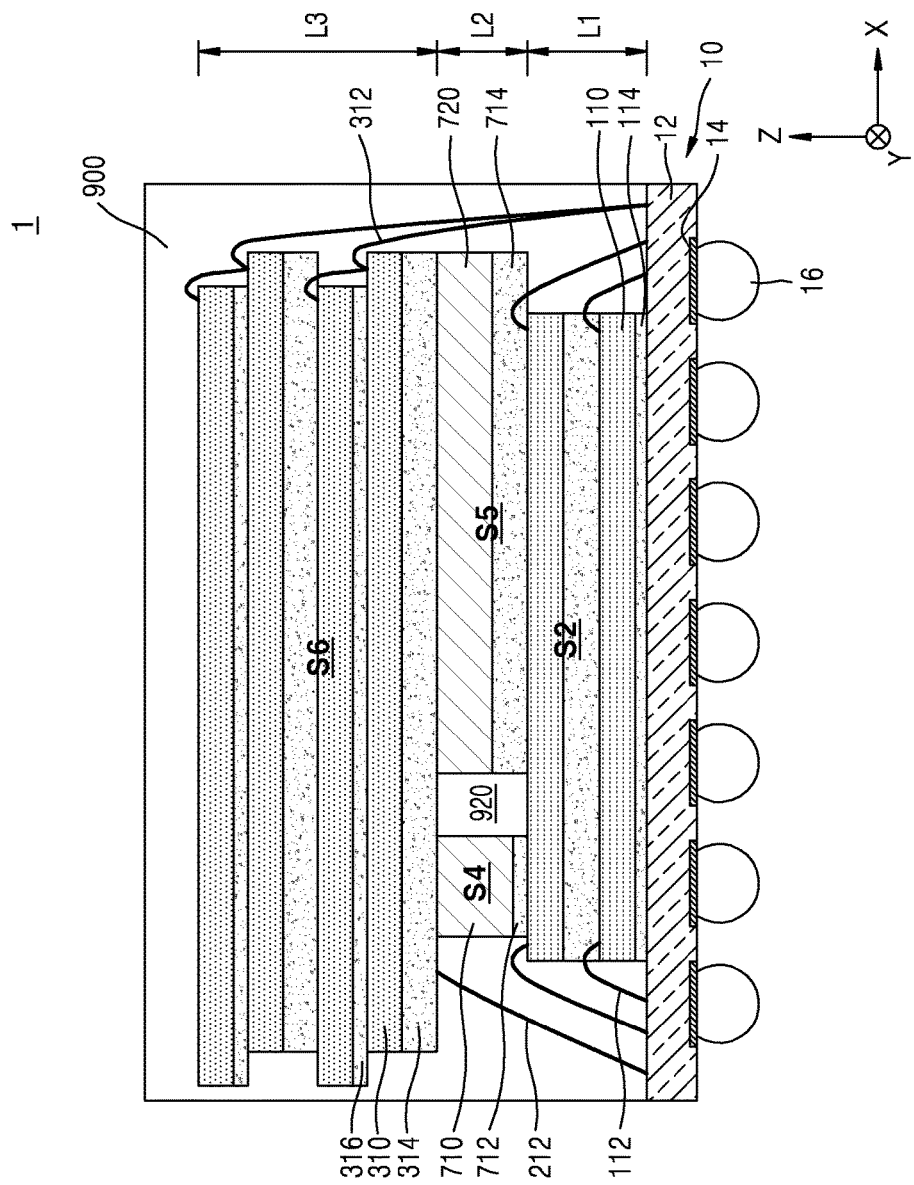
Figure 1E:
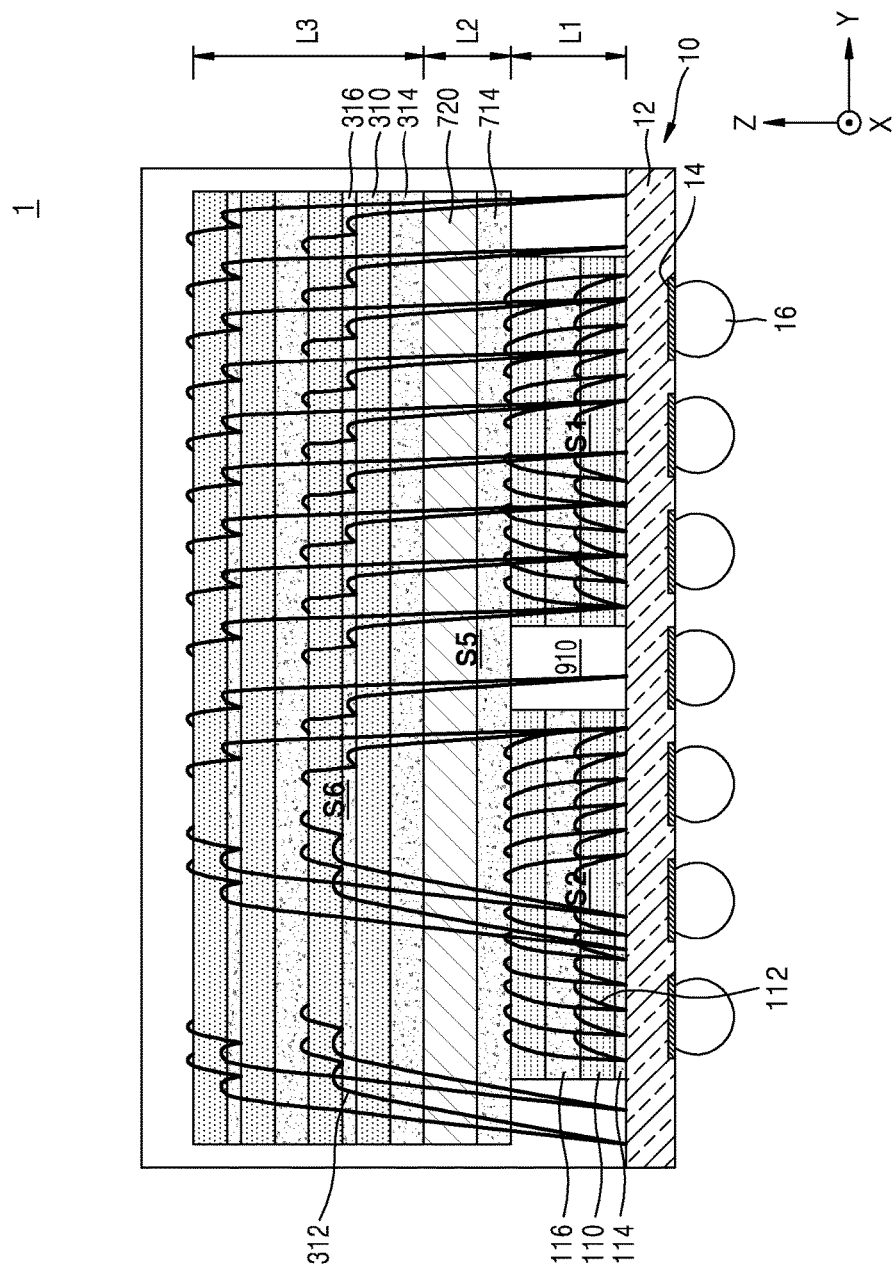

As shown in FIGS. 1B and 1D sides of some of the third semiconductor chips 310 connected to the third bonding wires 312 may aligned with one another (with respect to a top down view). As shown in FIGS. 1C and 1E, other sides of all of the third semiconductor chips 310 may be aligned with each other (with respect to a top down view) as well as being aligned with sides of the fifth sub-structure S5. When the plurality of semiconductor chips 310 are stacked in a stair structure, the side surface of each of the third semiconductor chips 310 connected to the third bonding wire 312 may be aligned to match a side surface of the fifth sub-structure S5 (i.e., the second supporter 720) with respect to a top down view or may be shifted from the side surface of the second supporter 720 to the inside. With respect to the cross sections of FIGS. 1C and 1E, sides of each of the third semiconductor chips 310 may not protrude past the corresponding sides of the second supporter 720.

Each of the third semiconductor chips 310 may be the same type of memory and may be identical memory semiconductor chips (i.e., same circuit design made by the same manufacturing recipe). An area of each third semiconductor chip 310 (from a top down perspective) included in the third structure S6 may be greater than an area of each of the first semiconductor chip 110, the second semiconductor chip 210, the first supporter 710, and the second supporter 720. Also, (from a top down perspective) an area of each of the third semiconductor chips 310 of the third structure S6 may be more than twice an area of the first semiconductor chip 110, and an area of each third semiconductor chip 310 of the third structure S6 may be more than a sum of areas of the second semiconductor chip 210, the first supporter 710, and the second supporter 720.

From a top down perspective, the third structure S6 may have an area greater than an area where the first structure S1, S2 of the first layer L1. Also, the third structure S6 may have an area greater than an area where the second structure S3, S4, S5 of the second layer L2. Here, an area of a structure denotes an area (with respect to a top down view) corresponding to a sum of an area of sub-structures included in the structure and an area of a space, which is necessary for separating the sub-structures, between the sub-structures.

The third structure S6 may completely overlap the entire upper surface of the first structure S1, S2. Also, the third structure S6 may completely overlap the entire upper surface of the second structure S3, S4 and S5. That is, the third structure S6 may be positioned above the first and second structures to cover the entire upper surface of the first structure S1, S2 and the entire upper surface of the second structure S3, S4, S5.

A molding layer 900 may be formed on the package substrate 10 and cover the first structure S1, S2, the second structure S3, S4, S5, and the third structure S6, and surround outside side edges of these first, second and third structures. The molding layer 900 may be formed of, for example, an epoxy mold compound (EMC) and/or the like. The molding layer 900 together with the package substrate 12 may completely surround and encapsulate the first, second and third structures and the semiconductor chips therein.

The molding layer 900 may include a first molding part 910, filling an internal space of the first structure S1, S2 (i.e., a separation space between the first sub-structure S1 and the second sub-structure S2) in the first layer L1, and a second molding part 920 filling an internal space of the second structure S3, S4, S5 (i.e., a separation space between the third sub-structure S3, the fourth sub-structure S4, and the fifth sub-structure S5) in the second layer L2. The first molding part 910 and second molding part 920 may be integrally formed with each other with the same homogenous molding material and may be integrally formed with the remaining portions of the molding layer 900 as part of a single continuous homogenous structure.

Figure 1F:
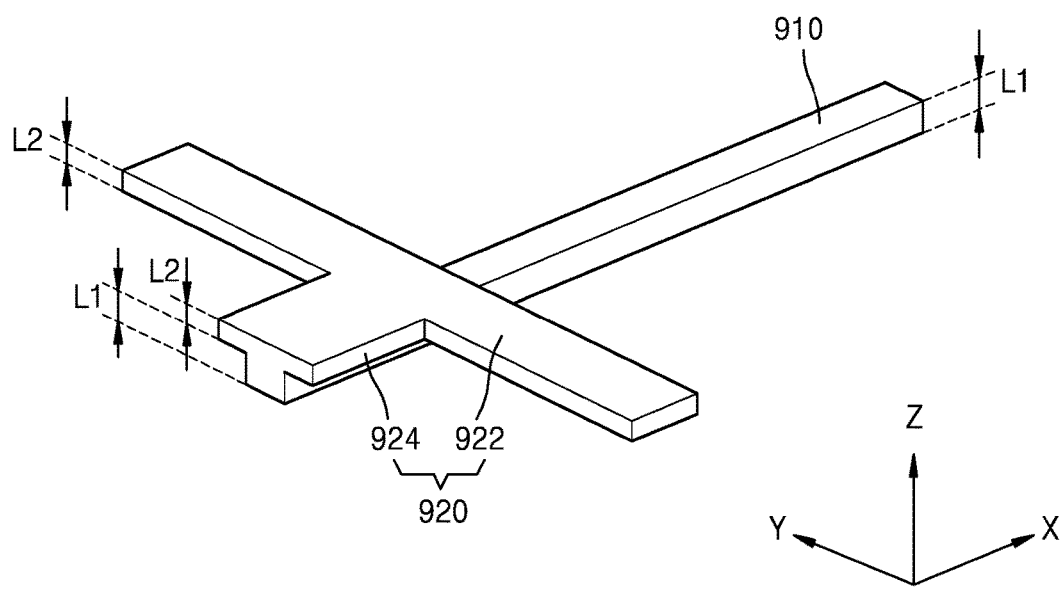
FIG. 1F is a perspective view illustrating a shape of a portion of a molding member included in a semiconductor package according to an embodiment.

FIG. 1F is a perspective view illustrating a shape of the first and second molding parts 910 and 920 of the molding layer 900 according the exemplary package illustrated in FIGS. 1B to 1E.

Referring to FIG. 1F and FIGS. 1B to 1E, the first molding part 910 may be formed between the first sub-structure S1 and the second sub-structure S2 in the first layer L1, and the second molding part 920 may be formed between the third sub-structure S3, the fourth sub-structure S4, and the fifth sub-structure S5 in the second layer L2.

After stacking and attaching the first, second and third structures to each other and to the package substrate 12, a space corresponding to the first and second molding parts 910 and 920 acts as a path, through which a material included in the molding layer 900 flows during the process of forming the molding layer 900. Therefore, even when a plurality of sub-structures (i.e., the first and second sub-structures S1 and S2 and the third to fifth sub-structures S3 to S5) are disposed in each of the first and second layers L1 and L2, the material included in the molding layer 900 may smoothly flow into a space therebetween, and thus, a void is prevented from occurring in the molding layer 900, thereby increasing reliability of the semiconductor package 1. Also, a space where the first molding part 910 is formed may be in fluid communication with a space where the second molding part 920 is formed so that each space may be used to add molding material to the other space during the molding process. That is, the first molding part 910 and the second molding part 920 and the spaces in which they are to be formed may be connected to each other.

The second molding part 920 may include a first portion 922, filling a space between the third and fourth sub-structures S3 and S4 and the fifth sub-structure S5, and a second portion 924 filling a space between the third sub-structure S3 and the fourth sub-structure S4. The first portion 922 may be formed in a shape which intersects the first molding part 910. The second portion 924 may be formed in a shape which overlaps a portion of the first molding part 910.

The semiconductor package according to the embodiments disclosed herein may include various kinds of semiconductor chips having a small form factor and various sizes and various thicknesses. In addition, in this embodiment and the other embodiments described herein, only two thickness of die attach films may be used to connect the stack of semiconductor chips within the package 1 thereby simplifying manufacturing processes (although more or less die attach thicknesses may be used). Thus, all of the relatively thick die attach films (e.g., 116, 714, 314) may have the same thickness and all of the relatively thin die attach films (e.g., 114, 214, 712, 316) may have the same thickness. Top surfaces of the structures (which include top surfaces of the uppermost semiconductor chips and supporters) may be planar (e.g., within +/−5 um of a geometric plane) even with only use of two thicknesses of the die attach films.

Further, the stack of semiconductor chips above the package substrate 10 may avoid insertion of an additional redistribution layer above or below second semiconductor chip 210 within the package 1 and thus reduce a height of the package as compared to prior art stacking techniques using a redistribution layer. When second memory chip 210 is a memory controller chip 210, connections between the memory controller 210 and the first semiconductor chips (e.g., DRAM chips or other relatively fast memory chips) and between the memory controller 210 and the third semiconductor chips 310 (e.g. nonvolatile memory chips such as NAND or other relatively slow memory chips) may be routed through wiring of the package substrate.

Figure 1G:
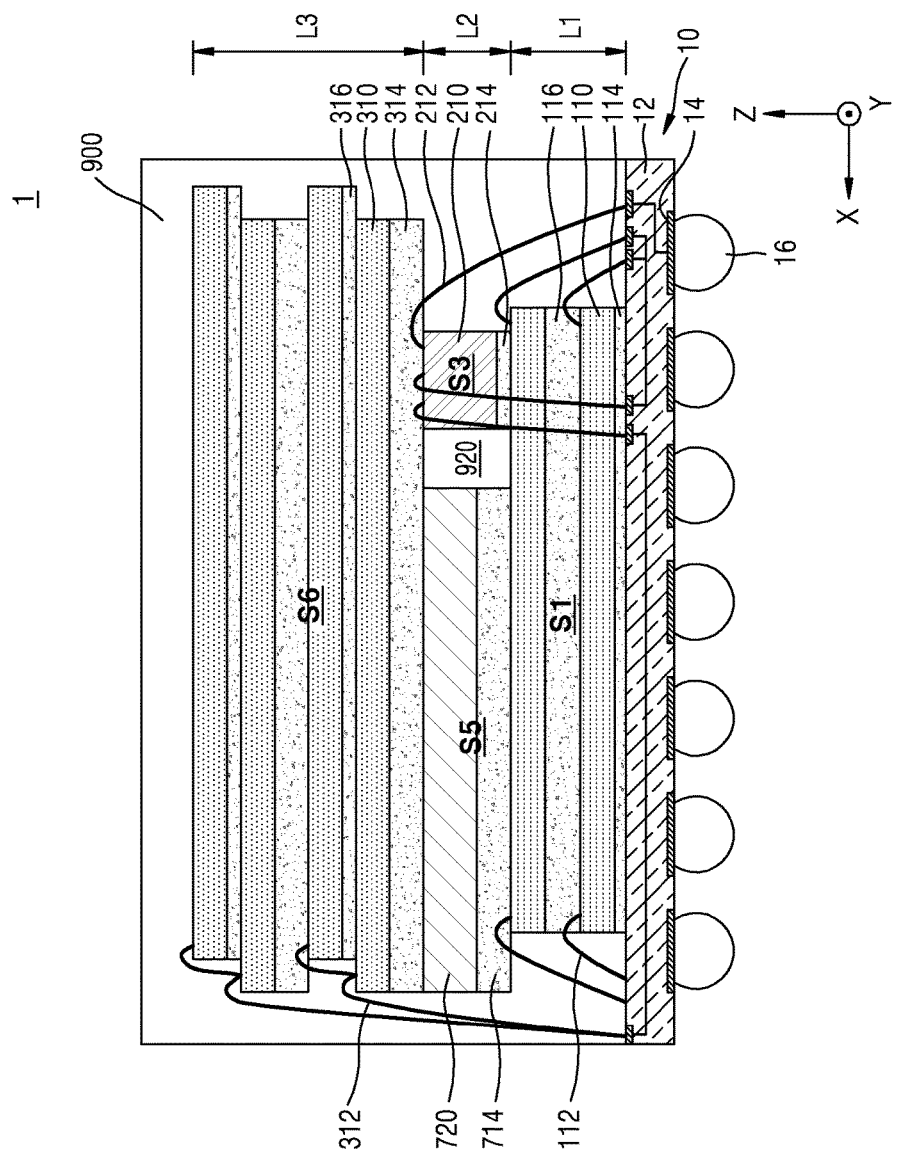
FIG. 1G is a simplified representation of exemplary wiring connections between various semiconductor chips of the semiconductor package utilizing wiring of the package substrate.

FIG. 1G is a simplified representation of exemplary wiring connections between the semiconductor chips within the package 1. In the embodiments described herein, the package substrate 10 may comprise a redistribution layer that comprises several layers of wiring (extending horizontally and internal to and/or on the external surfaces of the package substrate 10) where various wires in each layer may be interconnected to each other as desired by vertically extending conductive through vias. In this example, it is assumed that first memory semiconductor chips 1 are volatile memory semiconductor chips (such as DRAM), second semiconductor chip 210 is a memory controller semiconductor chip and third semiconductor chips 310 are nonvolatile memory semiconductor chips (such as NAND flash memory chips). Memory controller chip 210 may have some of its chip pads connected to external connection terminals 16 by bonding wires 212 and first wiring 18a of the package substrate 10 (one such connection shown in FIG. 1G). Memory controller chip 210 may have some of its chip pads connected to chip pads of the volatile memory semiconductor chips 110 by bonding wires 212 and second wiring 18b of the package substrate 10 (one such connection shown in FIG. 1G). Memory controller chip 210 may also have some of its chip pads connected to chip pads of the nonvolatile memory semiconductor chips by bonding wires 212 and third wiring 18c of the package substrate 10 (one such connection shown in FIG. 1G).

Corresponding chip pads of each of the nonvolatile memories semiconductor chips 310 may be commonly connected together by bonding wires connections. As shown in FIG. 1B, e.g., each of the topmost pair and bottommost pair of nonvolatile memories semiconductor chips 310 have a relatively shorter bonding wire 312 directly connecting two chip pads (not shown) on upper surfaces of these nonvolatile memory semiconductor chips 310. In addition, each of the topmost pair and bottommost pair of nonvolatile memories semiconductor chips may have a relatively longer bonding wires 312 having one end connected to a corresponding one of these two chip pads and a second end connecting to the same upper pad 14 (not shown) or electrically connected upper pads 14 on a top surface of the package substrate 10 thus connecting four chip pads of different nonvolatile memory semiconductor chips 310 in common (to the same electrical node). As will be appreciated, such common connections of the chip pads of the different nonvolatile memory semiconductor chips may be made for other chip pads having the same function (such as connecting corresponding ones of chip pads forming data terminals DQ0, DQ1, DQ2 . . . DQ7, and/or forming command address terminals CA0, CA1, CA2 . . . CA7, and/or address terminals A0, A1, A2 . . . A16, and/or terminals forming various control terminals each in common, etc.) The number and type of chip pads having the same function will vary depending on the design of the nonvolatile memory semiconductor chips 310. Memory controller chip 210 may have a corresponding signal chip pad connected to each of the groups of commonly connected signal chip pads of the nonvolatile memory semiconductor chips 310 to provide signal communications between the memory controller chip 210 and the nonvolatile memory semiconductor chips 310.

Signal chip pads of a chip are those chip pads connected to internal circuitry (e.g., appropriate I/O buffers, internal clock generators, latches, etc.) of the chips to send and/or receive information or timing control (such as data, address and control information and clock signals) with respect to an external source (e.g., another chip).

Signal chip pads of the nonvolatile memory semiconductor chips 310 may be connected to one or more external devices by electrical connections of such signal chip pads to corresponding terminals 16 of the package substrate (not shown in FIG. 1G). Alternatively, signal chip pads of the nonvolatile memory semiconductor chips 310 may have no direct electrical connections to any terminals of the package 1 and exchange data and other information with external devices only through memory controller chip 210, where data read and write accesses to the nonvolatile memory semiconductor chips 310 are controlled by memory controller chip 210 and such data is exchanged with external device(s) only through communications between the external device(s) and memory controller chip 210.

Similarly, corresponding chip pads of each of the DRAM semiconductor chips 110 (i.e., those having the same function) may be commonly connected together by bonding wires and upper pads 14 of the package substrate 10, or directly with a bonding wire directly connected to chip pads of different DRAM semiconductor chips 110. In alternative examples, a separate interposer may be used to commonly connect such chip pads (of the DRAM semiconductor chips 110 or nonvolatile memory semiconductor chips 310). Memory controller chip 210 may have a corresponding signal chip pad connected to each of the groups of commonly connected signal chip pads of the DRAM semiconductor chips 110 to provide signal communications between the memory controller chip 210 and the DRAM semiconductor chips 110.

Signal chip pads of the DRAM semiconductor chips 110 may be connected to one or more external devices by electrical connections of such signal chip pads to corresponding terminals 16 of the package substrate (not shown in FIG. 1G). Alternatively, signal chip pads of the DRAM semiconductor chips 110 may have no direct electrical connections to any terminals of the package 1 and exchange data and other information with external devices only through memory controller chip 210, where data read and write accesses to the DRAM semiconductor chips 110 are controlled by memory controller chip 210 and such data is exchanged with external device(s) only through communications between the external device(s) and memory controller chip 210.

Further, signal chip pads (e.g., data, address and control chip pads) providing information or timing control to the DRAM semiconductor chips 110 may be connected in common for some or all of the DRAM semiconductor chips 110 as discussed but not connected to any chip pads or otherwise directly electrically connected to the nonvolatile memory semiconductor chips 310. However, power chip pads (e.g., pads connected to receive a power supply, such as a positive potential, a negative potential or reference potential, such as a ground potential, and provide the same to internal power supply circuits of the chips) associated with the same potential of the DRAM semiconductor chips 110 and the nonvolatile memory semiconductor chips (as well as those chip pads of the memory controller chip 210) may be commonly connected together as discussed an may be electrically connected to a lower pad 14 and terminal 16 of the package substrate 10.

Thus, memory controller chip 210 may exchange information (e.g., address, data and control information provided as electrical signals) with an external source via external connection terminals 16 and appropriately control the volatile memory semiconductor chips 210 and nonvolatile memory chips. For example, the memory controller 210 may receive a command to store data along with a logical address and data via package terminals and package substrate wiring 18a. Memory controller 210 may initially store the data in one of the volatile memory chips 110 (in a relatively quick storage process) via package substrate wiring 18b and then later retrieve the data and store the data in one of the nonvolatile memory chips 310 (in a relatively slower process) via package substrate wiring 18c. Such electrical connections and communications may also be implemented in the other embodiments described herein.

Moreover, a structure disposed in a lower layer may support a structure disposed in an upper layer, thereby providing a semiconductor package where various kinds of semiconductor chips having various sizes are stably stacked.

In a semiconductor chip, a structure of a lower layer may be supported to minimize a degree to which a portion connected to a bonding wire protrudes solely. Accordingly, damage to the semiconductor chip is prevented in a process of connecting the bonding wire to a semiconductor chip, thereby providing a semiconductor package with high reliability.

Figure 2A:
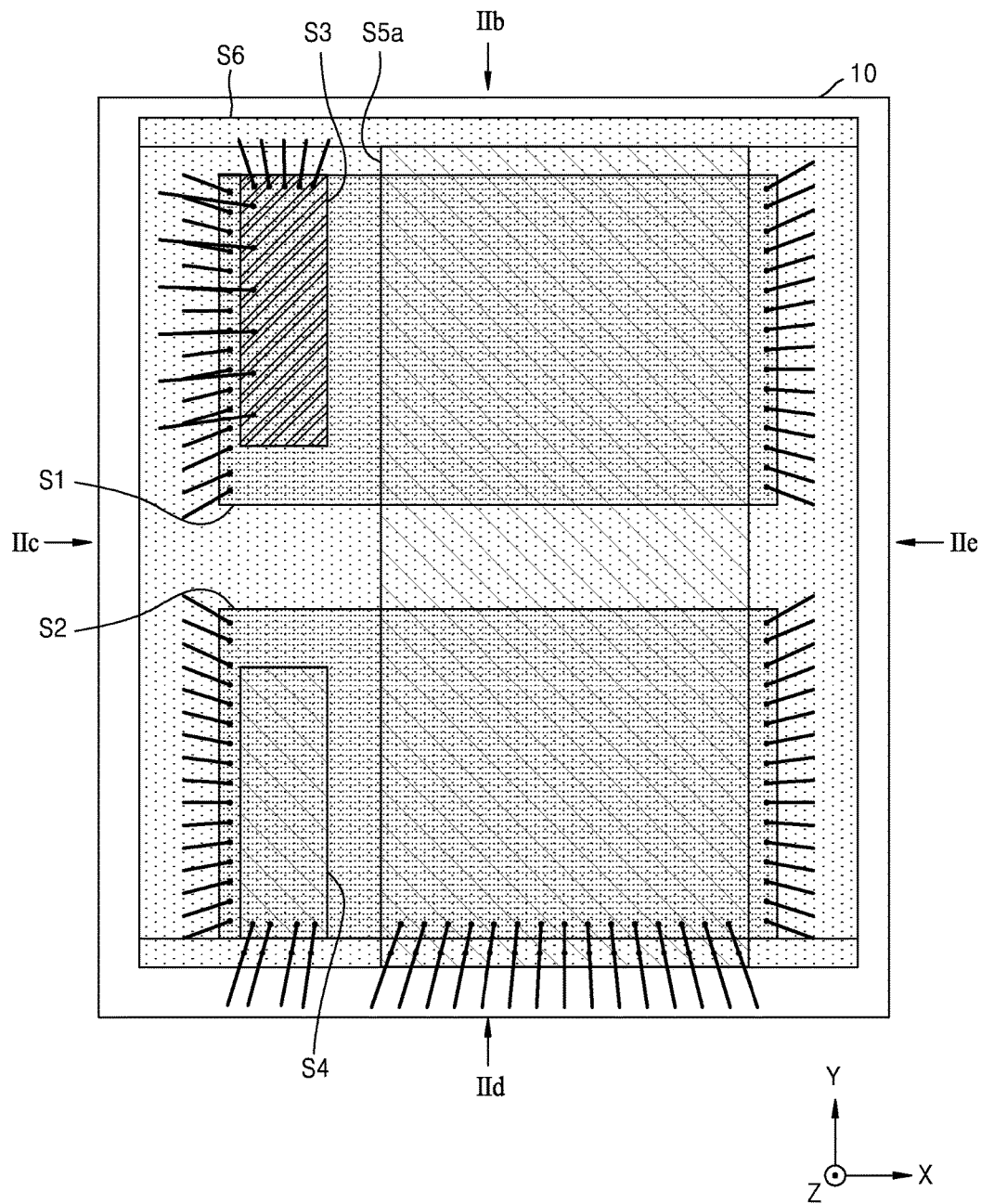
FIG. 2A is a plan layout illustrating a main portion of a semiconductor package according to an embodiment.
Figure 2B:
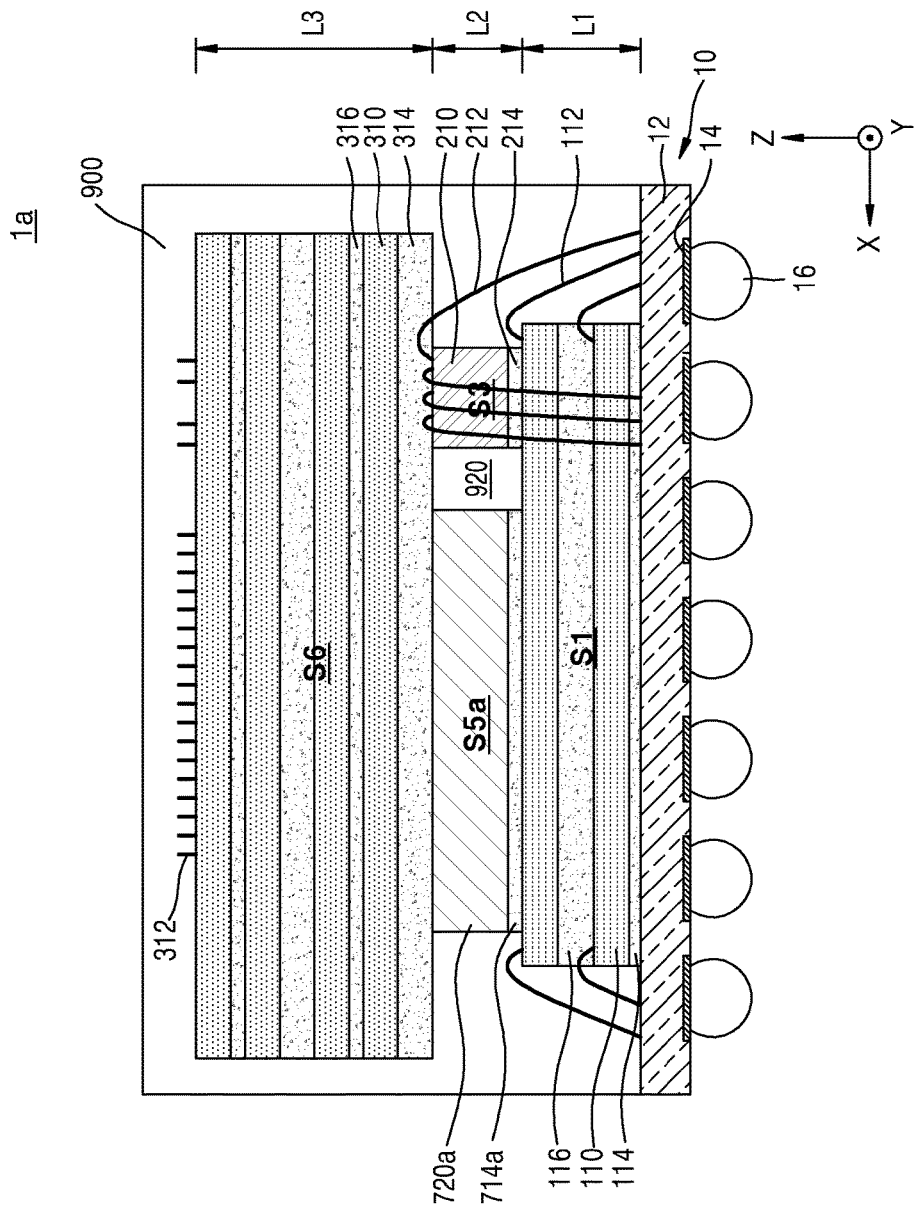
FIGS. 2B to 2E are cross-sectional views of the semiconductor package of FIG. 2A in different side directions.
Figure 2C:
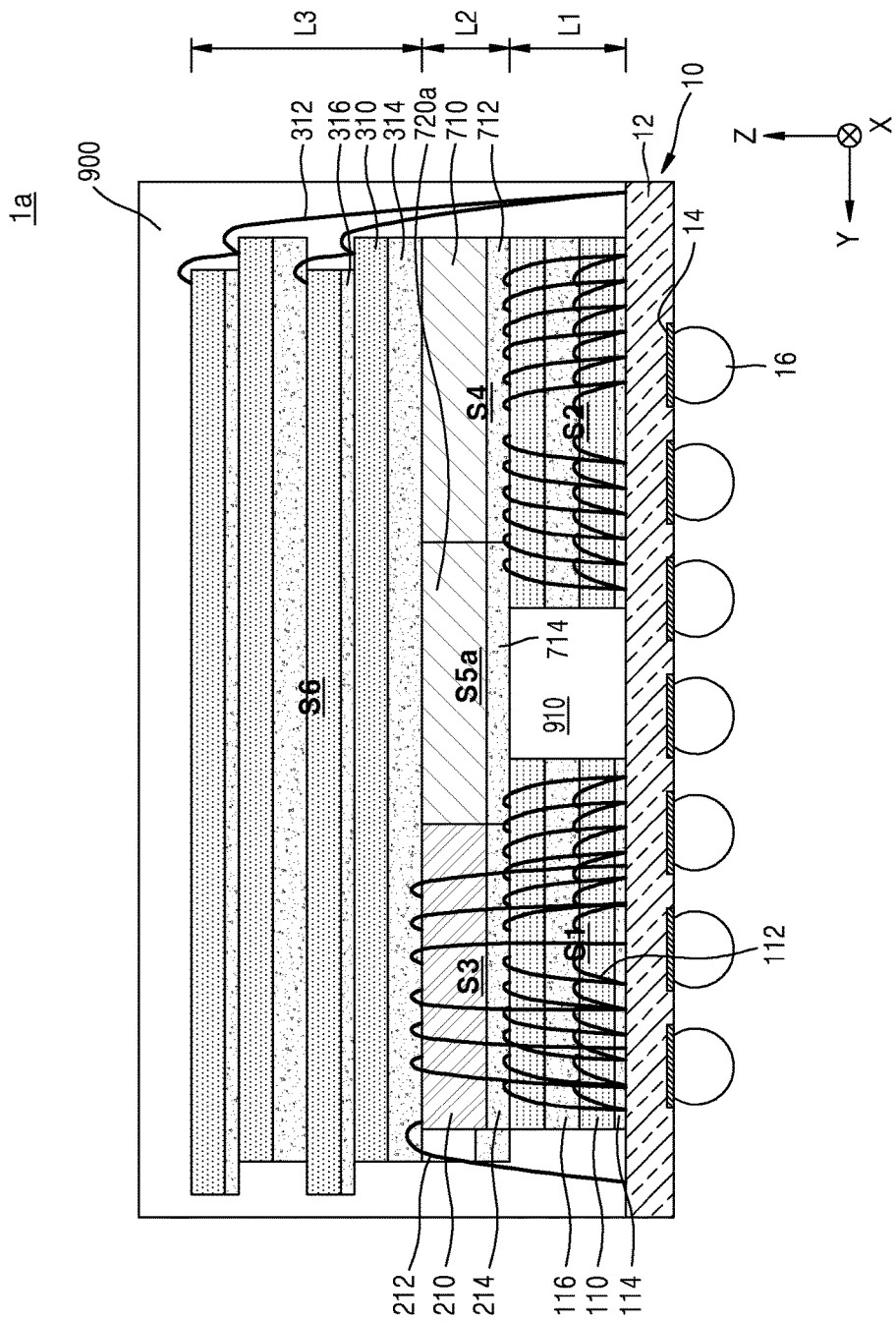
Figure 2D:
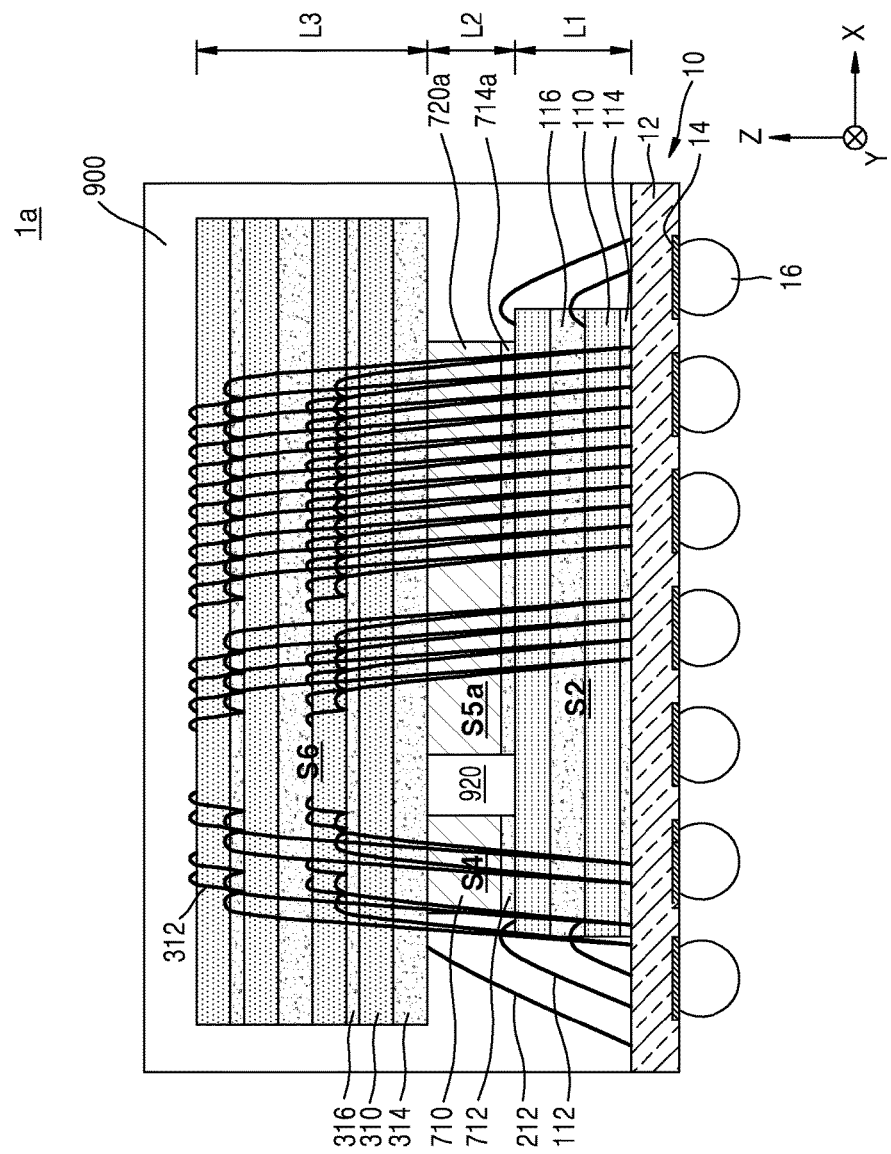
Figure 2E:
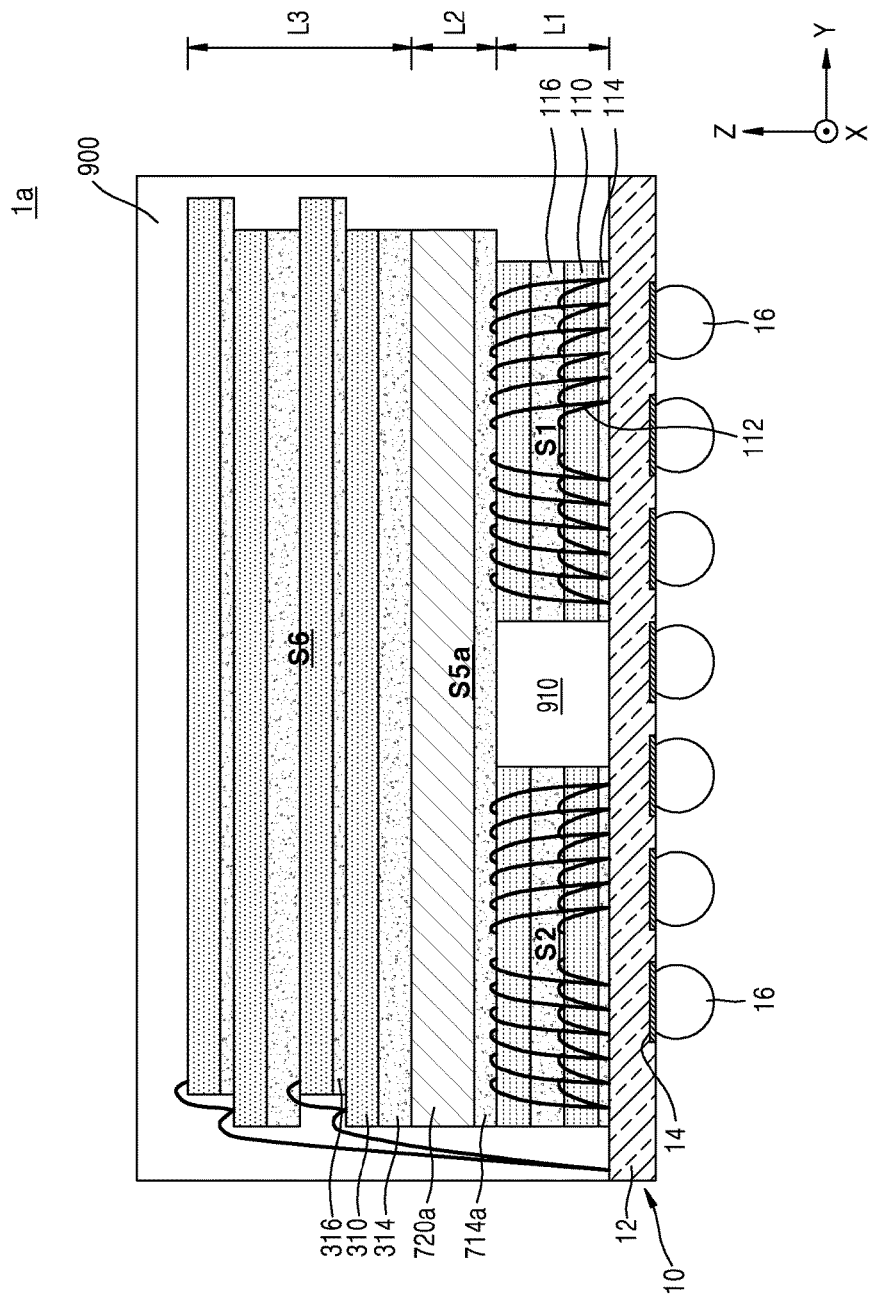

FIG. 2A is a plan layout illustrating a main portion of a semiconductor package 1a according to an embodiment, and FIGS. 2B to 2E are cross-sectional views of the semiconductor package 1a of FIG. 2A with different side view directions. In providing descriptions with reference to FIGS. 2A to 2E, details which are the same as the details described above with reference to FIGS. 1A to 1F may not be repeated.

Referring to FIGS. 2A to 2E, the semiconductor package 1a may include a package substrate 10 and a plurality of structures S1 to S4, S5a and S6 which are stacked and disposed in a first layer L1, a second layer L2, and a third layer L3 on the package substrate 10.

A first structure S1 and S2 disposed in the first layer L1 may be attached to the package substrate 10. The first structure S1 and S2 may include a first sub-structure S1 and a second sub-structure S2. The first sub-structure S1 and the second sub-structure S2 may be disposed on the package substrate 10 and spaced apart from each other.

A second structure S3, S4 and S5a disposed in the second layer L2 may be attached to the first structure S1 and S2. The second structure S3, S4 and S5a may include a third sub-structure S3, a fourth sub-structure S4, and a fifth sub-structure S5a. The third sub-structure S3, the fourth sub-structure S4, and the fifth sub-structure S5a may be disposed on the first structure S1 and S2 and spaced apart from each other.

The third sub-structure S3 may be attached to the first sub-structure S1. The fourth structure S4 may be attached to the second sub-structure S2.

The fifth sub-structure S5a may be attached over the first sub-structure S1 and the second sub-structure S2. The fifth structure S5a may be attached over the first sub-structure S1 and the second sub-structure S2 to protrude over outside edges of the first sub-structure S1 and the second sub-structure S2.

A portion adjacent to at least one side surface of the fifth sub-structure S5a may be attached over the first sub-structure S1 and the second sub-structure S2 to overhang the first sub-structure S1 and the second sub-structure S2.

The fifth sub-structure S5a may comprise a second supporter 720a. The second supporter 720a may include, for example, ceramic or a semiconductor substrate such as silicon or the like. The second supporter 720a may be attached over the first sub-structure S1 and the second sub-structure S2 by a fifth die attach film 714a.

First bonding wires 112, which electrically connects the package substrate 10 to first semiconductor chips 110 via chip pads on the top surfaces of the first semiconductor chips 110 are not be buried in a fifth die attach film 714a. Therefore, a thickness of the fifth die attach film 714a illustrated in FIGS. 2B to 2E may be thinner than that of the fifth die attach film 714 illustrated in FIGS. 1B to 1E. The fifth die attach film 714a may have the same thickness as that of the third die attach film 214 and the fourth die attach film 712.

A third structure S6 disposed in the third layer L3 may be attached to the second structure S3 to S5. The third structure S6 may be attached over the third sub-structure S3, the fourth sub-structure S4, and the fifth sub-structure S5a.

Third bonding wires 312 may be connected to chip pads of the third semiconductor chips on top surfaces thereof adjacent to a side surface of the corresponding third semiconductor chip 310. A side surface of a lowermost third semiconductor chip 310 connected to the third bonding wire 312 may be aligned to match a side surface of the fifth sub-structure S5a (i.e., the second supporter 720a) with respect to a top down view. The side surface of the lowermost third semiconductor chip 310 connected to the third bonding wire 312 may be aligned to match a side surface of the first semiconductor chip of the second sub-structure S2 with respect to a top down view.

Figure 3A:
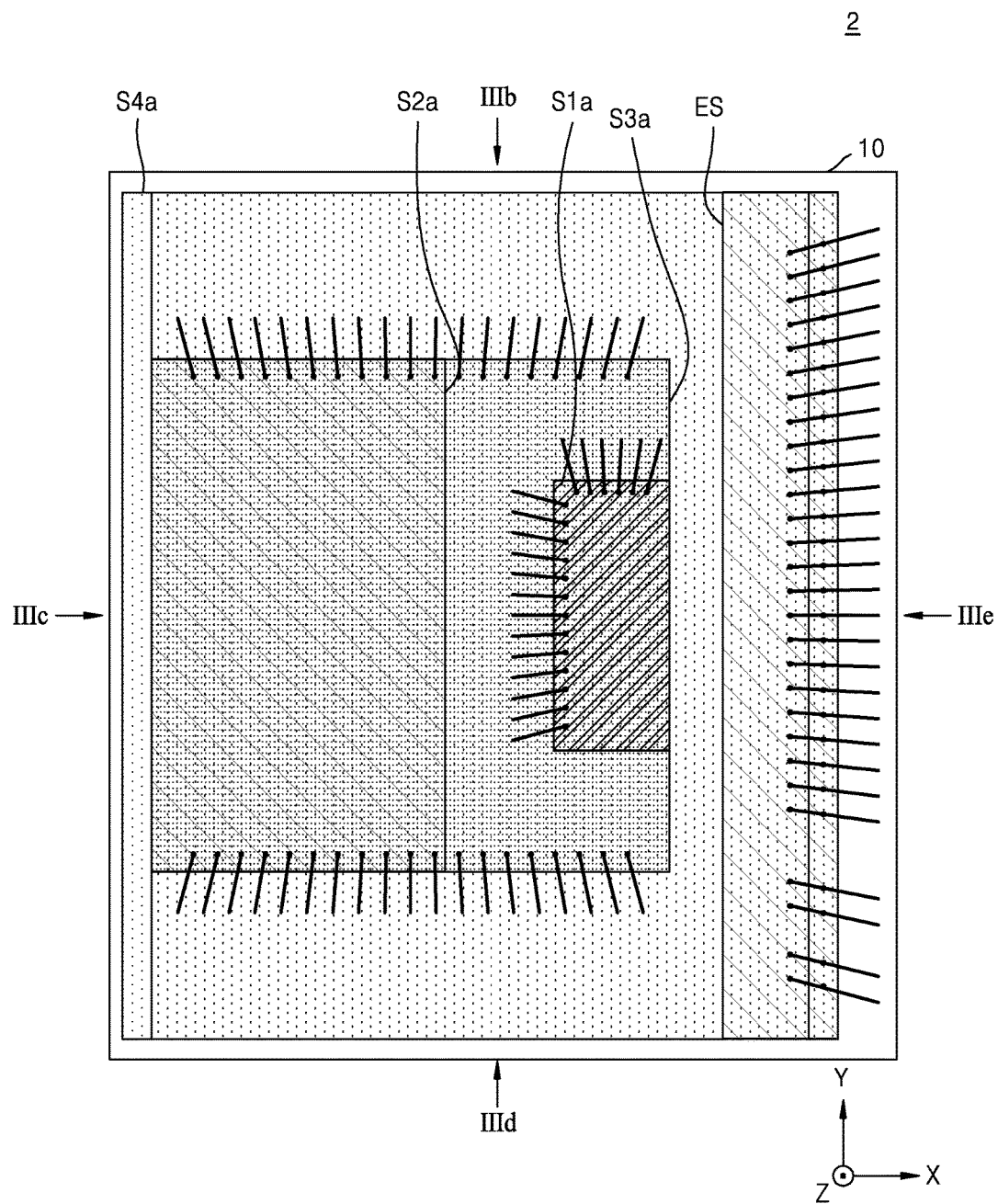
FIG. 3A is a plan layout illustrating a main portion of a semiconductor package according to an embodiment.
Figure 3B:
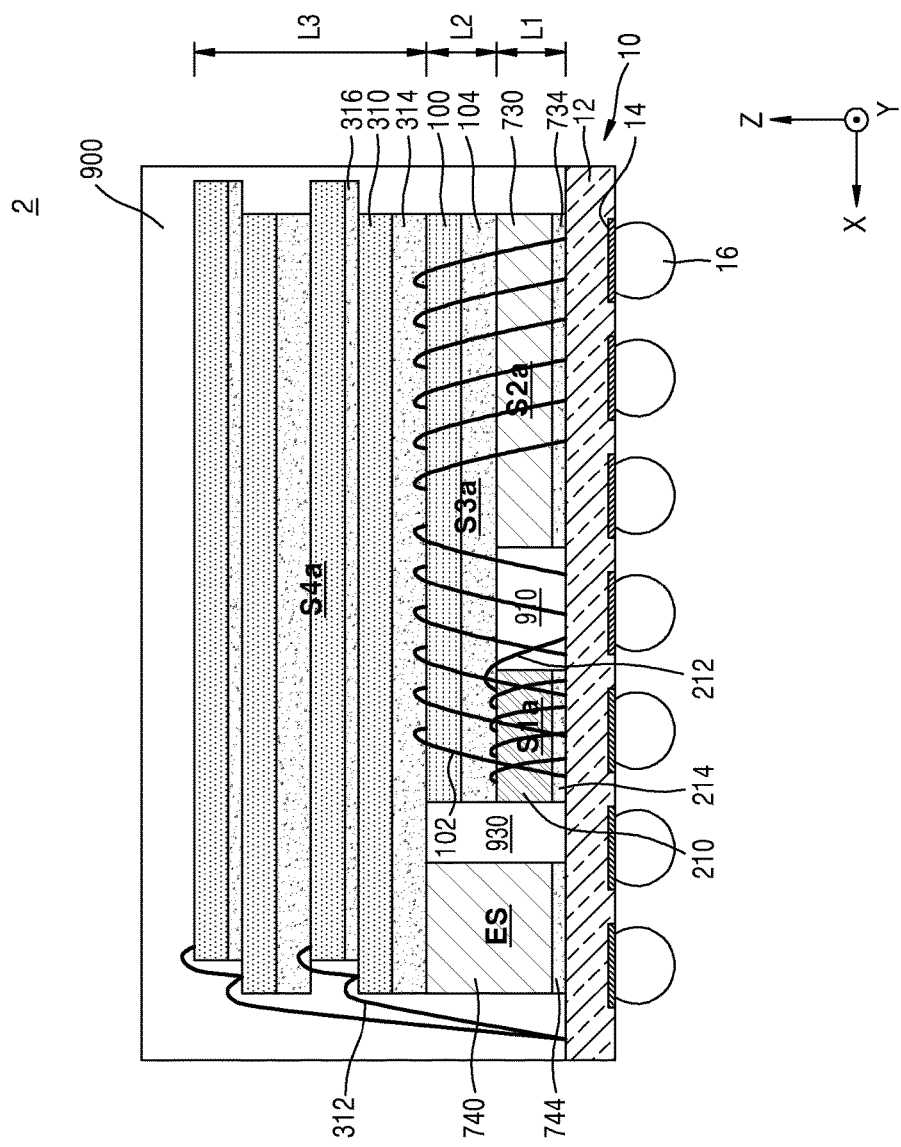
FIGS. 3B to 3E are cross-sectional views of the semiconductor package of FIG. 3A in different side directions.
Figure 3C:
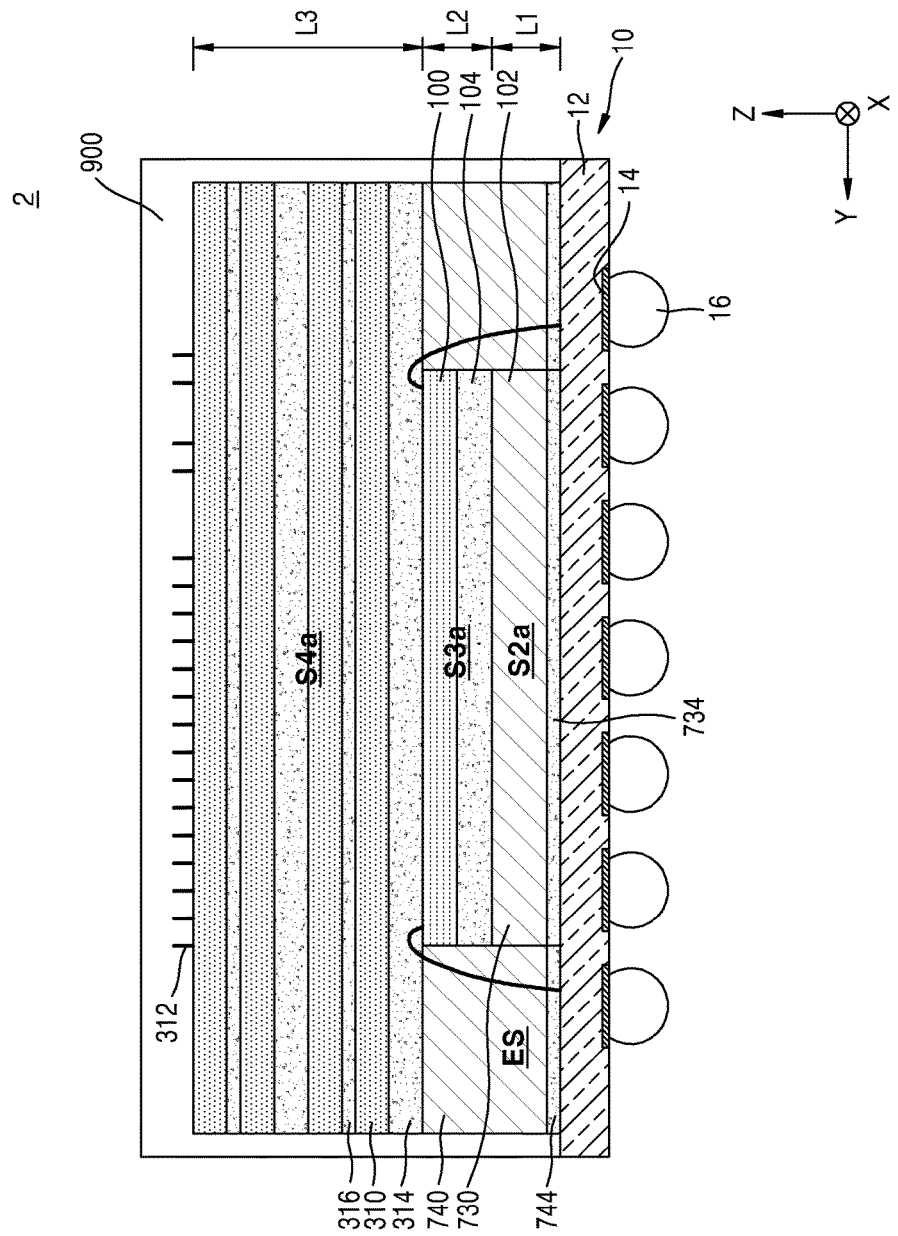
Figure 3D:
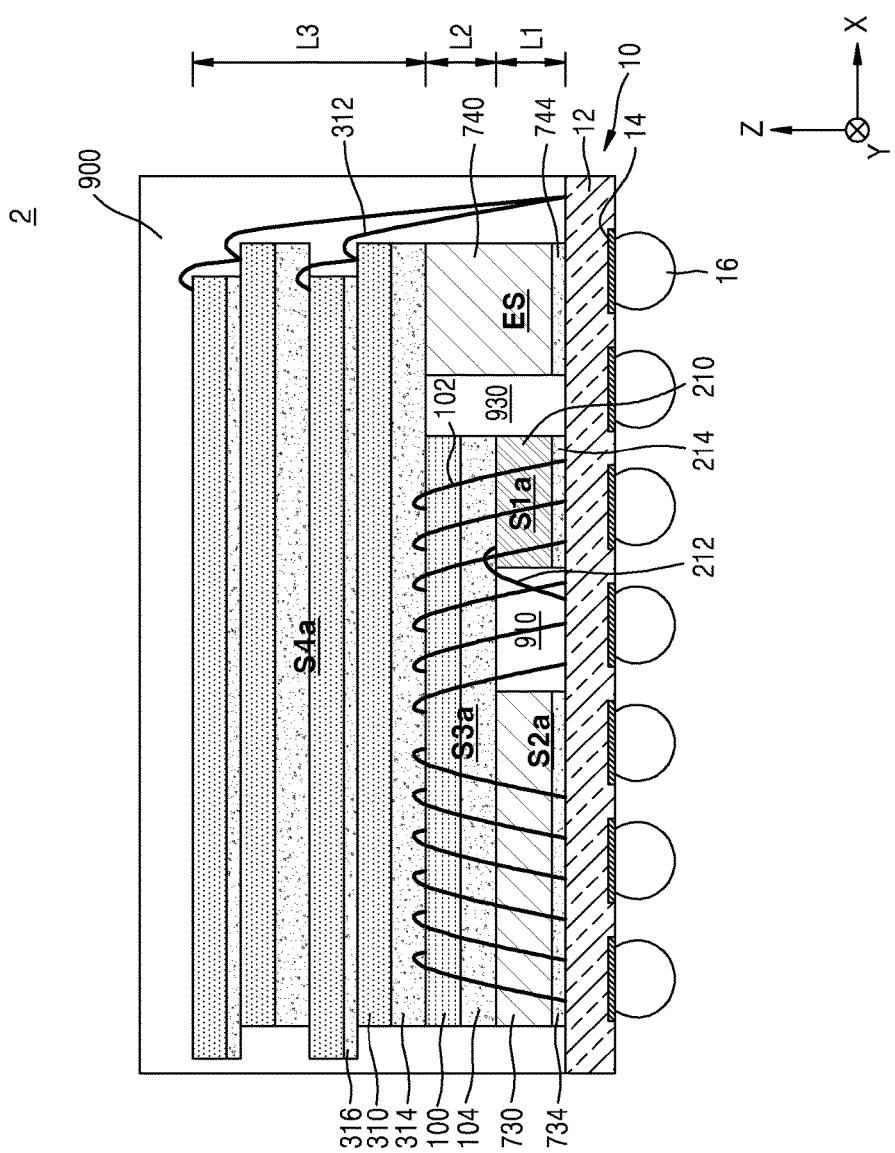
Figure 3E:
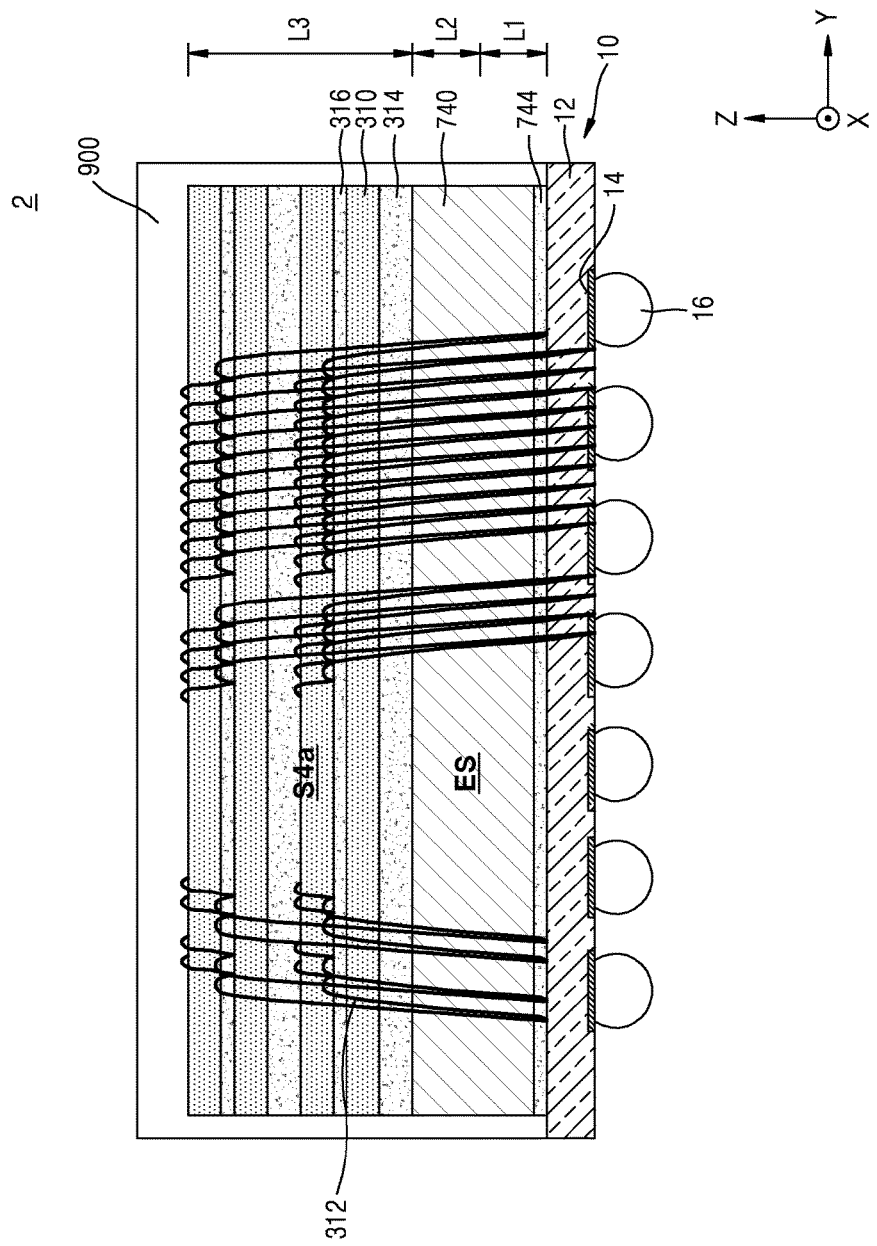

FIG. 3A is a plan layout illustrating a main portion of a semiconductor package 2 according to an embodiment, and FIGS. 3B to 3E are cross-sectional views of the semiconductor package 2 of FIG. 3A with different side view directions. In providing descriptions with reference to FIGS. 3A to 3E, details which are the same as the details described above with reference to FIGS. 1A to 2E may not be repeated.

Referring to FIGS. 3A to 3E, the semiconductor package 2 may include a package substrate 10 and a plurality of structures S1a, S2a, S3a, S4a and ES stacked on the package substrate 10.

A first structure S1a, S2a disposed in a first layer L1 may be attached to the package substrate 10. The first structure S1a, S2a may include a first sub-structure S1a and a second sub-structure S2a. The first sub-structure S1a and the second sub-structure S2a may be disposed on the package substrate 10 and spaced apart from each other.

A second structure S3a disposed in a second layer L2 may be attached to the first structure S1a, S2a. The second structure S3a may be formed as a third sub-structure S3a. The third sub-structure S3a may be attached over the first sub-structure S1a and the second sub-structure S2a.

The first sub-structure S1a may comprise a second semiconductor chip 210 such as a memory controller chip as described with above. The second sub-structure S2a may comprise a first supporter 730 which may have one or more features as described with respect to supporter 720 of the first embodiment. The third sub-structure S3a may comprise a first semiconductor chip 100. The second semiconductor chip 210 may be electrically connected to the package substrate 10 through a second bonding wire 212. The second semiconductor chip 210 may be attached to the package substrate 10 by a first die attach film 214. The first supporter 730 may be attached to the package substrate 10 by a second die attach film 732.

With the possible exceptions of size and location, the first semiconductor chip 100, the second semiconductor chip 210, and the first supporter 730 may be the same as (and/or share one or more features of) the first semiconductor chip 110, the second semiconductor chip 210, and the first supporter 730 described above with reference to FIGS. 1A to 2E, and thus, their detailed descriptions are omitted.

The first semiconductor chip 100 may be electrically connected to the package substrate 10 through a first bonding wire 102. The first semiconductor chip 100 may be attached over the second semiconductor chip 210 and the first supporter 730 by a third die attach film 104.

The third die attach film 104 may be thicker than the first die attach film 214 and the second die attach film 732. A portion of the second bonding wire 212 may be buried in the third die attach film 104. The second bonding wire 212 may be connected to a portion adjacent to one side surface or two side surfaces of the second semiconductor chip 210. The second bonding wire 212 may be provided to completely overlap a lower side of the first semiconductor chip 100.

The first bonding wires 102 may be connected to chip pads on a top surface of the first semiconductor chip 100 that are aligned adjacent to one or more (e.g., two) sides of the first semiconductor chip 100. A side surface of the third semiconductor chip 310 (adjacent to the first bonding wires 102) may be aligned to match a side surface of the first supporter 730 (with respect to a top down view). That is, at least one side surface of the second structure S3a may be aligned to match a side surface of the second sub-structure S2a with respect to a top down view.

One of side surfaces of the second semiconductor chip 210, which is not adjacent to the second bonding wires 212, may be aligned to match a side surface of the first semiconductor chip 100 that is not adjacent to the first bonding wires 102 with respect to a top down view. That is, at least one side surface of the second structure S3a may be aligned to match a side surface of the first sub-structure S1a with respect to a top down view.

Another side surface of the first semiconductor chip 100, which is not adjacent to the first bonding wires 102, may be aligned to match a side surface of the second sub-structure S2a with respect to a top down view.

In a process of connecting the first bonding wire 102 to the first semiconductor chip 100, the first supporter 730 may function as a support in a portion where the first supporter 730 is disposed, and indirect supporting may be performed by the second semiconductor chip 210 adjacent to the first supporter 730 in a portion where the first supporter 730 is not disposed, thereby preventing damage to the first semiconductor chip 100.

An extension structure ES disposed in the first and second layers L1 and L2 may be attached to the package substrate 10. A portion of the extension structure ES disposed in the second layer L2 may perform a function of a separate sub-structure which is disposed to be spaced apart from the third sub-structure S3a in the second layer L2. The extension structure ES may comprise a second supporter 740. The second supporter 740 may be attached to the package substrate 10 by a fourth die attach film 744. The second supporter 740 may comprise one or more of the features of the other supporters described herein. As shown in FIG. 3A, the second supporter may have a first side aligned with and substantially the same size as a side of one or more of the nonvolatile memory chips 310 under which it is positioned to support the same. The top surface of the nonvolatile memory chips 310 may comprise a row of chip pads adjacent the sides of the nonvolatile memory chips 310 under which the second supporter 740 is positioned. Second sides of the second supporter 740 perpendicular to the first side may have a length substantially smaller than the first side, such as less than 25%, such as less than 15%.

An uppermost surface of the third sub-structure S3*a* disposed in the second layer L2, namely, an uppermost surface of the first semiconductor chip 100 and an uppermost surface of the extension structure ES disposed in the first and second layers L1 and L2, namely, an uppermost surface of the second supporter 740, may be coplanar and be formed along a plane parallel to the main surface of the package substrate 10.

In FIGS. 3B to 3E, the fourth die attach film 744 is illustrated as having the same thickness as that of the first die attach film 214 and a second die attach film 734, but is not limited thereto. Since the second supporter 740 has a thickness which is greater than that of the second semiconductor chip 210 and the first supporter 730, a thickness of the fourth die attach film 744 may be relatively thicker set, and a thickness of the second supporter 740 may be relatively thinner set as desired.

A third structure S4*a* disposed in the third layer L3 may be attached to the third sub-structure S3*a* and the extension structure ES. The third structure S4*a* may be positioned over and attached to the third sub-structure S3*a* and the extension structure ES. In this example, the third structure S4*a* disposed in the third layer L3 is formed with only one sub-structure but may alternatively be formed with multiple sub-structures.

In the semiconductor package 2, the first sub-structure S1*a* and second sub-structure S2*a* of the first layer L1 may function as a support for the third sub-structure S3*a* of the second layer L2, and the third sub-structure S3*a* of the second layer L2 and the extension structure ES disposed in the first and second layers L1 and L2 may function as a support for the third structure S4*a* of the third layer L3. That is, two or more sub-structures may perform a function of a support for a structure thereon between the package substrate 10 and the third layer L3, namely, in the first layer L1 and the second layer L2.

The third structure S4*a* may comprise a plurality of third semiconductor chips 310, which are stacked. Each of the third semiconductor chips 310 may be electrically connected to the package substrate 10 through third bonding wires 312. Each of the third semiconductor chips 310 may be attached to the third sub-structure S3*a* and the extension structure ES or may be attached to another third semiconductor chip 310 by a fifth die attach film 314 or a sixth die attach film 316.

The third bonding wires 312 may be connected to chip pads on a top surface of the third semiconductor chip 310 aligned near one or more side surfaces of the third semiconductor chip 310. A side surface of a lowermost third semiconductor chip 310 connected to the third bonding wire 312 may be aligned to match a side surface of the second supporter 740 with respect to a top down view. That is, at least one side surface of the third structure S4*a* may be aligned to match a side surface of the extension structure ES with respect to a top down view.

The third structure S4*a* may overlap the entire upper surfaces of the first structure S1*a*, S2*a*, the second structure S3*a*, and the extension structure ES with respect to a top down view. That is, the third structure S4*a* may completely cover the entire upper surfaces of the first structure S1*a* and S2*a*, the second structure S3*a*, and the extension structure ES.

A molding layer 900 may be formed on the package substrate 10 and cover and encapsulate the first structure S1*a* and S2*a*, the second structure S3*a*, the third structure S4*a*, and the extension structure ES and the semiconductor chips formed therein.

The molding layer 900 may include a first molding part 910, filling an internal space internal to the first structure S1*a*, S2*a* (i.e., a separation space between the first sub-structure S1*a* and the second sub-structure S2*a*) in the first layer L1, and a second molding part 930 filling a separation space between the first structure S1*a*, S2*a*, the second structure S3*a*, and the extension structure ES in the first and second layers L1 and L2. A space where the first and second molding parts 910 and 930 are formed may become a path, through which a material included in the molding layer 900 flows in, in a process of forming the molding layer 900.

Figure 4A:
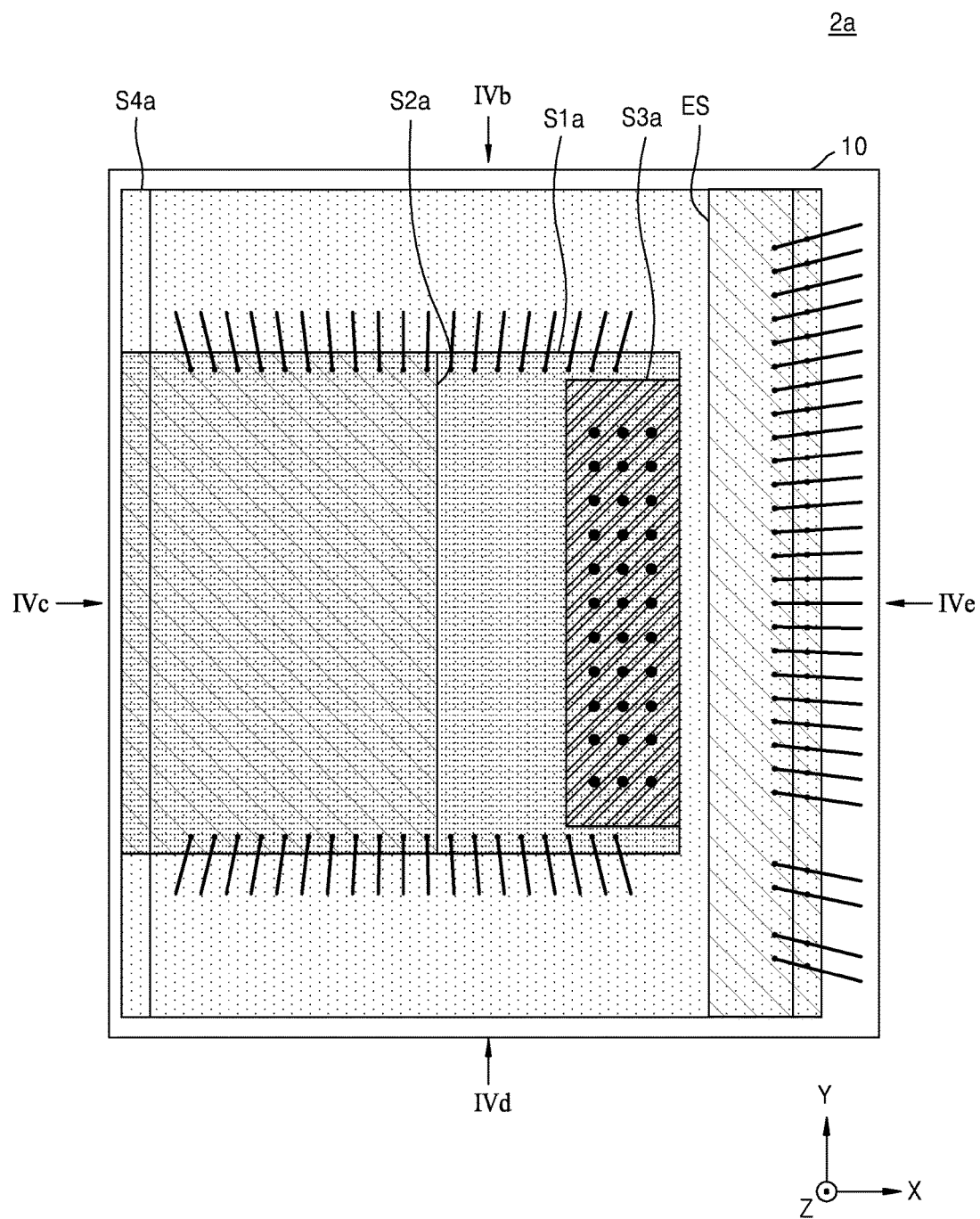
FIG. 4A is a plan layout illustrating a main portion of a semiconductor package according to an embodiment.
Figure 4B:
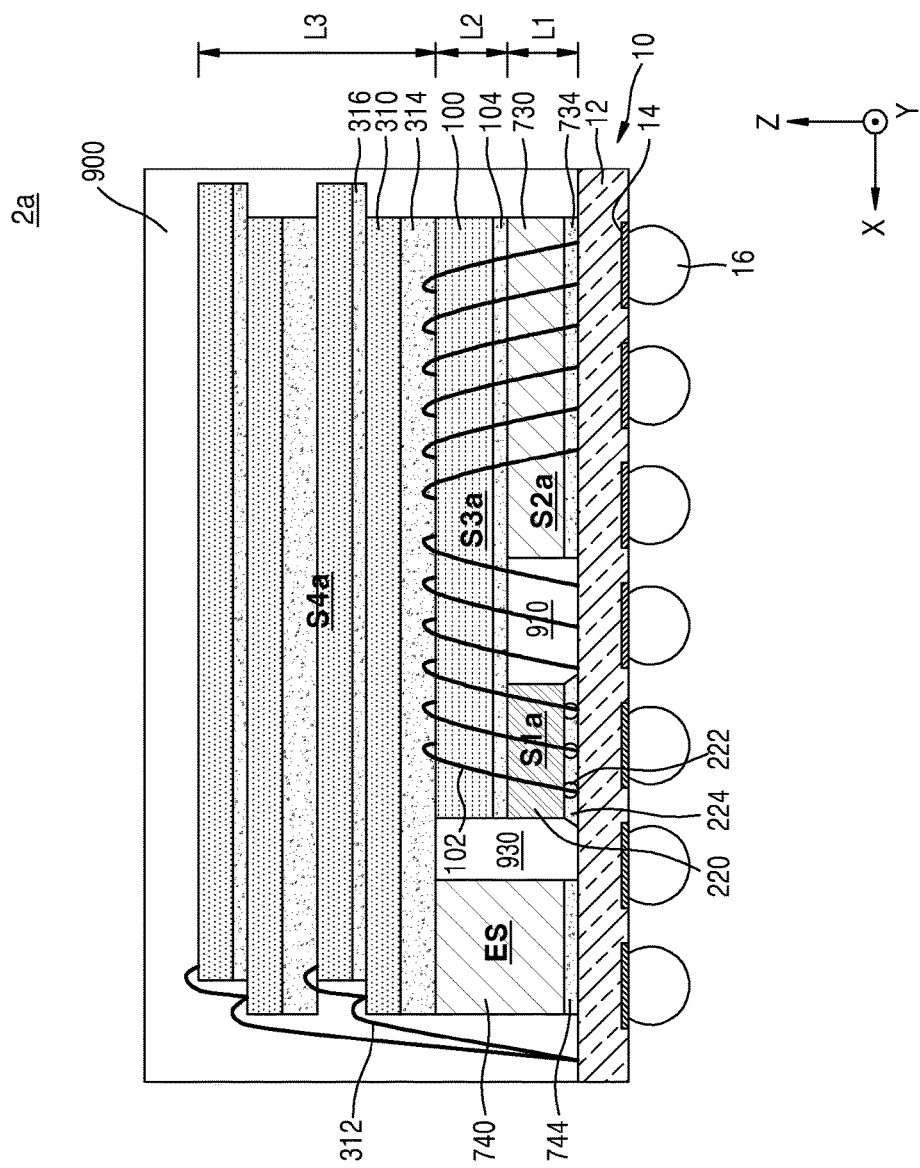
FIGS. 4B to 4E are cross-sectional views of the semiconductor package of FIG. 4A in different side directions.
Figure 4C:
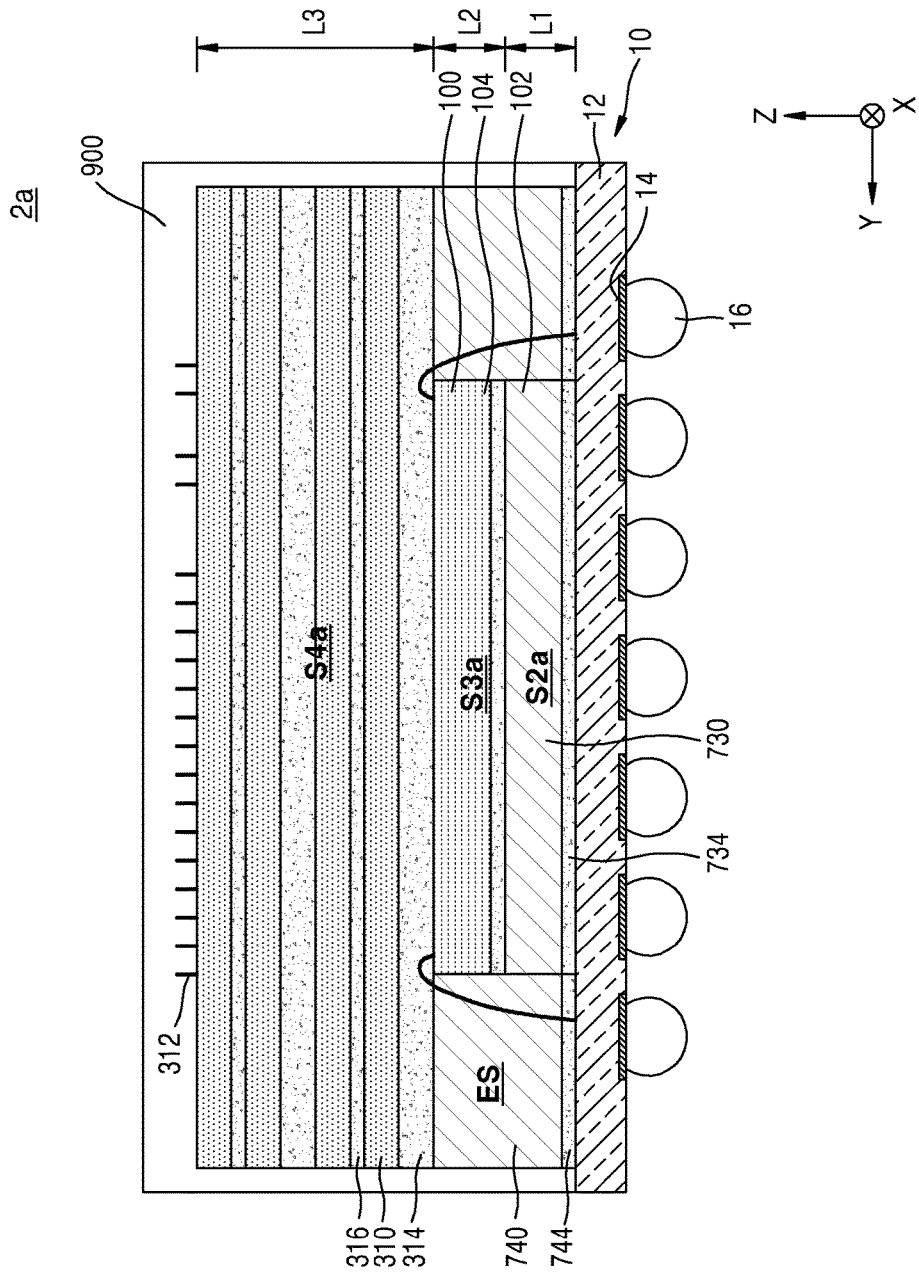
Figure 4D:
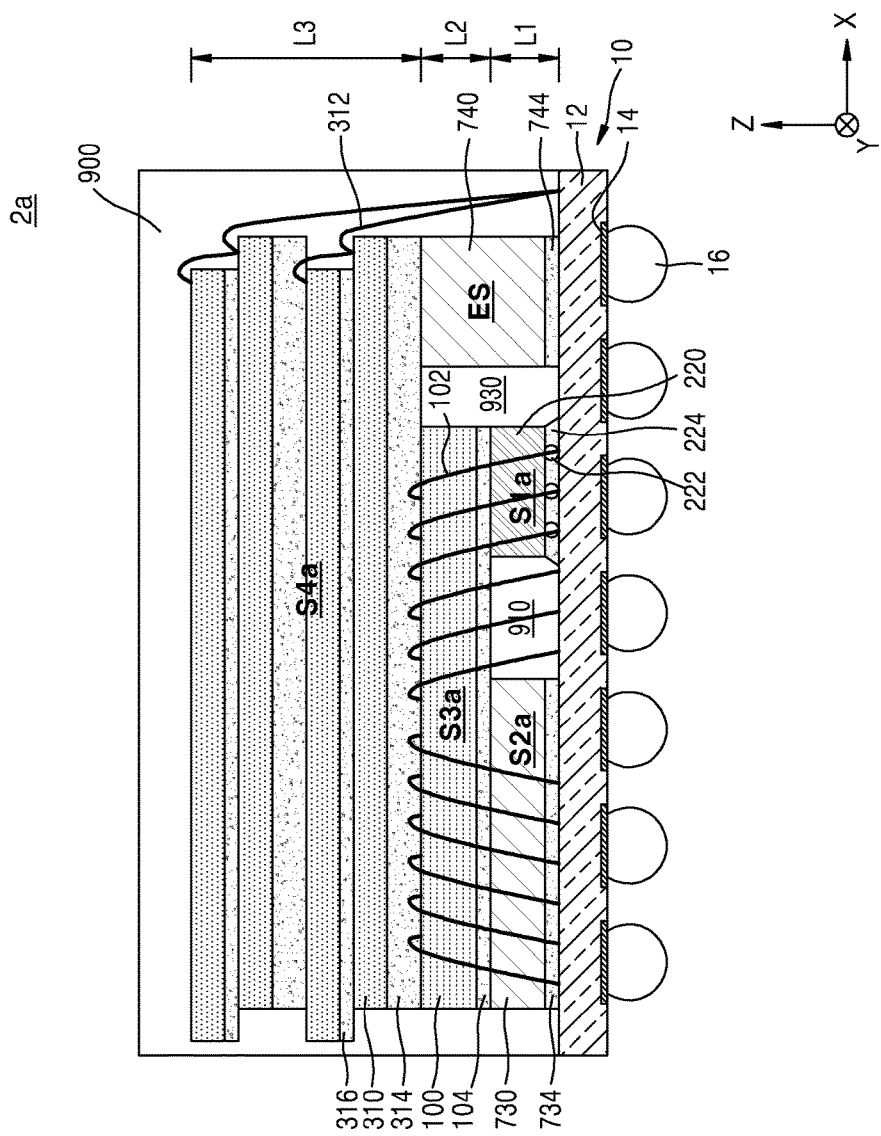
Figure 4E:
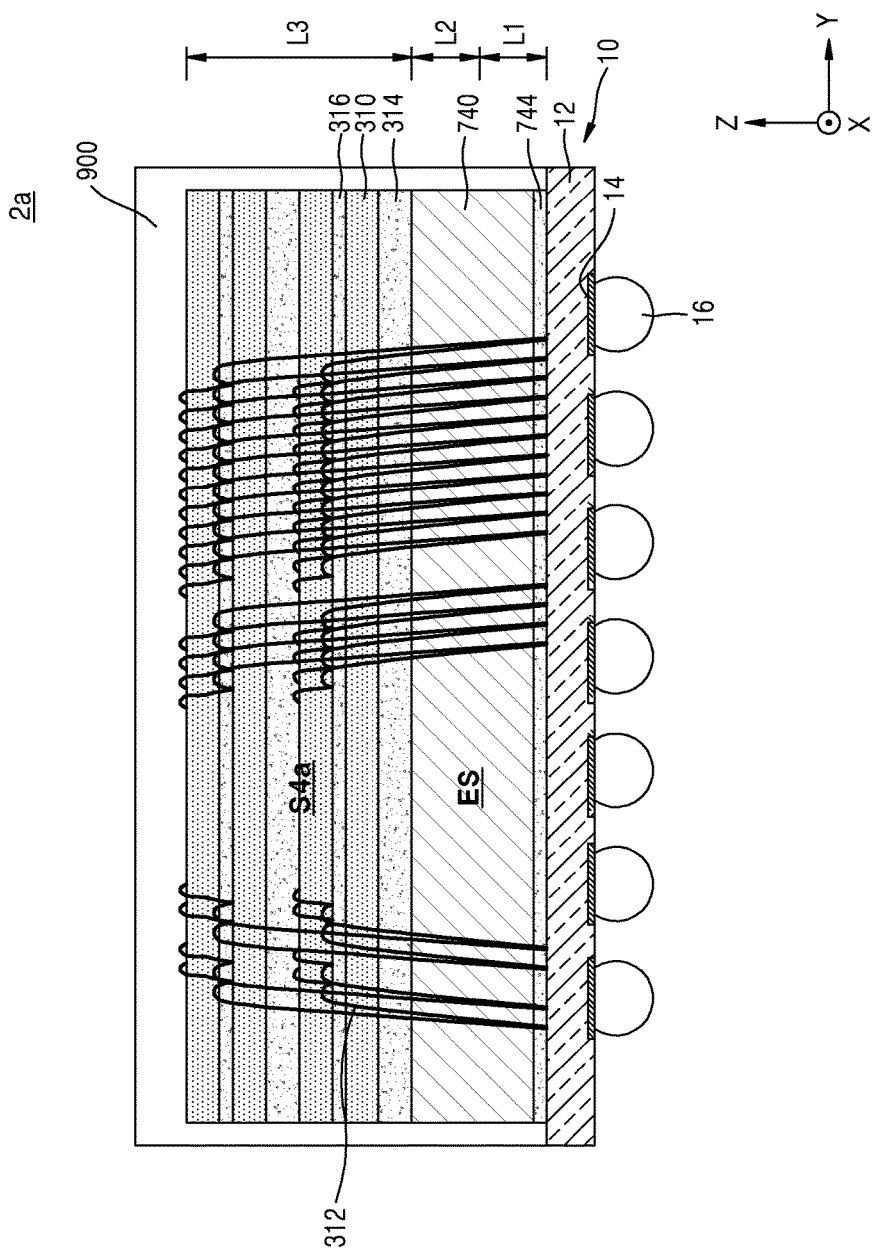

FIG. 4A is a plan layout illustrating a main portion of a semiconductor package 2*a* according to an embodiment, and FIGS. 4B to 4E are cross-sectional views of the semiconductor package 2*a* of FIG. 4A with different side view directions. In providing descriptions with reference to FIGS. 4A to 4E, details which are the same as the details described above with reference to FIGS. 3A to 3E may not be repeated.

Referring to FIGS. 4A to 4E, the semiconductor package 2*a* may include a package substrate 10 and a plurality of structures S1*a*, S2*a*, S3*a*, S4*a* and ES stacked on the package substrate 10.

A first structure S1*a* and S2*a* disposed in a first layer L1 may be attached to the package substrate 10. The first structure S1*a* and S2*a* may include a first sub-structure S1*a* and a second sub-structure S2*a*. The first sub-structure S1*a* and the second sub-structure S2*a* may be disposed on the package substrate 10 and spaced apart from each other.

A second structure S3*a* disposed in a second layer L2 may be attached to the first structure S1*a* and S2*a*. The second structure S3*a* may be referred to as a third sub-structure S3*a*. The third sub-structure S3*a* may be attached over the first sub-structure S1*a* and the second sub-structure S2*a*.

The first sub-structure S1*a* may comprise a second semiconductor chip 210. The second sub-structure S2*a* may comprise a first supporter 730. The third sub-structure S3*a* may comprise a first semiconductor chip 100.

In the second semiconductor chip 220, an active surface, where a plurality of individual devices are provided, may face the package substrate 10. The second semiconductor chip 220 may be electrically connected to the package substrate 10 through a connection bump 222. Therefore, the third die attach film 104 may have a thickness thinner than that illustrated in FIGS. 3B to 3E. In some embodiments, an under-fill material layer 224 surrounding the connection bump 222 may be formed between the second semiconductor chip 220 and the package substrate 10. In some embodiments, the under-fill material layer 224 may be a portion of the molding layer 900 that is formed through a molded under-fill (MUF) process.

The other elements of the semiconductor package 2*a* are similar to the semiconductor package 2 described above with reference to FIGS. 3A to 3E, and thus, their detailed descriptions are omitted.

Figure 5A:
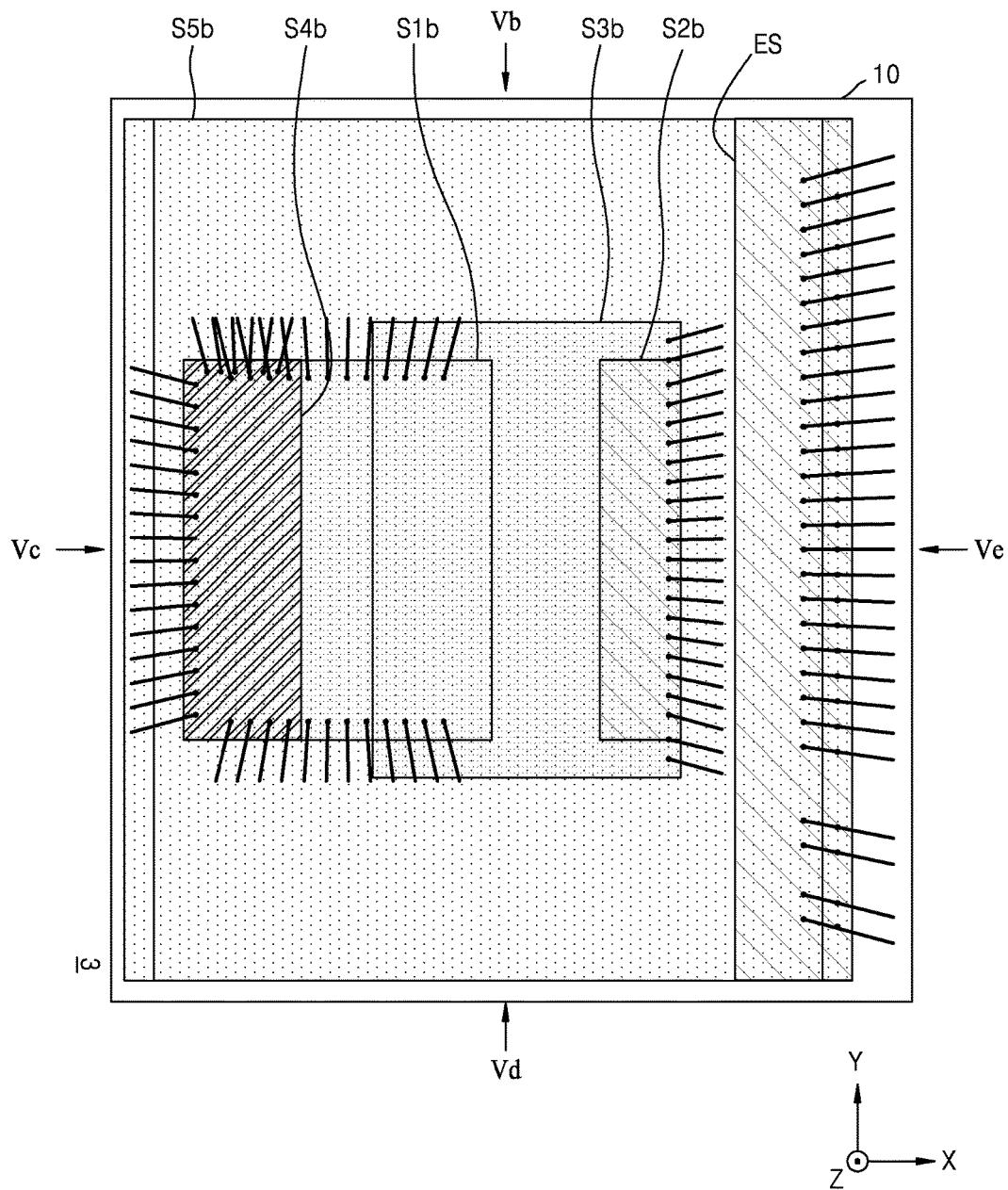
FIG. 5A is a plan layout illustrating a main portion of a semiconductor package according to an embodiment.
Figure 5B:
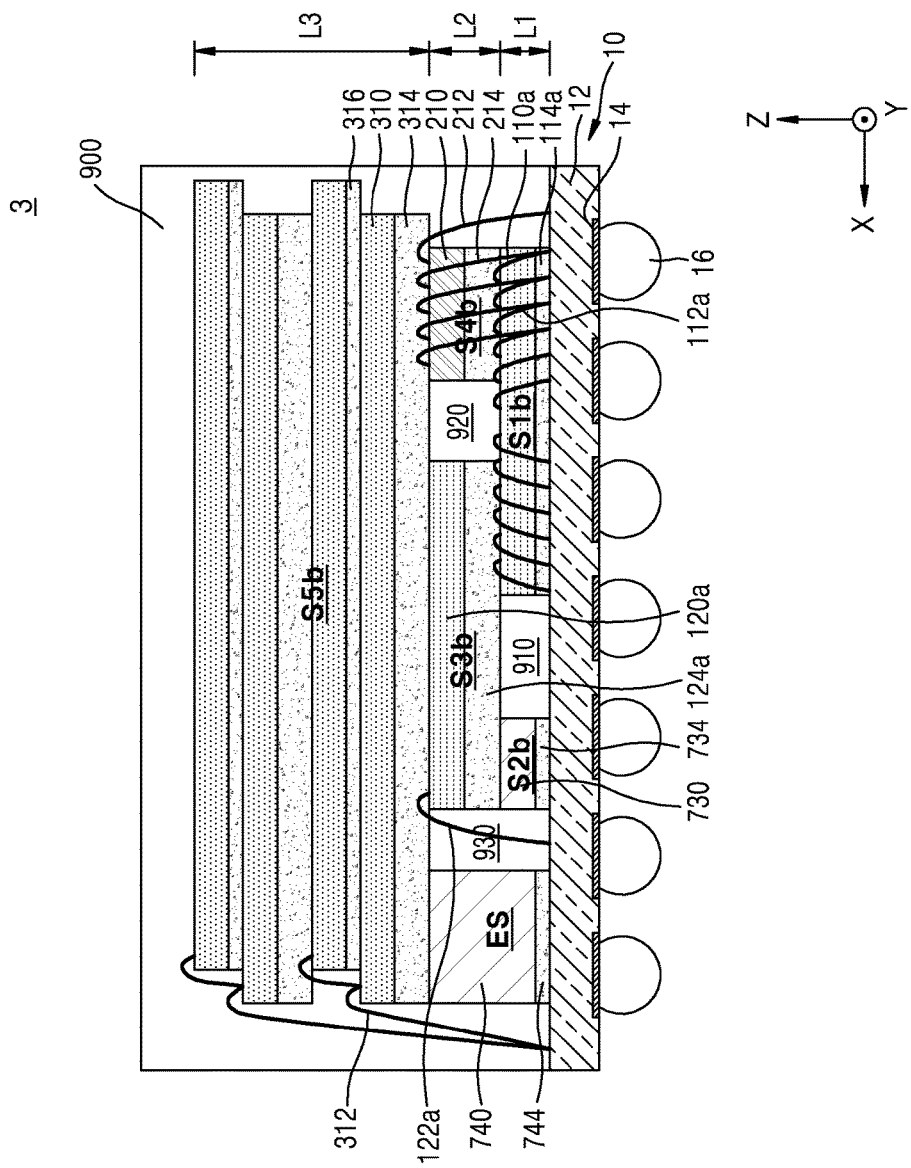
FIGS. 5B to 5E are cross-sectional views of the semiconductor package of FIG. 5A in different side directions.
Figure 5C:
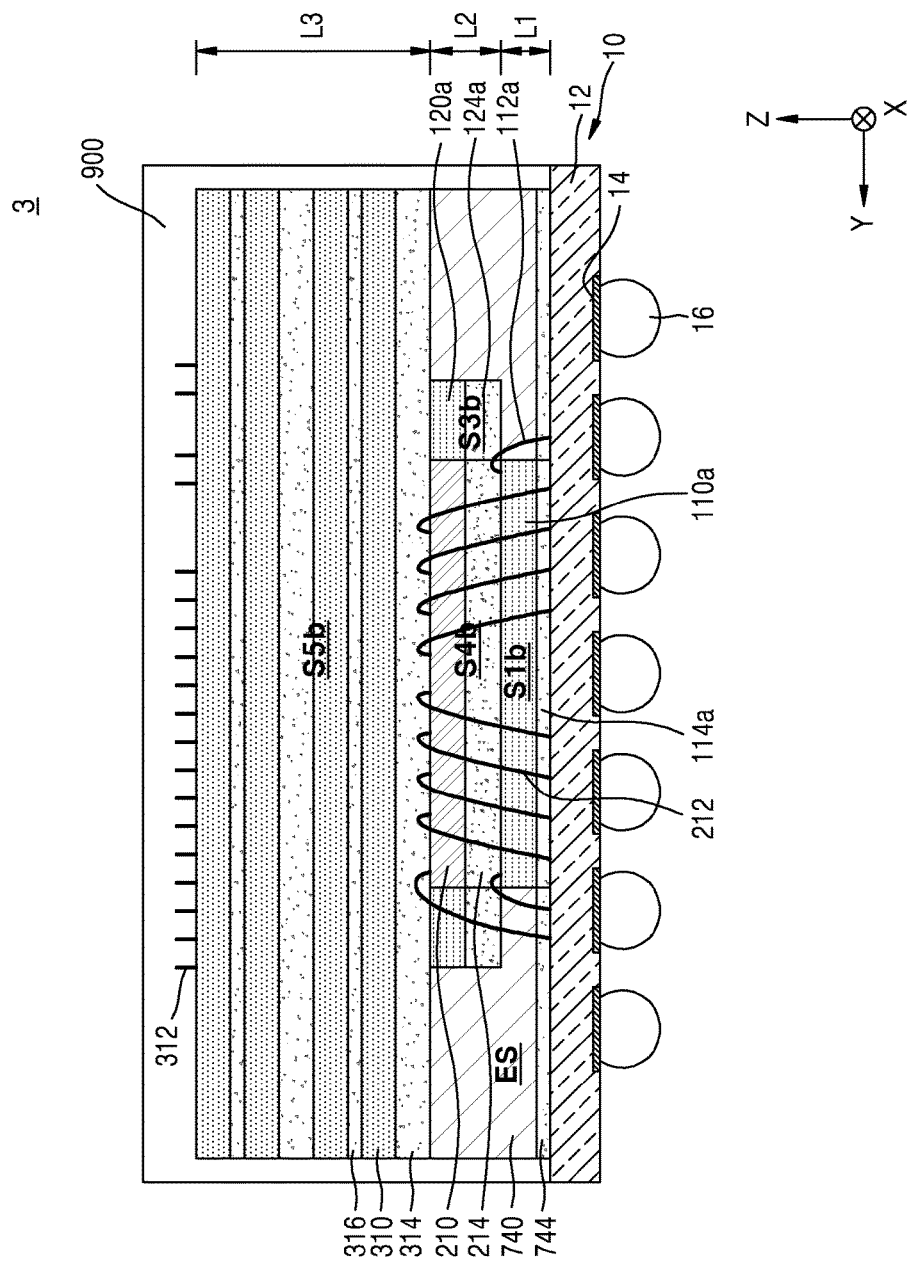
Figure 5D:
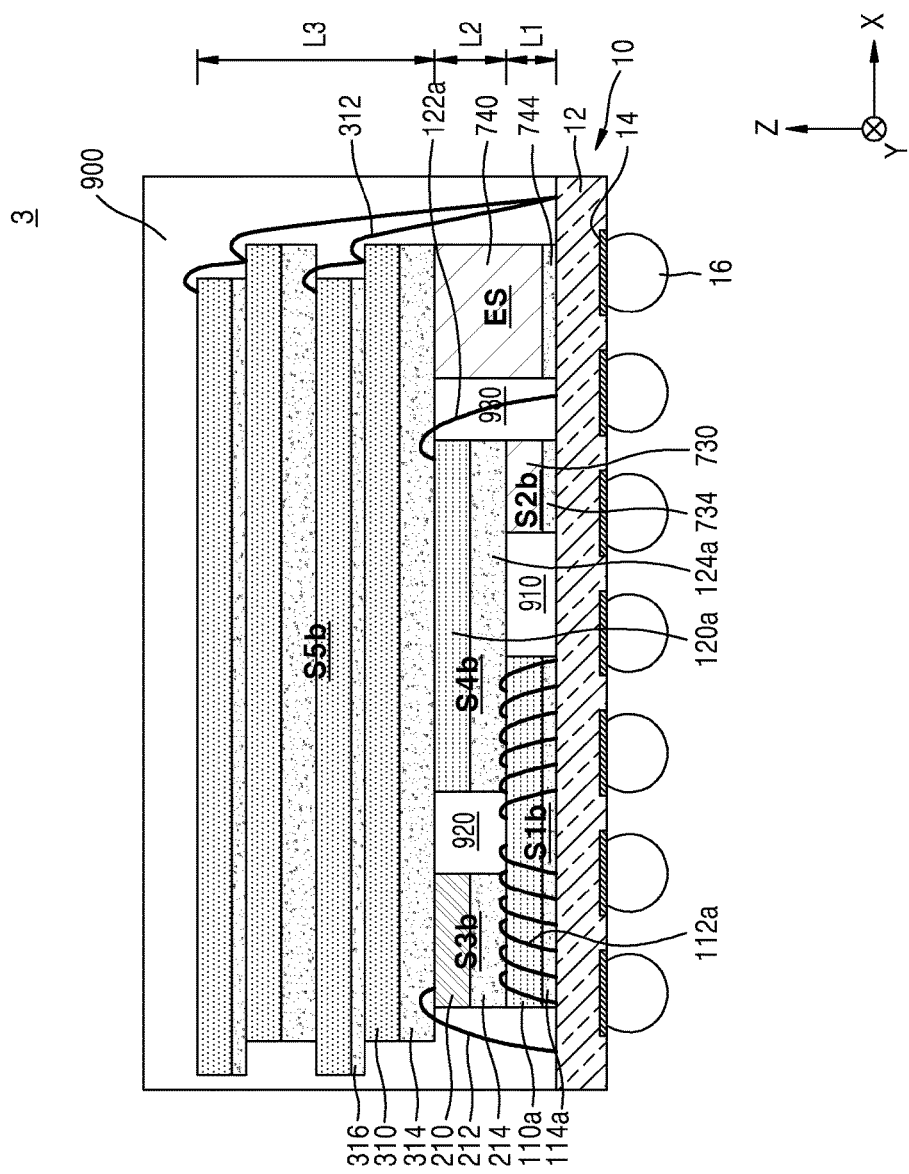
Figure 5E:
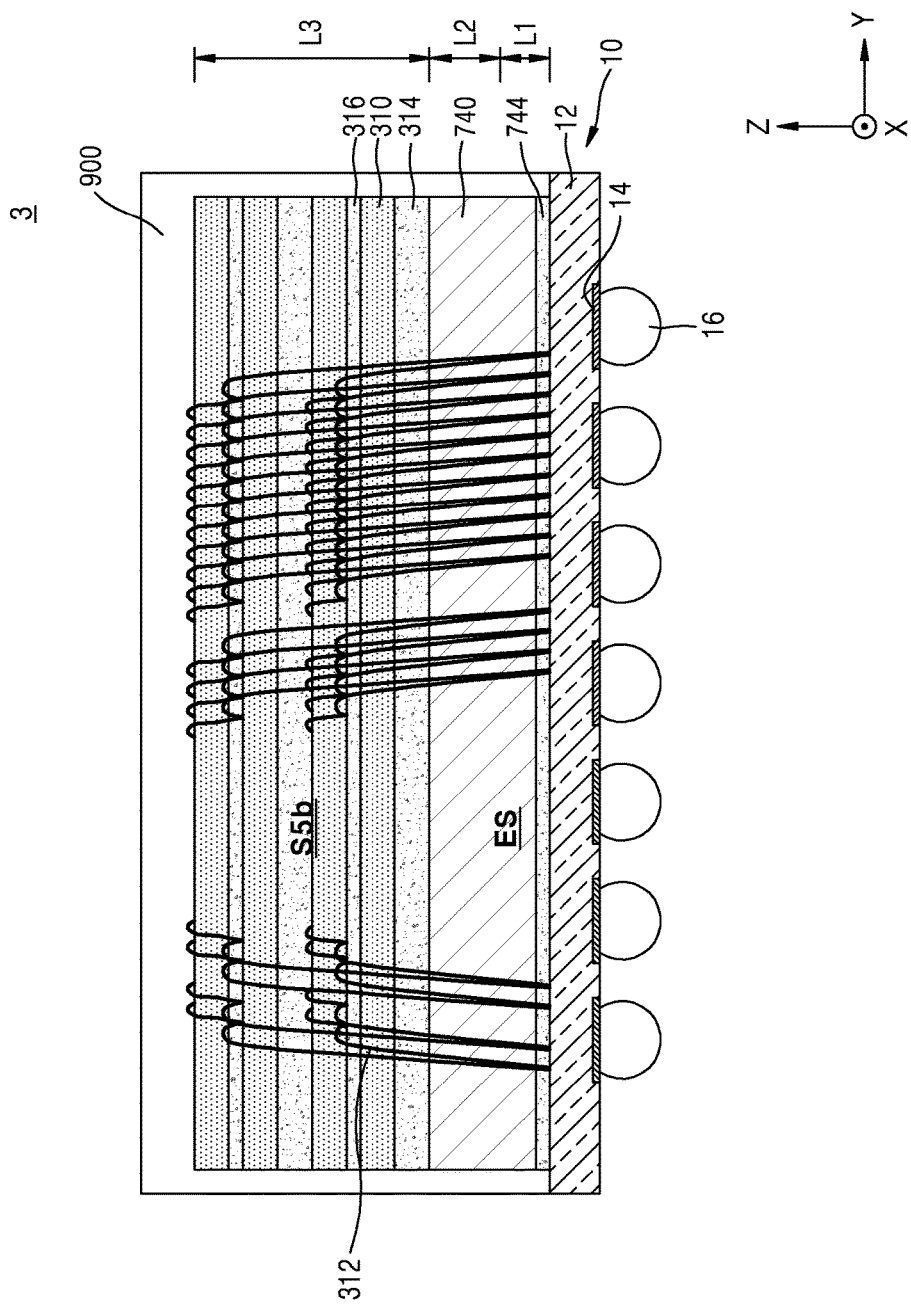

FIG. 5A is a plan layout illustrating a main portion of a semiconductor package 3 according to an embodiment, and FIGS. 5B to 5E are cross-sectional views of the semiconductor package 3 of FIG. 5A with different side view directions. In providing descriptions with reference to FIGS. 5A to 5E, details which are the same as the details described above with reference to FIGS. 1A to 4E may not be repeated.

Referring to FIGS. 5A to 5E, the semiconductor package 3 includes a package substrate 10 and a plurality of structures S1b, S2b, S3b, S4b, S5b and ES stacked on the package substrate 10.

A first structure S1b and S2b disposed in a first layer L1 may be attached to the package substrate 10. The first structure S1b and S2b may include a first sub-structure S1b and a second sub-structure S2b. The first sub-structure S1b and the second sub-structure S2b may be disposed on the package substrate 10 and spaced apart from each other.

A second structure S3b and S4b disposed in a second layer L2 may be attached to the first structure S1b and S2b. The second structure S3b and S4b may include a third sub-structure S3b and a fourth sub-structure S4b. The third sub-structure S3b may be attached over the first sub-structure S1b and the second sub-structure S2b. The fourth sub-structure S3b may be attached to the first sub-structure S1b.

The first sub-structure S1b and the third sub-structure S3b may each comprise a first lower semiconductor chip 110a and a first upper semiconductor chip 120a. The second sub-structure S2b may comprise a first supporter 730. The fourth sub-structure S4b may comprise a second semiconductor chip 210.

With the possible exception of dimensions, first lower semiconductor chip 110a and the first upper semiconductor chip 120a may be the same as the first semiconductor chip 110 described above with reference to FIGS. 1A to 2E, and thus, their detailed descriptions are omitted. Also, with the possible exception of dimensions, the second semiconductor chip 210 and the first supporter 730 may be same as the second semiconductor chip 210 and the first supporter 730 described above with reference to FIGS. 1A to 2E, and thus, their detailed descriptions are omitted.

The first lower semiconductor chip 110a may be electrically connected to the package substrate 10 through a first lower bonding wire 112a. The first lower semiconductor chip 110a may be attached to the package substrate 10 by a first die attach film 114a.

The first supporter 730 may be attached to the package substrate 10 by a second die attach film 734.

The first upper semiconductor chip 120a may be electrically connected to the package substrate 10 through a first upper bonding wire 122a. The first upper semiconductor chip 120a may be attached over the first lower semiconductor chip 110a and the first supporter 730 by a third die attach film 124a.

The second semiconductor chip 210 may be electrically connected to the package substrate 10 through a second bonding wire 212. The second semiconductor chip 210 may be attached to the first lower semiconductor chip 110a and the first supporter 730 by a fourth die attach film 214.

The third die attach film 124a and the fourth die attach film 214 may be thicker than the first die attach film 114a and the second die attach film 734. A portion and another portion of the first lower bonding wire 112a may be respectively buried in the third die attach film 124a and the fourth die attach film 214.

A side surface of the first upper semiconductor chip 120a connected to the first upper bonding wire 122a may be aligned to match a side surface of the first supporter 730 with respect to a top down view. That is, at least one side surface of the third sub-structure S3b may be aligned to match a side surface of the second sub-structure S2b with respect to a top down view.

A side surface of the second semiconductor chip 210 connected to a second bonding wire 212 may be aligned to match a side surface of the first lower semiconductor chip 110a with respect to a top down view. That is, at least one side surface of the fourth sub-structure S4b may be aligned to match a side surface of the first sub-structure S1b with respect to a top down view.

An extension structure ES disposed in the first and second layers L1 and L2 may be attached to the package substrate 10. The extension structure ES may comprise a second supporter 740. The second supporter 740 may be attached to the package substrate 10 by a fifth die attach film 744.

A third structure S5b disposed in a third layer L3 may be attached to the third sub-structure S3b, the fourth sub-structure S4b, and the extension structure ES. The third sub-structure S5b may be attached over the third sub-structure S3b, the fourth sub-structure S4b, and the extension structure ES. In some embodiments, the third structure S5b disposed in a third layer L3 may comprise only one sub-structure.

The third structure S5b may comprise a plurality of third semiconductor chips 310, which are stacked. Each of the third semiconductor chips 310 may be electrically connected to the package substrate 10 through the third bonding wire 312. Each of the third semiconductor chips 310 may be attached to the third sub-structure S3b, the fourth sub-structure S4b, and the extension structure ES or may be attached to another third semiconductor chip 310 by a sixth die attach film 314 or a seventh die attach film 316.

A side surface of a lowermost third semiconductor chip 310 connected to the third bonding wire 312 may be aligned to match a side surface of the second supporter 740 with respect to a top down view. That is, at least one side surface of the third structure S5b may be aligned to match a side surface of the extension structure ES with respect to a top down view.

The third structure S5b may overlap the entire upper surfaces of the first structure S1b and S2b, the second structure S3b and S4b, and the extension structure ES in a vertical direction. That is, the third structure S5b may completely cover the entire upper surfaces of the first structure S1b and S2b, the second structure S3b and S4b, and the extension structure ES.

A molding layer 900 may be formed on the package substrate 10 and cover the first structure S1b and S2b, the second structure S3b and S4b, the third structure S5b, and the extension structure ES.

The molding layer 900 may include a first molding part 910 filling an internal space of the first structure S1b and S2b (i.e., a separation space between the first sub-structure S1b and the second sub-structure S2b) in the first layer L1, a second molding part 920 filling an internal space of the second structure S3b and S4b (i.e., a separation space between the third sub-structure S3b and the fourth sub-structure S4b) in the second layer L2, and a third molding part 930 filling a separation space between the first structure S1b and S2b, the second structure S3b and S4b, and the extension structure ES in the first and second layers L1 and L2, namely, a separation space between the second sub-structure S2b, the third sub-structure S3b, and the extension structure ES. A space where the first molding part 910, the second molding part 920, and the third molding part 930 are formed may become a path, through which a material included in the molding layer 900 flows in, in a process of forming the molding layer 900.

Figure 6A:
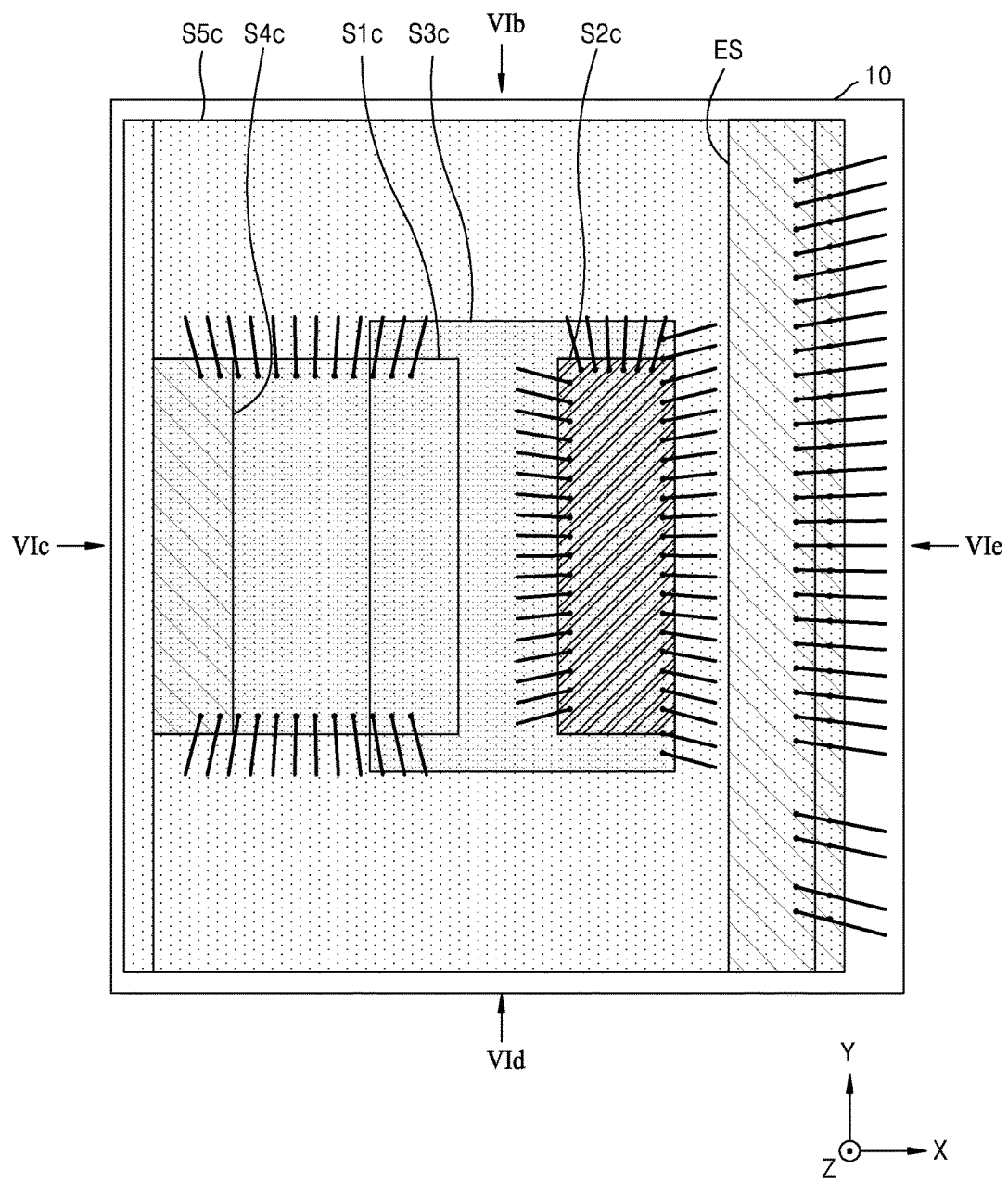
FIG. 6A is a plan layout illustrating a main portion of a semiconductor package according to an embodiment.
Figure 6B:
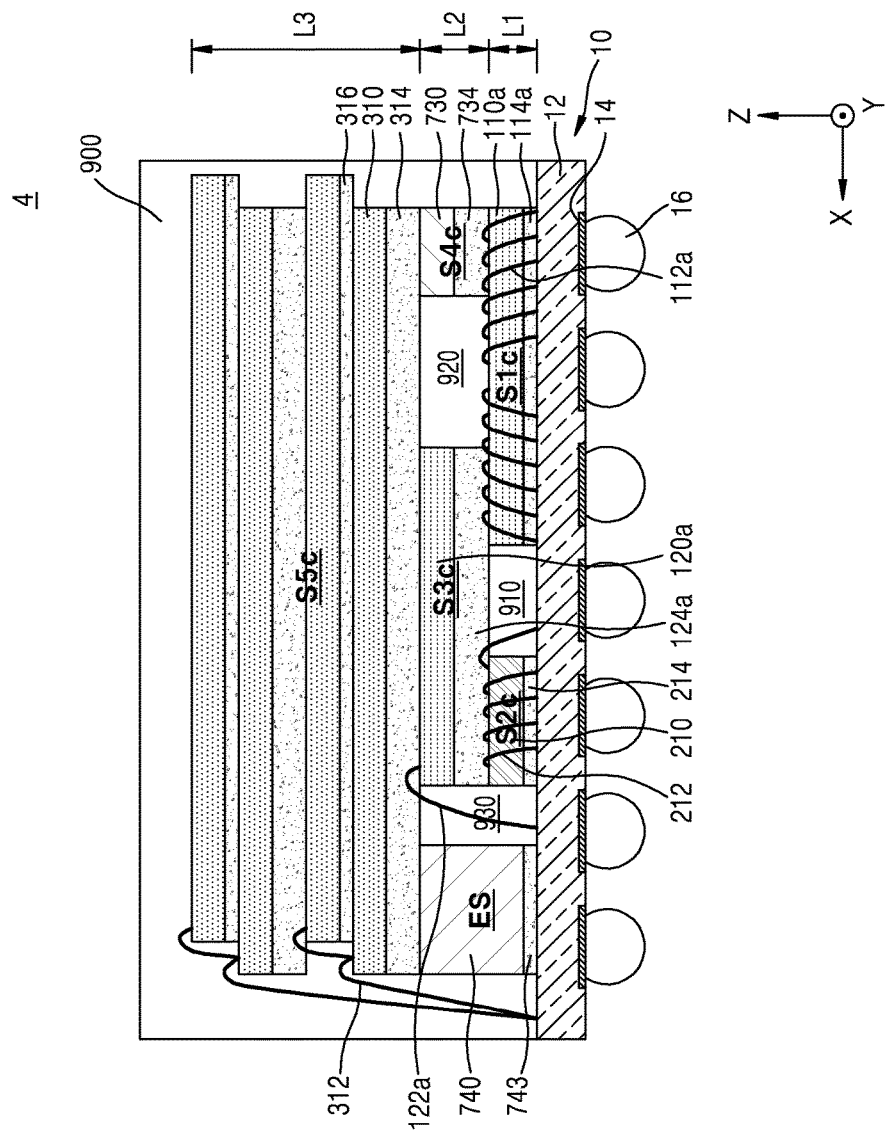
FIGS. 6B to 6E are cross-sectional views of the semiconductor package of FIG. 6A in different side directions.
Figure 6C:
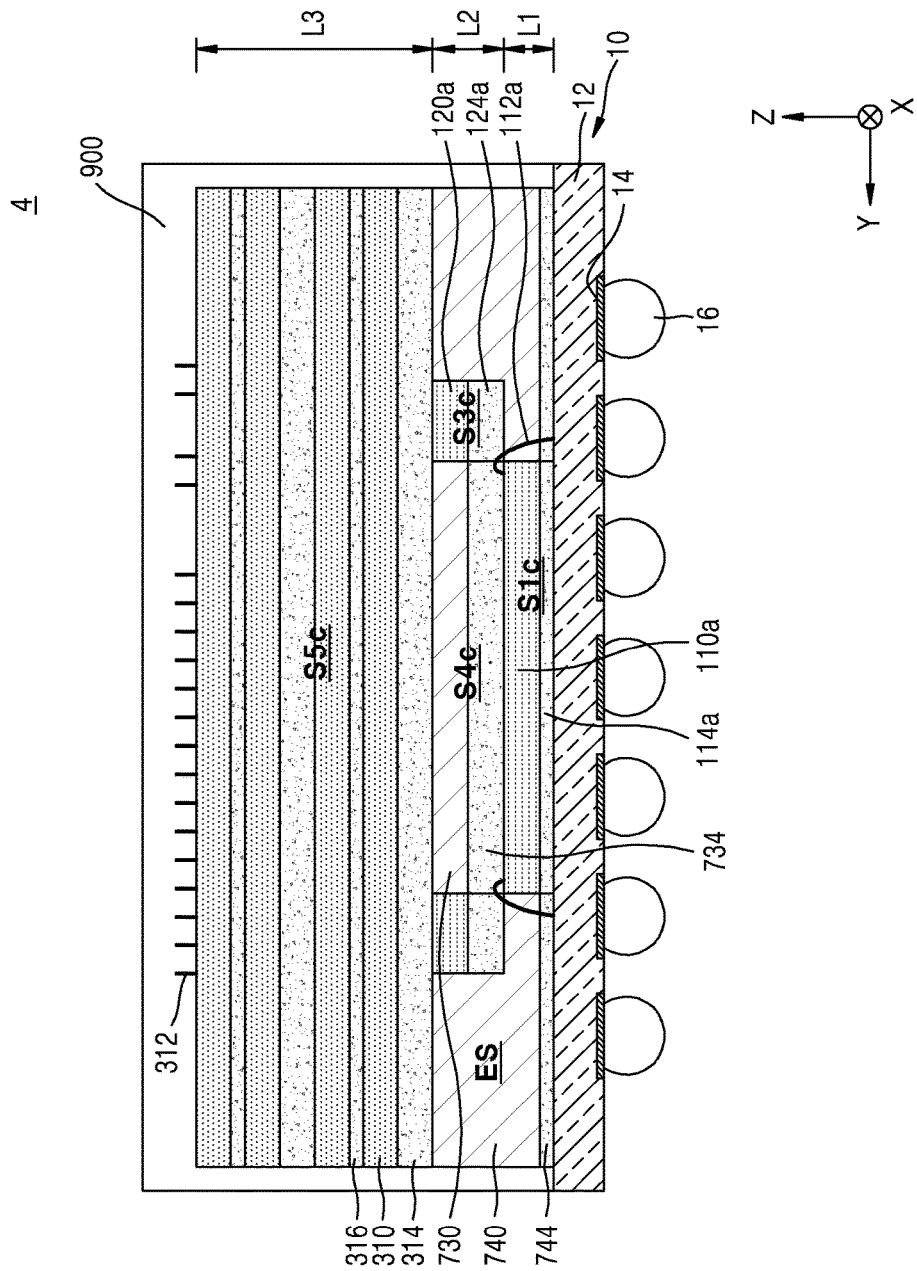
Figure 6D:
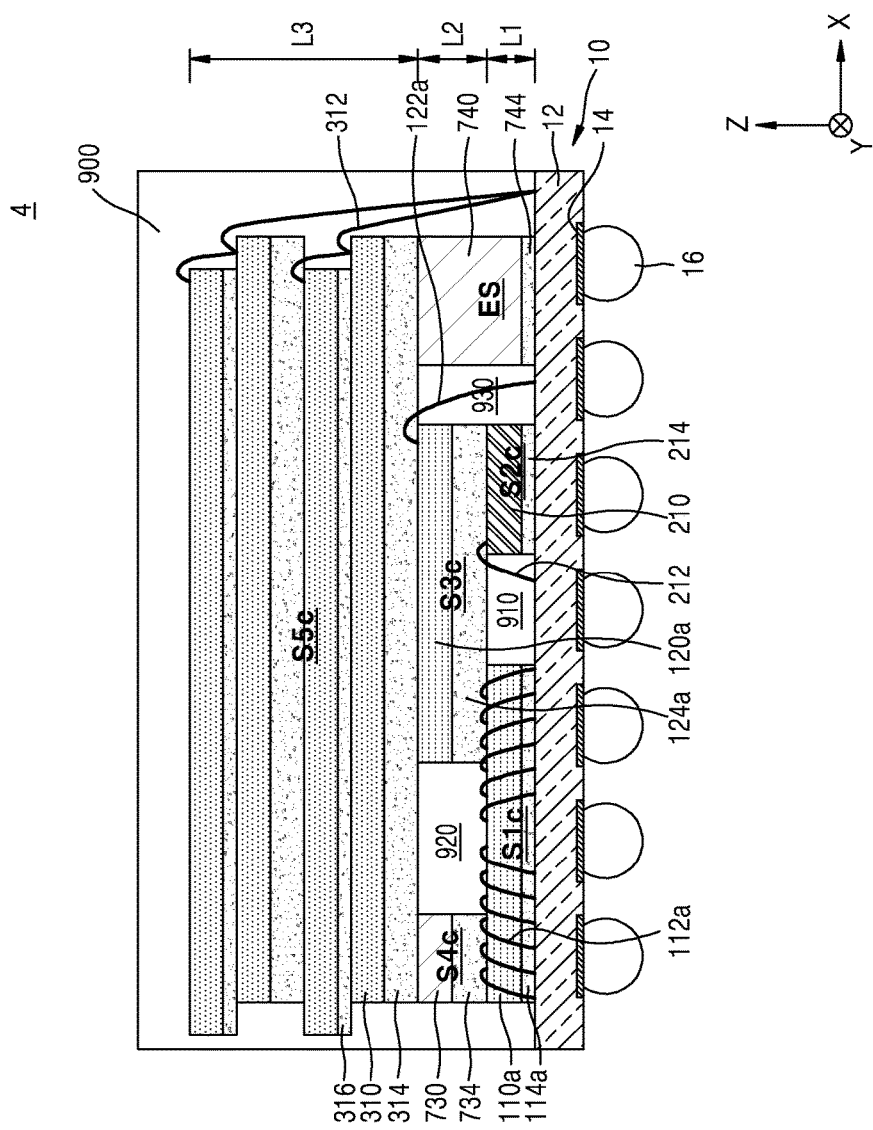
Figure 6E:
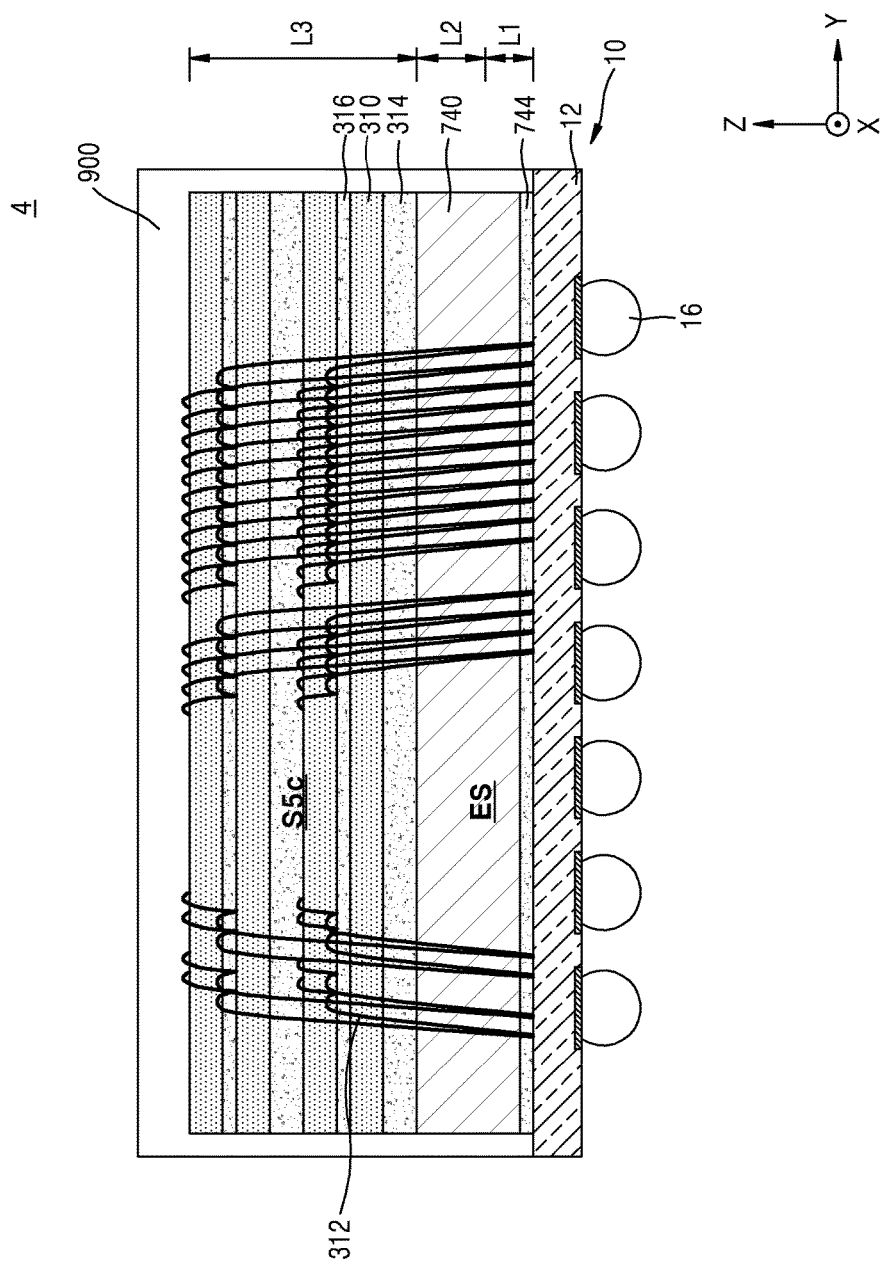

FIG. 6A is a plan layout illustrating a main portion of a semiconductor package 4 according to an embodiment, and FIGS. 6B to 6E are cross-sectional views of the semiconductor package 4 of FIG. 6A with different side view directions. In providing descriptions with reference to FIGS. 6A to 6E, details which are the same as the details described above with reference to FIGS. 5A to 5E may not be repeated.

Referring to FIGS. 6A to 6E, the semiconductor package 4 may include a package substrate 10 and a plurality of structures S1c, S2c, S3c, S4c, S5c and ES stacked on the package substrate 10.

A first structure S1c and S2c disposed in a first layer L1 may be attached to the package substrate 10. The first structure S1c and S2c may include a first sub-structure S1c and a second sub-structure S2c. The first sub-structure S1c and the second sub-structure S2c may be disposed on the package substrate 10 and spaced apart from each other.

A second structure S3c and S4c disposed in a second layer L2 may be attached to the first structure S1c and S2c. The second structure S3c and S4c may include a third sub-structure S3c and a fourth sub-structure S4c. The third sub-structure S3c may be attached over the first sub-structure S1c and the second sub-structure S2c. The fourth sub-structure S3c may be attached to the first sub-structure S1c. The extension structure ES disposed in the first and second layers L1 and L2 may be attached to the package substrate 10. A third structure S5c disposed in a third layer L3 may be attached to the third sub-structure S3c, the fourth sub-structure S4c, and the extension structure ES.

The first sub-structure S1c and the third sub-structure S3c may each comprise a first lower semiconductor chip 110a and a first upper semiconductor chip 120a. The second sub-structure S2c may comprise a second semiconductor chip 210. The fourth sub-structure S4c may comprise a first supporter 730. The extension structure ES may comprise a second supporter 740. The third structure S5c may comprise a plurality of third semiconductor chips 310, which are stacked.

In the semiconductor package 3 of FIGS. 5A to 5E, the second sub-structure S2b includes the first supporter 730 and the fourth sub-structure S4b includes the second semiconductor chip 210, but in the semiconductor chip 4 of FIGS. 6A to 6E, the second sub-structure S2c includes the second semiconductor chip 210 and the fourth sub-structure S4c includes the first supporter 730. Except for such a difference, the semiconductor package 4 of FIGS. 6A to 6E may be the same as the semiconductor package 3 of FIGS. 5A to 5E, and thus, its detailed description is omitted.

Figure 7A:
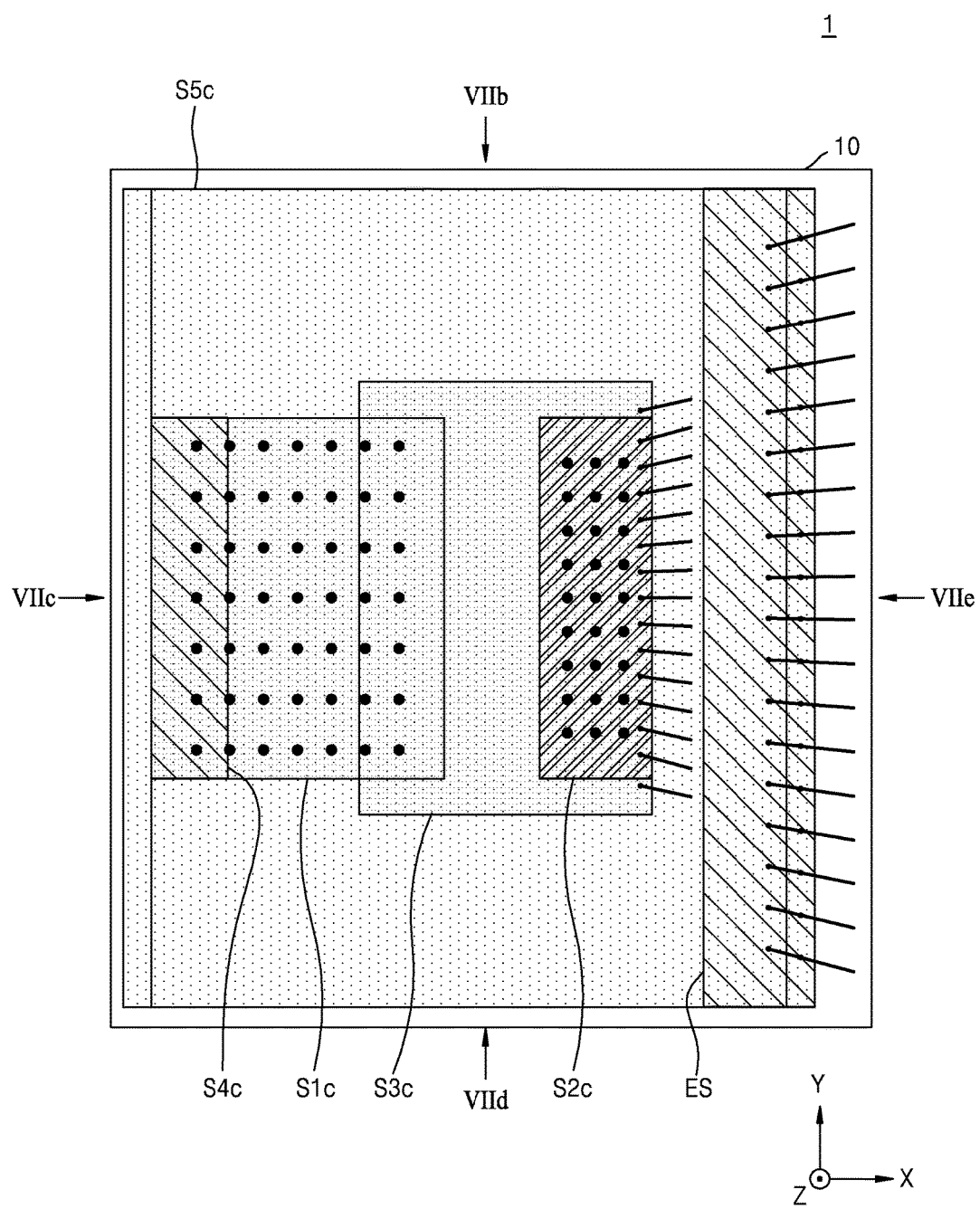
FIG. 7A is a plan layout illustrating a main portion of a semiconductor package according to an embodiment.
Figure 7B:
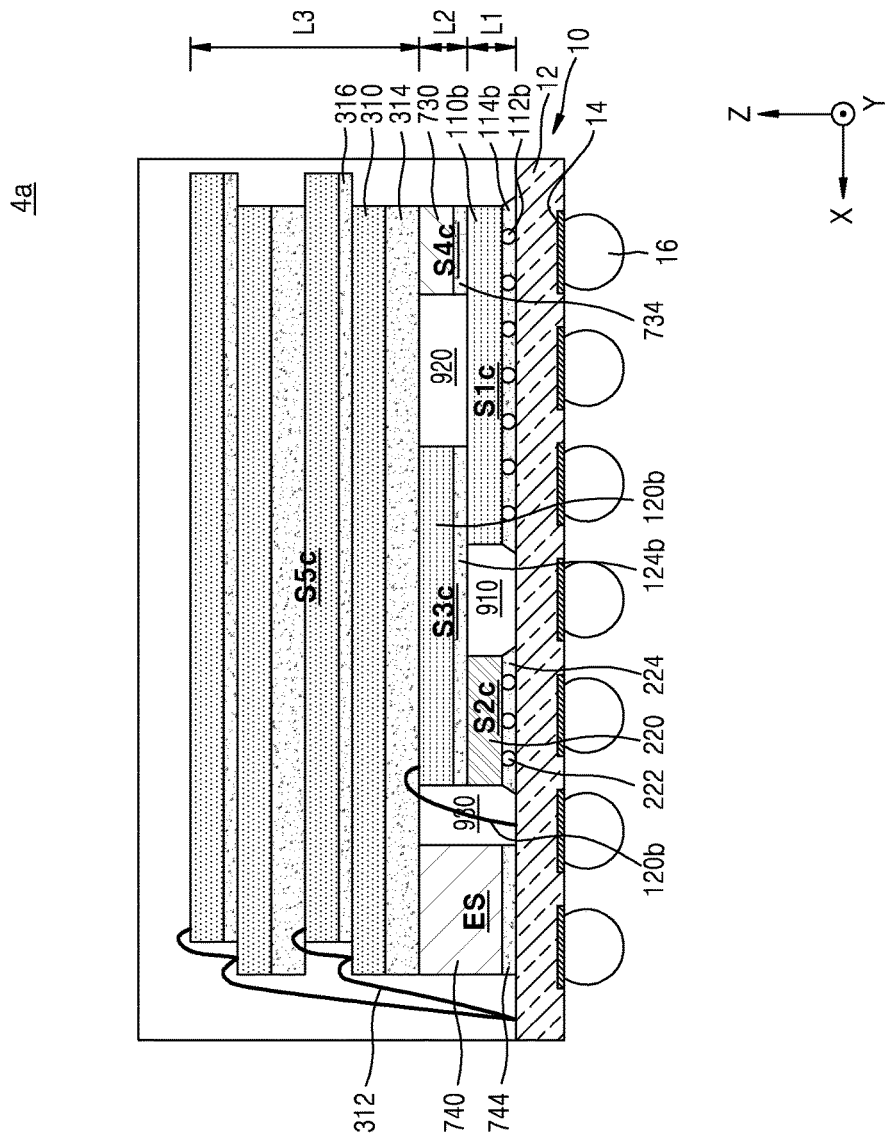
FIGS. 7B to 7E are cross-sectional views of the semiconductor package of FIG. 7A in different side directions.
Figure 7C:
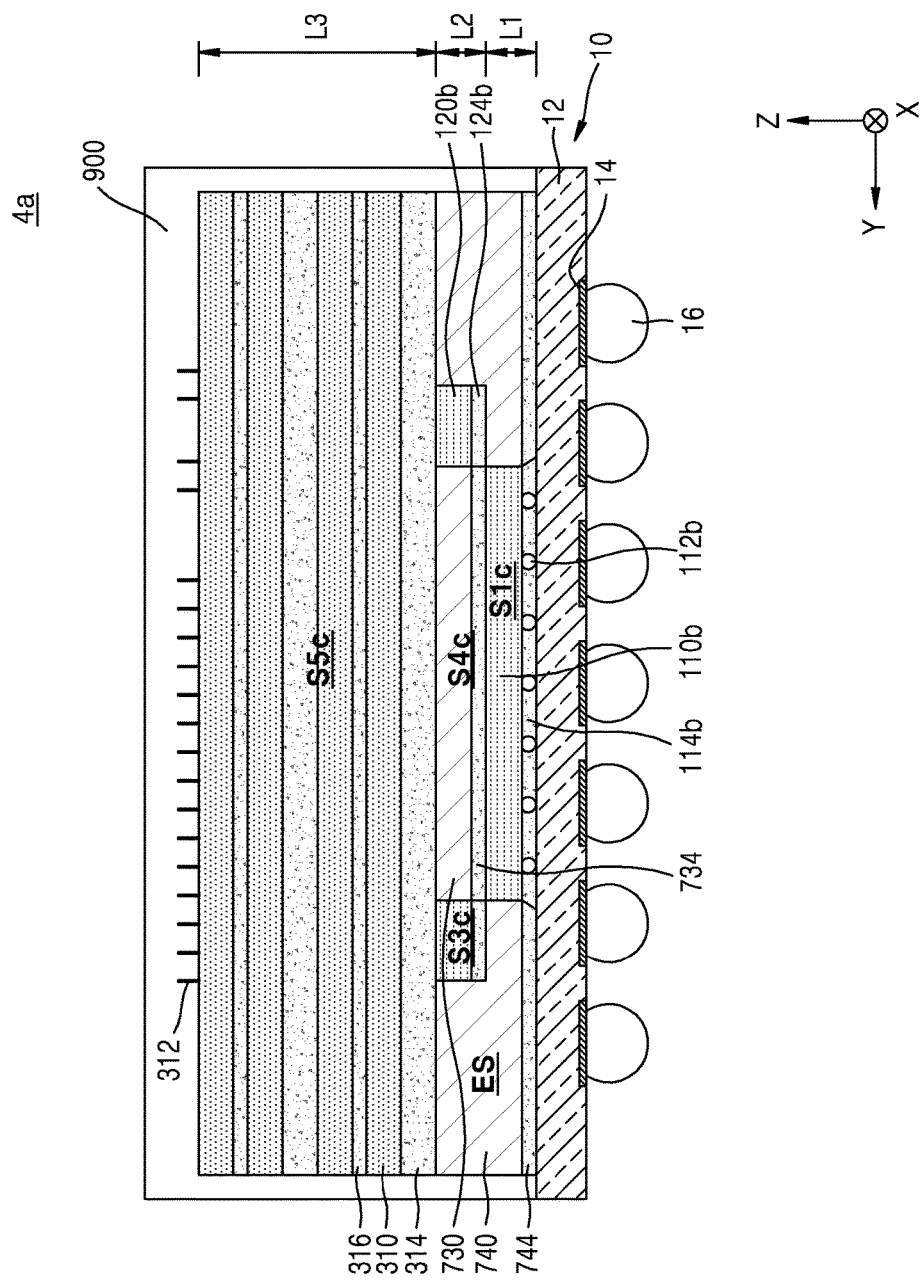
Figure 7D:
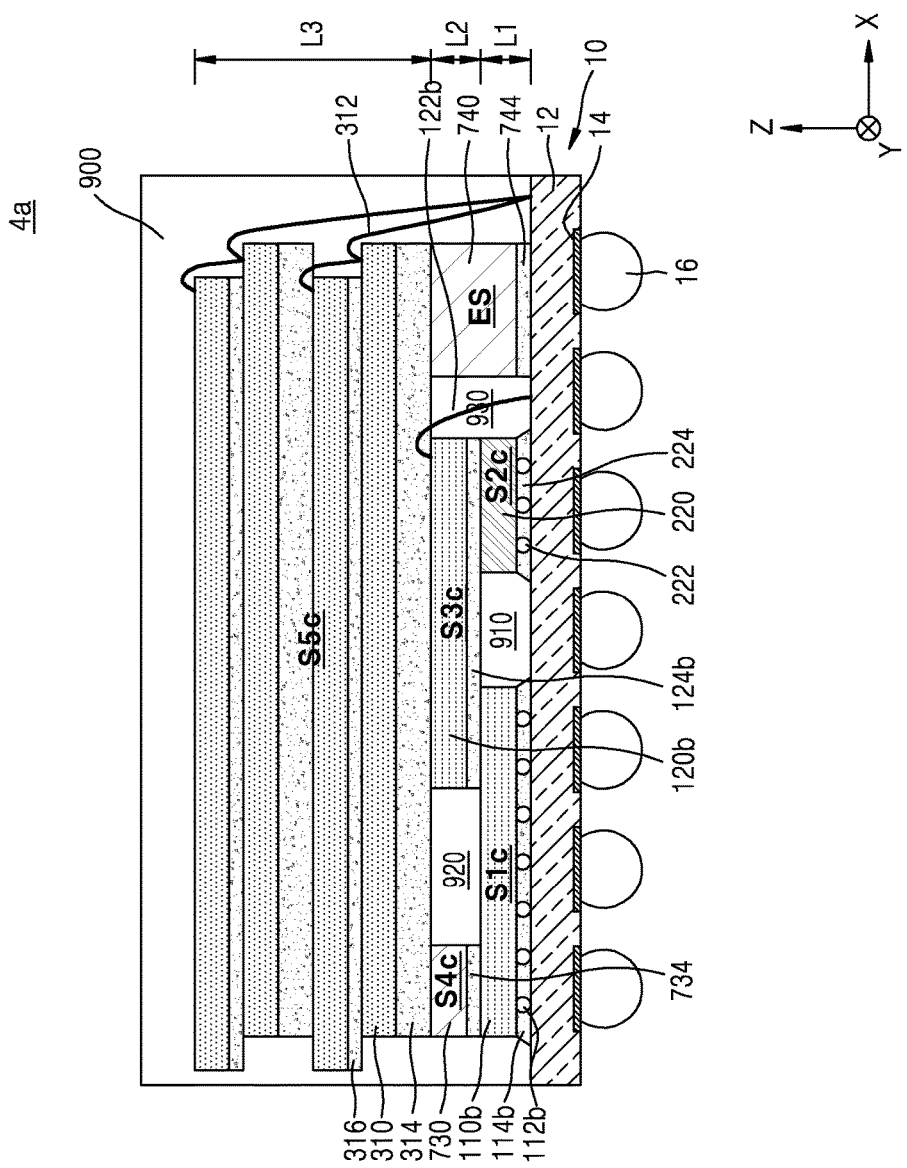
Figure 7E:
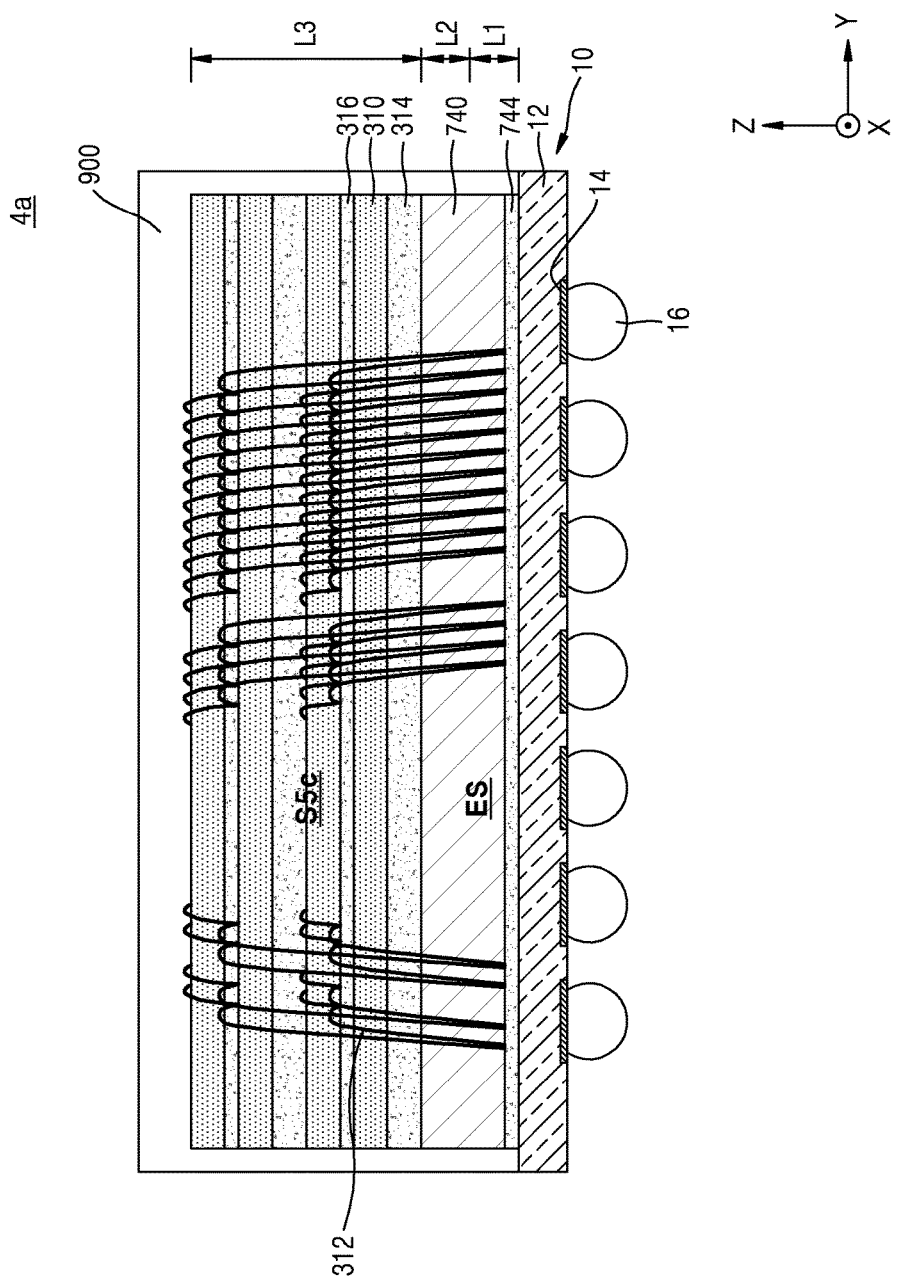

FIG. 7A is a plan layout illustrating a main portion of a semiconductor package 4a according to an embodiment, and FIGS. 7B to 7E are cross-sectional views of the semiconductor package 4a of FIG. 7A with different side view directions. In providing descriptions with reference to FIGS. 7A to 7E, details which are the same as the details described above with reference to FIGS. 6A to 6E may not be repeated.

Referring to FIGS. 7A to 7E, the semiconductor package 4a includes a package substrate 10 and a plurality of structures S1c, S2c, S3c, S4c, S5c and ES stacked on the package substrate 10.

A first structure S1c and S2c disposed in a first layer L1 may be attached to the package substrate 10. The first structure S1c and S2c may include a first sub-structure S1c and a second sub-structure S2c. The first sub-structure S1c and the second sub-structure S2c may be disposed on the package substrate 10 and spaced apart from each other.

A second structure S3c and S4c disposed in a second layer L2 may be attached to the first structure S1c and S2c. The second structure S3c and S4c may include a third sub-structure S3c and a fourth sub-structure S4c. The third sub-structure S3c may be attached over the first sub-structure S1c and the second sub-structure S2c. The fourth sub-structure S3c may be attached to the first sub-structure S1c. The extension structure ES disposed in the first and second layers L1 and L2 may be attached to the package substrate 10. A third structure S5c disposed in a third layer L3 may be attached to the third sub-structure S3c, the fourth sub-structure S4c, and the extension structure ES.

The first sub-structure S1c and the third sub-structure S3c may each comprise a first lower semiconductor chip 110b and a first upper semiconductor chip 120b. The second sub-structure S2c may comprise a second semiconductor chip 220. The fourth sub-structure S4c may comprise a first supporter 730. The extension structure ES may comprise a second supporter 740. The third structure S5c may comprise a plurality of third semiconductor chips 310, which are stacked.

In the first lower semiconductor chip 110b, an active surface where a plurality of individual devices are provided may face the package substrate 10. The first lower semiconductor chip 110b may be electrically connected to the package substrate 10 through a first connection bump 112b. In some embodiments, an under-fill material layer 114b surrounding the first connection bump 112b may be formed between the first lower semiconductor chip 110b and the package substrate 10.

In the second semiconductor chip 220, an active surface where a plurality of individual devices are provided may face the package substrate 10. The second semiconductor chip 220 may be electrically connected to the package substrate 10 through a second connection bump 222. Therefore, a third die attach film 124b may have a thickness thinner than that illustrated in FIGS. 3B to 3E. In some embodiments, an under-fill material layer 224 surrounding the second connection bump 222 may be formed between the second semiconductor chip 220 and the package substrate 10.

Therefore, the third die attach film 124b and a fourth die attach film 734 illustrated in FIGS. 7B to 7E may have a thickness thinner than that of the third die attach film 124a and the fourth die attach film 734 illustrated in FIGS. 6B to 6E.

Except that the first lower semiconductor chip 110b and the second semiconductor chip 220 are electrically connected to the package substrate 10 through the first connection bumps 112b and the second connection bump 222 and the third die attach film 124b and the fourth die attach film 734 have a relatively thin thickness, the features of semiconductor package 4a of FIGS. 7A to 7E may be the same as the semiconductor package 4 of FIGS. 6A to 6E, and thus, further detailed description is omitted.

Figure 8A:
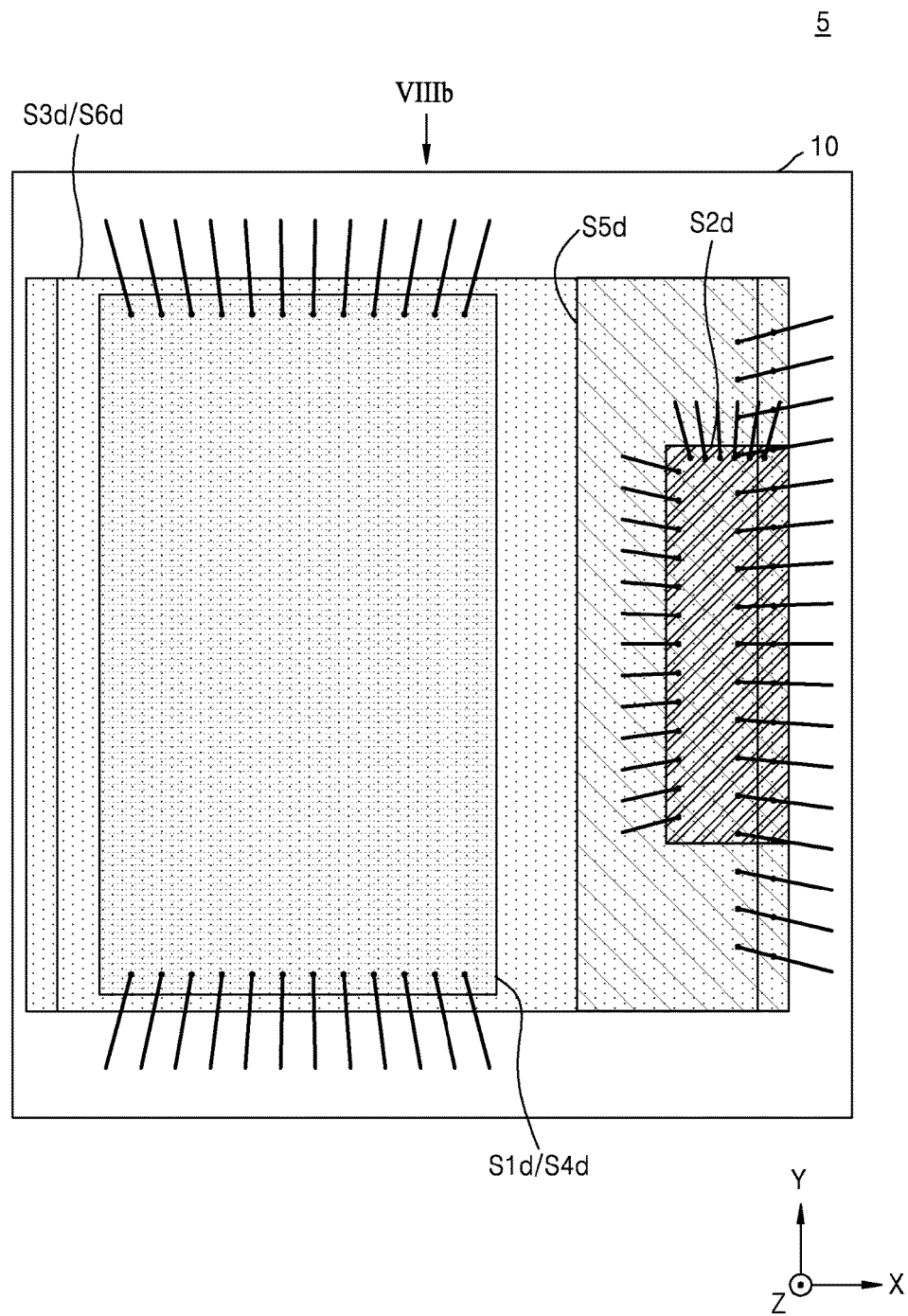
FIG. 8A is a plan layout illustrating a main portion of a semiconductor package according to an embodiment.
Figure 8B:
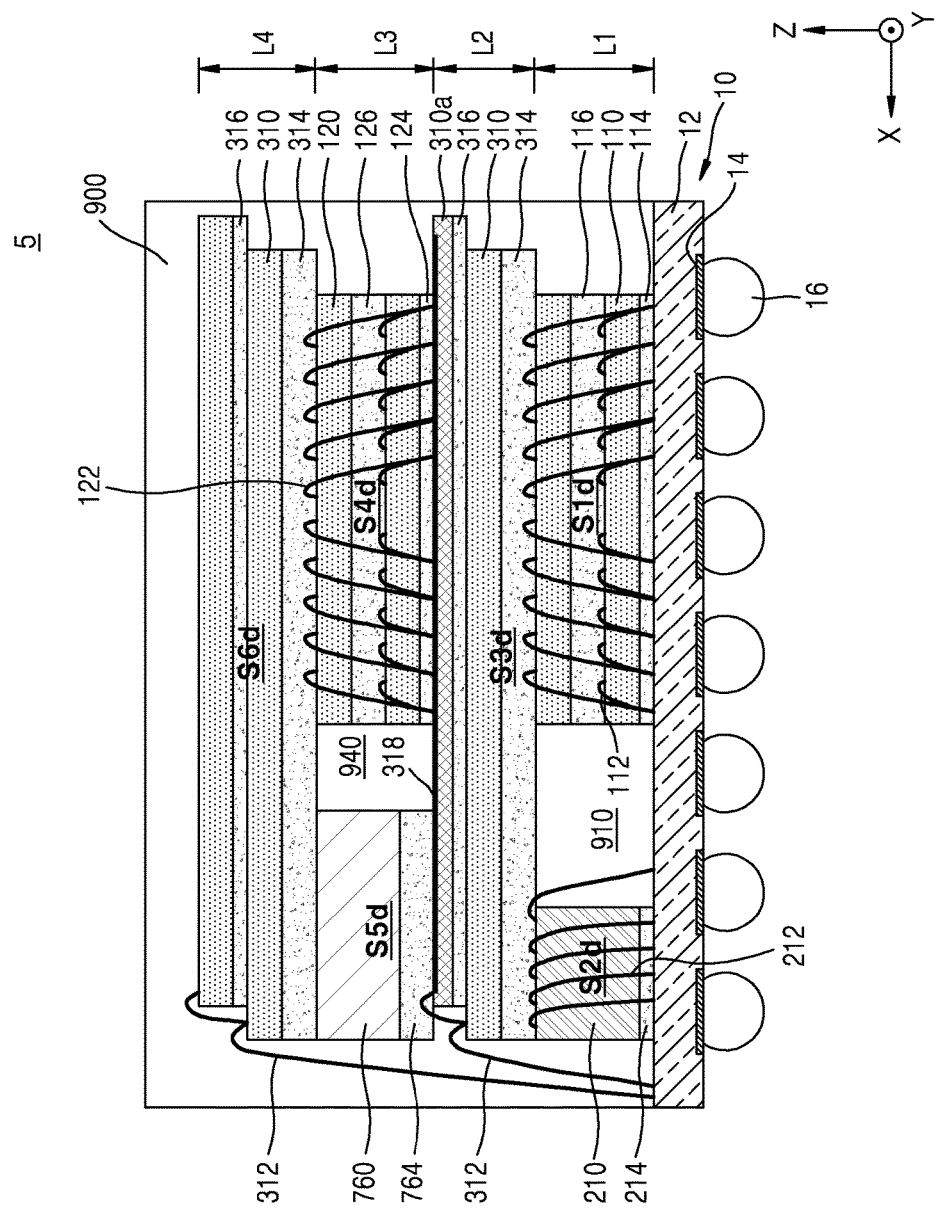
FIG. 8B is a cross-sectional view of the semiconductor package of FIG. 8A.

FIG. 8A is a plan layout illustrating a main portion of a semiconductor package 5 according to an embodiment, and FIG. 8B is a cross-sectional view of the semiconductor package 5 of FIG. 8A. In providing descriptions with reference to FIGS. 8A and 8B, details which are the same as the details described above with reference to FIGS. 1A to 7E may not be repeated.

Referring to FIGS. 8A and 8B, the semiconductor package 5 may include a package substrate 10 and a plurality of structures S1d, S2d, S3d, S4d, S5d and S6d stacked on the package substrate 10.

A first structure S1d and S2d disposed in a first layer L1 may be attached to the package substrate 10. The first structure S1d and S2d may include a first sub-structure S1d and a second sub-structure S2d. The first sub-structure S1d and the second sub-structure S2d may be disposed on the package substrate 10 and spaced apart from each other.

A second structure S3d disposed in a second layer L2 may be attached to the first structure S1d and S2d. The second structure S3d may be attached over the first sub-structure S1d and the second sub-structure S2d. The second structure S3d may comprise only one sub-structure. When the second structure S3d is configured with one sub-structure, the second structure S3d may be referred to as a third sub-structure S3d.

The third sub-structure S3d may be attached over the first sub-structure S1d and the second sub-structure S2d to protrude from the first sub-structure S1d and the second sub-structure S2d to the outside and not to protrude from at least one side surface of the second sub-structure S2d to the outside.

Therefore, a portion adjacent to at least one side surface of the third sub-structure S3d may be attached over the first sub-structure S1d and the second sub-structure S2d to overhang the first sub-structure S1d and the second sub-structure S2d.

The first sub-structure S1d may comprise at least one first lower semiconductor chip 110. The second sub-structure S2d may comprise a second semiconductor chip 210. The third sub-structure S3d may comprise a plurality of third lower semiconductor chips 310 and 310a, which are stacked.

A third bonding wire 312 may be connected to a portion adjacent to a side surface of at least one of the third lower semiconductor chips 310 and 310a. A side surface of a lowermost third semiconductor chip 310 connected to the third bonding wire 312 may be aligned to match a side surface of the second sub-structure S2d (i.e., the second semiconductor chip 210) with respect to a top down view. That is, at least one side surface of the third sub-structure S3d may be aligned to match a side surface of the second sub-structure S2d with respect to a top down view.

A third structure S4d and S5d disposed in a third layer L3 may be attached to the second structure S3d. The third structure S4d and S5d may include a fourth sub-structure S4d and a fifth sub-structure S5d. The fourth sub-structure S4d and the fifth sub-structure S5d may be disposed on the second structure S3d and spaced apart from each other.

A fourth structure S6d disposed in a fourth layer L4 may be attached to the third structure S4d and S5d. The fourth structure S6d may be attached over the fourth sub-structure S4d and the fifth sub-structure S5d. The fourth structure S6d may comprise only one sub-structure. When the fourth structure S6d is configured with one sub-structure, the fourth structure S6d may be referred to as a sixth sub-structure S6d.

The sixth sub-structure S6d may be attached over the fourth sub-structure S4d and the fifth sub-structure S5d to protrude from the fourth sub-structure S4d and the fifth sub-structure S5d to the outside and not to protrude from at least one side surface of the fifth sub-structure S5d to the outside.

Therefore, a portion adjacent to at least one side surface of the sixth sub-structure S6d may be attached over the fourth sub-structure S4d and the fifth sub-structure S5d to overhang the fourth sub-structure S4d and the fifth sub-structure S5d.

The fourth sub-structure S4d may comprise at least one first lower semiconductor chip 120. The fifth sub-structure S5d may comprise a supporter 760. The sixth sub-structure S6d may comprise a plurality of third upper semiconductor chips 310, which are stacked.

The third bonding wire 312 may be connected to a portion adjacent to at least one side surface of the third upper semiconductor chip 310. A side surface of a lowermost third semiconductor chip 310 connected to the third bonding wire 312 may be aligned to match a side surface of the fifth sub-structure S5d (i.e., the supporter 760) with respect to a top down view. That is, at least one side surface of the sixth structure S6d may be aligned to match a side surface of the fifth sub-structure S5d with respect to a top down view.

When the third sub-structure S3d includes a plurality of third lower semiconductor chips 310 and 310a which are stacked in a stair structure, one side surface of the fifth sub-structure S5d may protrude from one side surface of the third semiconductor chip 310a, disposed on an upper position among the plurality of third lower semiconductor chips 310 and 310a included in the third sub-structure S3d, to the outside and may be aligned to match one side surface of a lowermost third semiconductor chip 310 with respect to a top down view.

A redistribution wiring pattern 318 may be provided on an upper surface of an uppermost third lower semiconductor chip 310a among the plurality of third lower semiconductor chips 310 and 310a. A first upper bonding wire 122 connected to the first upper semiconductor chip 120 may be electrically connected to the redistribution wiring pattern 318. At least a portion of the third bonding wire 312 may be connected to the redistribution wiring pattern 318. Therefore, the first upper semiconductor chip 120 may be electrically connected to the package substrate 10 through the first upper bonding wire 122, the redistribution wiring pattern 318, and the third bonding wire 312.

In some embodiments, the redistribution wiring pattern 318 may not be provided, and the first upper semiconductor chip 120 may be electrically connected to the package substrate 10 through the first upper bonding wire 120.

Figure 9A:
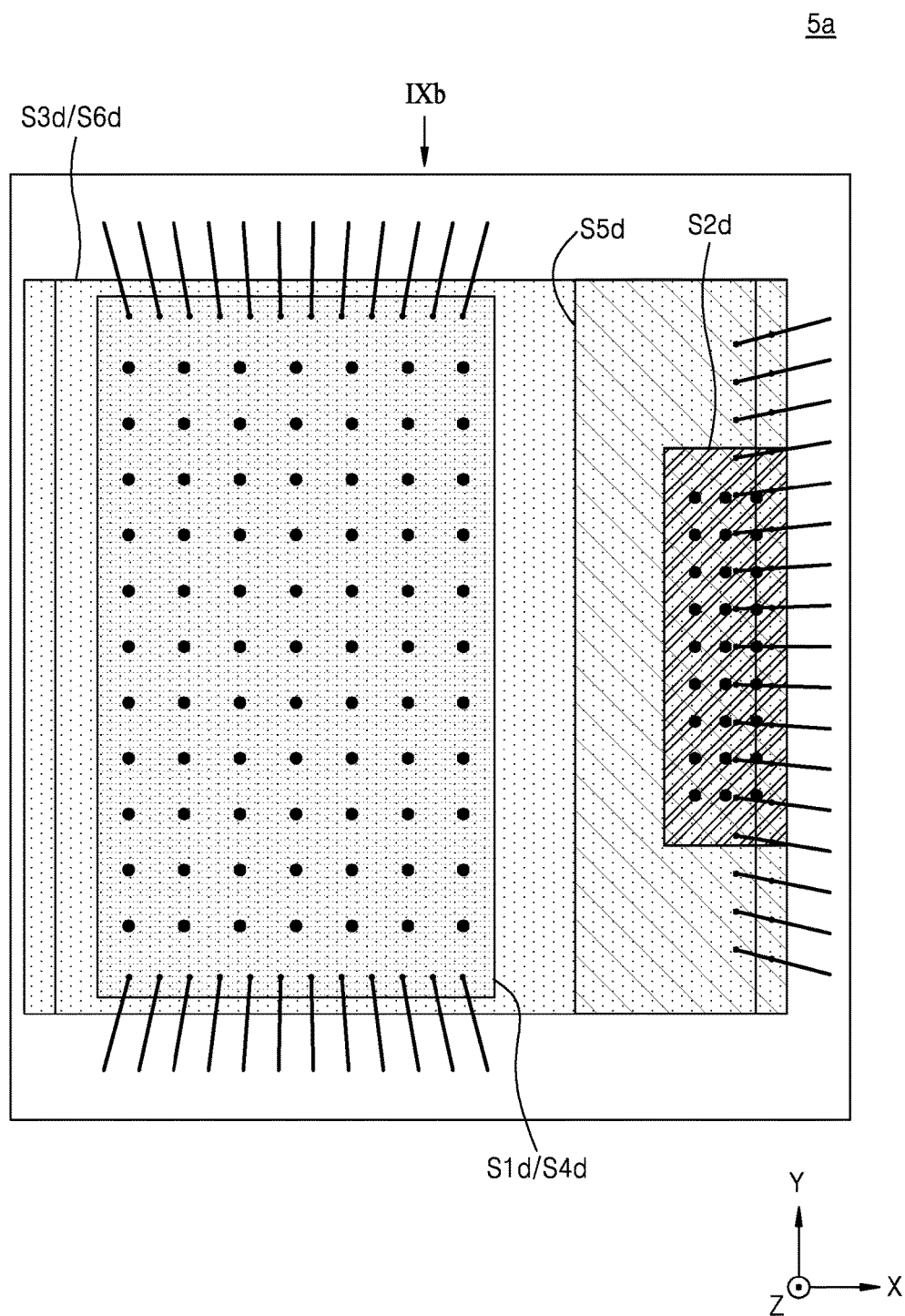
FIG. 9A is a plan layout illustrating a main portion of a semiconductor package according to an embodiment.

FIG. 9A is a plan layout illustrating a main portion of a semiconductor package 5a according to an embodiment, and FIG. 9B is a cross-sectional view of the semiconductor package 5a of FIG. 9A. In providing descriptions with reference to FIGS. 9A and 9B, details which are the same as the details described above with reference to FIGS. 8A and 8B may not be repeated.

Referring to FIGS. 9A and 9B, the semiconductor package 5a may include a package substrate 10 and a plurality of structures S1d, S2d, S3d, S4d, S5d and S6d stacked on the package substrate 10.

A first structure S1d and S2d disposed in a first layer L1 may be attached to the package substrate 10. The first structure S1d and S2d may include a first sub-structure S1d and a second sub-structure S2d. The first sub-structure S1d and the second sub-structure S2d may be disposed on the package substrate 10 and spaced apart from each other.

A second structure S3d disposed in a second layer L2 may be attached to the first structure S1d and S2d. The second structure S3d may be attached over the first sub-structure S1d and the second sub-structure S2d. The second structure S3d may comprise only one sub-structure. When the second structure S3d is configured with one sub-structure, the second structure S3d may be referred to as a third sub-structure S3d.

A third structure S4d and S4d disposed in a third layer L3 may be attached to the second structure S3d. The third structure S4d and S4d may include a fourth sub-structure S4d and a fifth sub-structure S5d. The fourth sub-structure S4d and the fifth sub-structure S5d may be disposed on the second structure S3d and spaced apart from each other.

A fourth structure S6d disposed in a fourth layer L4 may be attached to the third structure S4d and S4d. The fourth structure S6d may be attached over the fourth sub-structure S4d and the fifth sub-structure S5d. The fourth structure S6d may comprise only one sub-structure. When the fourth structure S6d is configured with one sub-structure, the fourth structure S6d may be referred to as a sixth sub-structure S6d.

The first sub-structure S1d may comprise at least one first lower semiconductor chips 110b and 110. When the first sub-structure S1d is configured with the first lower semiconductor chips 110b and 110, in a lowermost first lower semiconductor chip 110b, an active surface where a plurality of individual devices are provided may face the package substrate 10. The lowermost first lower semiconductor chip 110b may be electrically connected to the package substrate 10 through a first connection bump 112b. In some embodiments, an under-fill material layer 114b surrounding the first connection bump 112b may be formed between the lowermost first lower semiconductor chip 110b and the package substrate 10.

Therefore, a first die attach film 124b between the lowermost first lower semiconductor chip 110b and the first lower semiconductor chip 110 thereon may have a thickness thinner than that illustrated in FIG. 8B.

In the second semiconductor chip 220, an active surface where a plurality of individual devices are provided may face the package substrate 10. The second semiconductor chip 220 may be electrically connected to the package substrate 10 through a second connection bump 222. In some embodiments, an under-fill material layer 224 surrounding the second connection bump 222 may be formed between the second semiconductor chip 220 and the package substrate 10.

Except that the lowermost first lower semiconductor chip 110b and the second semiconductor chip 220 are electrically connected to the package substrate 10 through the first connection bumps 112b and the second connection bump 222 and the first die attach film 124b between the lowermost first lower semiconductor chip 110b and the first lower semiconductor chip 110 thereon may have a relatively thin thickness, the semiconductor package 5a of FIGS. 9A and 9B may be the same as the semiconductor package 5 of FIGS. 8A and 8B, and thus, further detailed description is omitted.

Figure 10A:
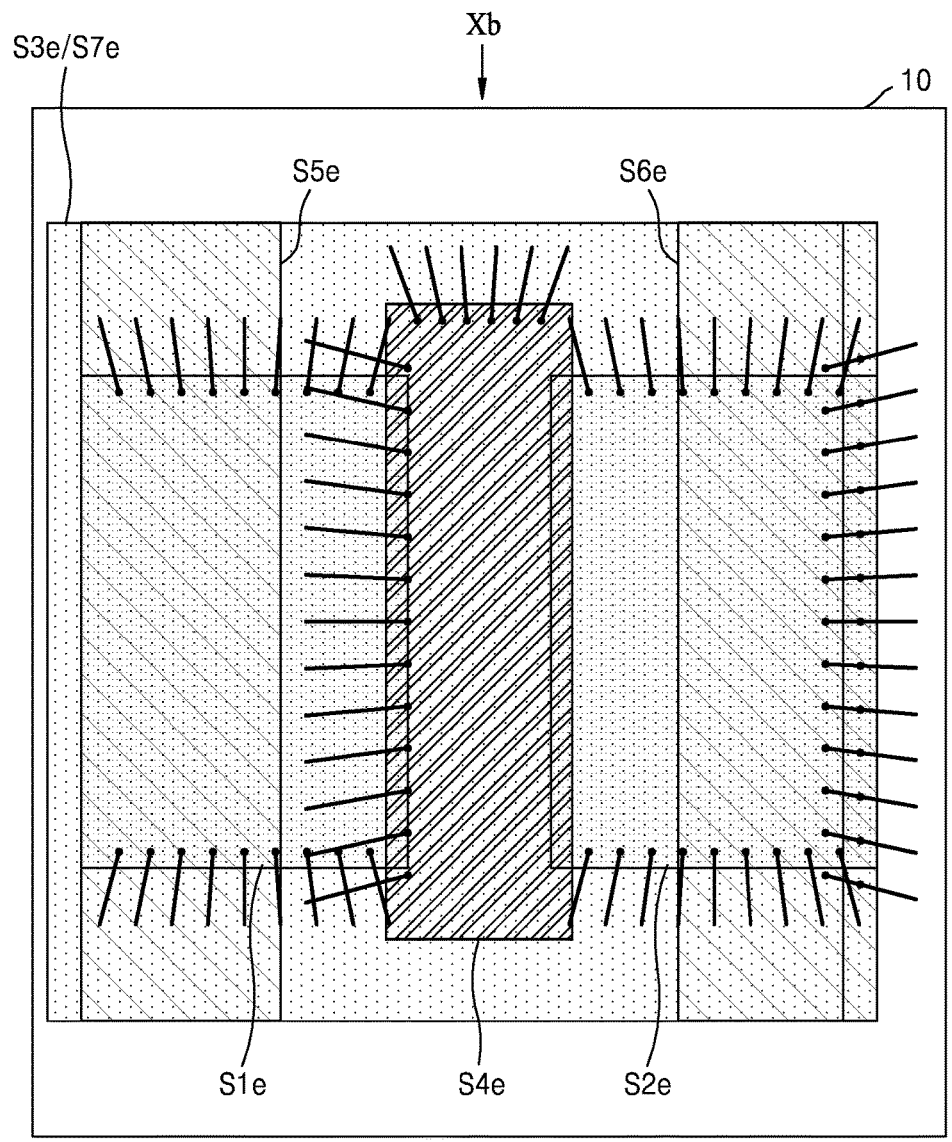
FIG. 10A is a plan layout illustrating a main portion of a semiconductor package according to an embodiment.
Figure 10B:
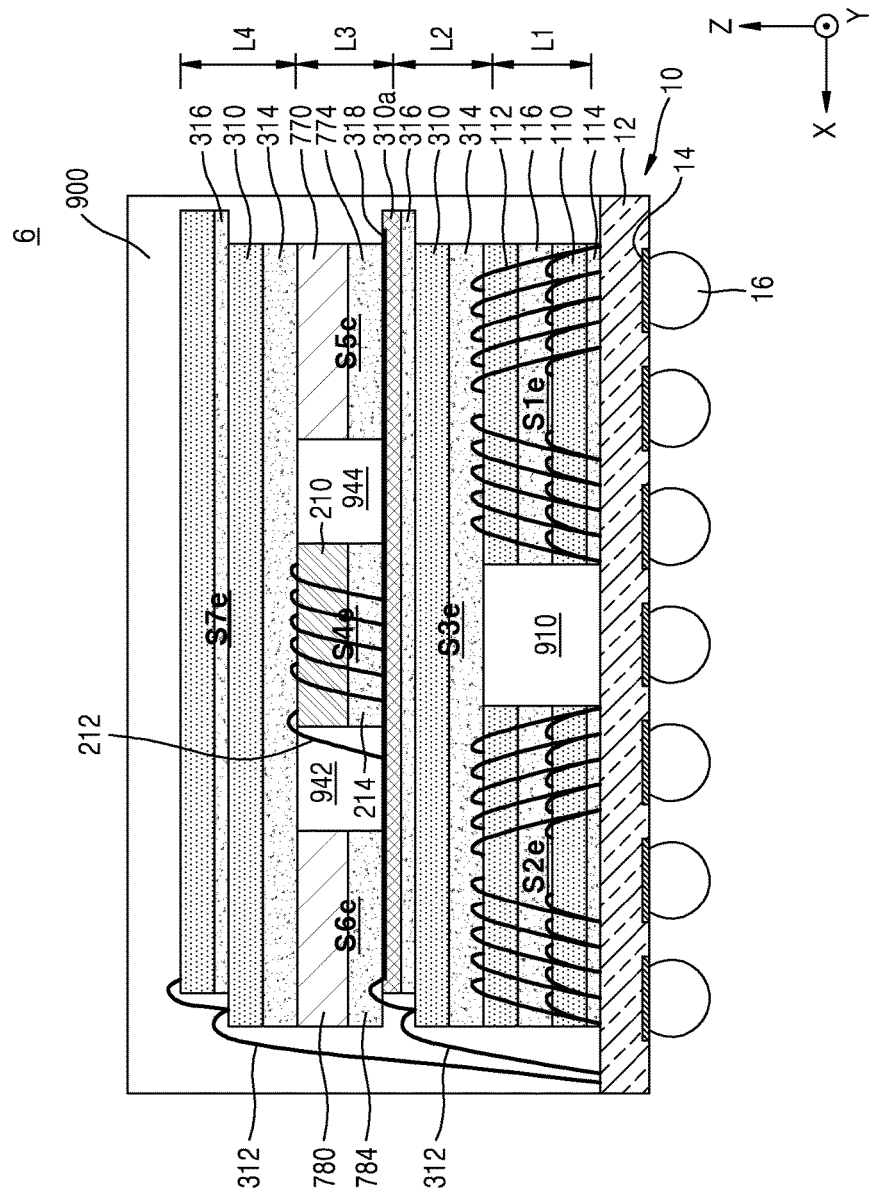
FIG. 10B is a cross-sectional view of the semiconductor package of FIG. 10A.

FIG. 10A is a plan layout illustrating a main portion of a semiconductor package 6 according to an embodiment, and FIG. 10B is a cross-sectional view of the semiconductor package 6 of FIG. 10A. In providing descriptions with reference to FIGS. 10A and 10B, details which are the same as the details described above with reference to FIGS. 8A to 9B are may not be repeated.

Referring to FIGS. 10A and 10B, the semiconductor package 6 may include a package substrate 10 and a plurality of structures S1e, S2e, S3e, S4e, S5e, She and S7e stacked on the package substrate 10.

A first structure S1e and S2e disposed in a first layer L1 may be attached to the package substrate 10. The first structure S1e and S2e may include a first sub-structure S1e and a second sub-structure S2e. The first sub-structure S1e and the second sub-structure S2e may be disposed on the package substrate 10 and spaced apart from each other.

A second structure S3e disposed in a second layer L2 may be attached to the first structure S1e and S2e. The second structure S3e may be attached over the first sub-structure S1e and the second sub-structure S2e. The second structure S3e may comprise only one sub-structure. When the second structure S3e is configured with one sub-structure, the second structure S3e may be referred to as a third sub-structure S3e.

A third bonding wire 312 may be connected to a portion adjacent to a side surface of at least one of a plurality of third lower semiconductor chips 310 and 310a. A side surface of a lowermost third lower semiconductor chip 310 connected to the third bonding wire 312 may be aligned to match a side surface of the second sub-structure S2e (i.e., the first semiconductor chip 110) with respect to a top down view. That is, at least one side surface of the third structure S3e may be aligned to match a side surface of the second sub-structure S2e with respect to a top down view.

In some embodiments, a side surface opposite to a side surface of the lowermost third lower semiconductor chip 310 connected to the third bonding wire 312 may be aligned to match a side surface of the first sub-structure S1e (i.e., the first semiconductor chip 110) with respect to a top down view.

The third sub-structure S3e may be attached over the first sub-structure S1e and the second sub-structure S2e to protrude from the first sub-structure S1e and the second sub-structure S2e to the outside and not to protrude from at least one side surface of the second sub-structure S2e to the outside. Both opposite side surfaces of the lowermost third lower semiconductor chip 310 included in the third sub-structure S3e may be aligned to match one side surface of each of the first sub-structure S1e and the second sub-structure S2e with respect to a top down view.

A third structure S4e, S5e and She disposed in a third layer L3 may be attached to the second structure S3e. The third structure S4e, S5e and She may include a fourth sub-structure S4e, a fifth sub-structure S5e, and a sixth sub-structure S6e. The fourth sub-structure S4e, the fifth sub-structure S5e, and the sixth sub-structure S6e may be disposed on the second structure S3e and spaced apart from each other.

A fourth structure S7e disposed in a fourth layer L4 may be attached to the third structure S4e, S5e and S6e. The fourth structure S7e may be attached over the fourth sub-structure S4e, the fifth sub-structure S5e, and the sixth sub-structure S6e. The fourth structure S7e may comprise only one sub-structure. When the fourth structure S7e is configured with one sub-structure, the fourth structure S7e may be referred to as a seventh sub-structure S7e.

The fourth sub-structure S4e may comprise a second semiconductor chip 210. The fifth sub-structure S5e and the sixth sub-structure S6e may each comprise a first supporter 770 and a second supporter 780. The seventh sub-structure S7e may comprise a plurality of third upper semiconductor chips 310, which are stacked.

A third bonding wire 312 may be connected to a portion adjacent to a side surface of at least one of the third upper semiconductor chips 310. A side surface of a lowermost third upper semiconductor chip 310 connected to the third bonding wire 312 may be aligned to match a side surface of the second supporter 780 with respect to a top down view. That is, at least one side surface of the seventh sub-structure S7e may be aligned to match a side surface of the sixth sub-structure S6e with respect to a top down view.

In some embodiments, a side surface opposite to a side surface of the lowermost third upper semiconductor chip 310 connected to the third bonding wire 312 may be aligned to match a side surface of the fifth sub-structure S5e (i.e., the first supporter 770) with respect to a top down view.

The seventh sub-structure S7e may be attached over the fifth sub-structure S5e and the sixth sub-structure S6e to protrude from the fifth sub-structure S5e and the sixth sub-structure S6e to the outside and not to protrude from at least one side surface of the sixth sub-structure S6e to the outside. Both opposite side surfaces of the lowermost third upper semiconductor chip 310 included in the seventh sub-structure S7e may be aligned to match one side surface of each of the fifth sub-structure S5e and the sixth sub-structure S6e with respect to a top down view.

A redistribution wiring pattern 318 may be provided on an upper surface of an uppermost third lower semiconductor chip 310a among the plurality of third lower semiconductor chips 310 and 310a. A second bonding wire 212 connected to the second semiconductor chip 210 may be electrically connected to the redistribution wiring pattern 318. At least a portion of the third bonding wire 312 may be connected to the redistribution wiring pattern 318. Therefore, the second semiconductor chip 210 may be electrically connected to the package substrate 10 through the second bonding wire 212, the redistribution wiring pattern 318, and the third bonding wire 312.

Figure 11:
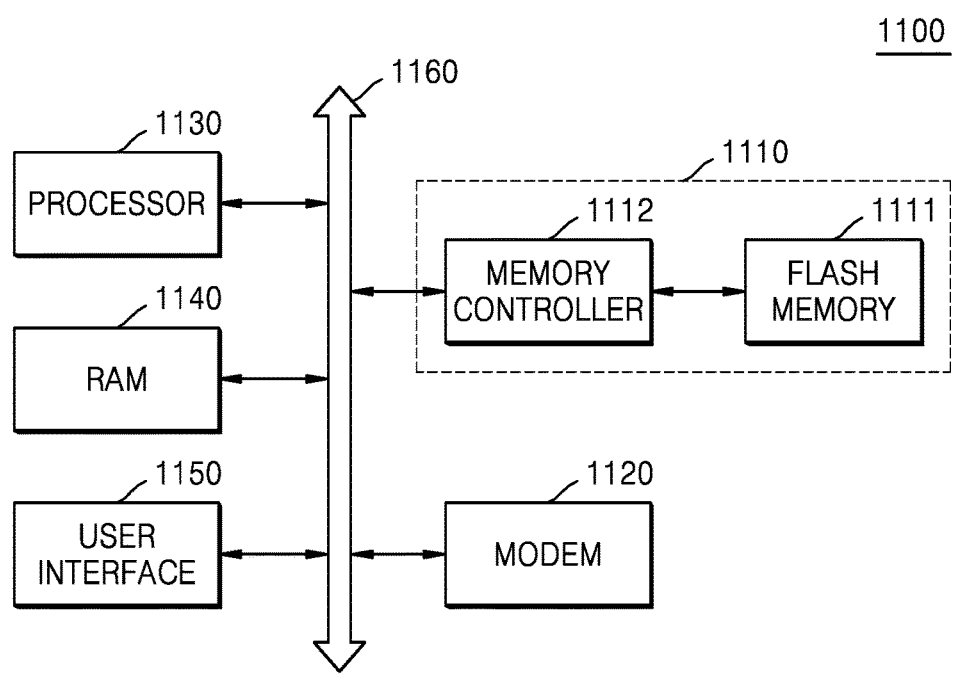
FIG. 11 is a block diagram of a system according to an embodiment.

FIG. 11 is a block diagram of a system 1100 according to an embodiment.

Referring to FIG. 11, the system 1100 may include a processor 1130 such as a central processing unit (CPU), random access memory (RAM) 1140, a user interface 1150, and a modem 1120 which perform communication through a common bus 1160. Each of the elements may transmit a signal to a storage device 1110 and may receive the signal from the storage device 1110 through the common bus 1160. The storage device 1110 may include a flash memory 1111 and a memory controller 1112. The flash memory 1110 may store data and may have nonvolatile characteristic where stored data is maintained as-is even when the supply of power is blocked. The storage device 1110 and the RAM 1140 may comprise one of the semiconductor packages 1, 1a, 2, 2a, 3, 4, 4a, 5, 5a and 6 described above with reference to FIGS. 1A to 10B.

Accordingly, both a storage device and RAM may be implemented by using one semiconductor package, and thus, the system 1100 according to an embodiment is miniaturized and largely scaled in capacity.

As described above, in the semiconductor package according to the embodiments, various kinds of semiconductor chips having various sizes may be stacked, and in this case, since a lower semiconductor chip functions as a support that supports an upper semiconductor chip, various kinds of semiconductor chips are stably stacked, and damage to the semiconductor chips is prevented in a process of connecting each of the semiconductor chips to a package substrate through a bonding wire, thereby providing a semiconductor package with high reliability.

While the inventive concept has been particularly shown and described with reference to embodiments thereof, it will be understood that various changes in form and details may be made therein without departing from the spirit and scope of the following claims.

What is claimed is:

1. A multi-chip semiconductor device package comprising:
    a package substrate;
    a DRAM layer comprising a first DRAM semiconductor chip confined within a first area with respect to a top down view;
    a memory controller layer comprising a memory controller semiconductor chip confined within a second area with respect to a top down view, and a first support structure spaced apart from the memory controller semiconductor chip, wherein top surfaces of the memory controller semiconductor chip and the first support structure are substantially coplanar and wherein the first support structure does not comprise any logic circuitry;
    a nonvolatile memory layer comprising a stack of nonvolatile memory semiconductor chips, a first nonvolatile memory semiconductor chip of the nonvolatile memory semiconductor chips confined within a third area with respect to a top down view; and
    an encapsulant about sides of and above the semiconductor chips of the DRAM layer, the memory controller layer and the nonvolatile memory layer,
    wherein one of the DRAM layer and the memory controller layer is a first layer of the semiconductor device package, and the other of the DRAM layer and the memory controller layer is a second layer of the semiconductor device package, and the nonvolatile memory layer is a third layer of the semiconductor device package,
    wherein the first layer is on the package substrate, the second layer is on the first layer and the third layer is on the second layer,
    wherein the third area is larger than the first area and larger than the second area,
    wherein the DRAM layer is the first layer and comprises a second DRAM semiconductor chip adjacent to the first DRAM semiconductor chip,
    wherein the memory controller layer is the second layer and comprises a second support structure spaced apart from the first support structure and the memory controller semiconductor chip,
    wherein the memory controller semiconductor chip is on the first DRAM semiconductor chip and the second support structure is on the second DRAM semiconductor chip.

2. The semiconductor device package of claim 1,
    wherein the package substrate comprises first wiring electrically connected to chip pads of the first DRAM semiconductor chip, second wiring electrically connecting first chip pads of the memory controller semiconductor chip to external terminal of the semiconductor device package, and third wiring electrically connected to chip pads of the first nonvolatile memory semiconductor chip, and
    wherein second chip pads of the memory controller semiconductor chip are connected to the first wiring of the package substrate and third chip pads of the memory controller semiconductor chip are connected to the third wiring of the package substrate.

3. The semiconductor device package of claim 2, wherein the first wiring is not connected to the nonvolatile memory semiconductor chips and the third wiring is not connected to the first DRAM semiconductor chip.

4. The semiconductor device package of claim 1,
    wherein the nonvolatile memory layer comprises a first die attach film attached on a bottom surface of the first nonvolatile memory semiconductor chip, a second nonvolatile memory semiconductor chip of the stack of nonvolatile memory semiconductor chips, and a second die attach film attached on a bottom surface of the second nonvolatile memory semiconductor chip,
    wherein the first die attach film is in contact with a semiconductor chip of the second layer, the second die attach film is in contact with the first nonvolatile memory semiconductor chip, and a thickness of the first die attach film is greater than a thickness of the second die attach film.

5. The semiconductor device package of claim 1, wherein the first support structure spaced apart from the memory controller semiconductor chip has a thickness no larger than a thickness of the memory controller semiconductor chip and is confined within a fourth area with respect to a top down view, the fourth area being larger than the second area.

6. The semiconductor device package of claim 5, wherein the fourth area is smaller than the third area.

7. The semiconductor device package of claim 6, wherein the thickness of the first support structure is substantially the same as the thickness of the memory controller semiconductor chip.

8. The semiconductor device package of claim 1,
wherein top surfaces of the first support structure and second support structure are coplanar,
wherein thicknesses of the first support structure and the second support structure are different.

9. The semiconductor device package of claim 1, wherein, with respect to a top down view, no edge of the memory controller semiconductor chip extends past an edge of the first DRAM semiconductor chip.

10. The semiconductor device package of claim 1,
wherein the first layer comprises a first die attach film having a first thickness and connecting the first layer to a top surface of the package substrate,
wherein the second layer comprises a second die attach film having a second thickness and connecting the second layer to a top surface of the first layer,
wherein the third layer comprises a third die attach film having a third thickness and connecting the third layer to a top surface of the second layer,
wherein the stack of nonvolatile memory semiconductor chips comprises a second nonvolatile memory semiconductor chip and a fourth die attach film having a fourth thickness attaches the second nonvolatile memory semiconductor chip to a top surface of the first nonvolatile memory semiconductor chip,
wherein the fourth thickness is less than each of the second thickness and the third thickness.

11. The semiconductor device package of claim 10, wherein each of the second thickness and the third thickness are substantially the same thickness.

12. The semiconductor device package of claim 1,
wherein each of the first layer, the second layer and the third layer comprise a corresponding first die attach film and a corresponding second die attach film,
wherein each of the first die attach films have a thickness less than each of the second die attach films.

13. The semiconductor device package of claim 1, wherein the first support structure is one of monolithic crystalline semiconductor structure and a monolithic ceramic structure.

14. The semiconductor device package of claim 1, wherein the first support structure has a size and shape the same as those of the memory controller semiconductor chip.

15. The semiconductor device package of claim 1, wherein the first support structure is a portion of both the memory controller layer and the DRAM layer and has a bottom attached to a top surface of the package substrate with a first die attach film and a top surface attached to the nonvolatile memory layer with a second die attach film.

16. The semiconductor device package of claim 15, wherein the first support structure has a first side aligned with a first side of the first nonvolatile memory semiconductor chip.

17. The semiconductor device package of claim 16, further comprising a space separating the first support structure and the memory controller semiconductor chip and extending along an entire second side of the first support structure, the second side of the first support structure being opposite to the first side of the first support structure and facing a center of the semiconductor device package, the space being filled with the encapsulant.

18. The semiconductor device package of claim 1, further comprising a first space separating the first support structure and the memory controller semiconductor chip and extending along an entire side of the first support structure that faces the memory controller semiconductor chip, the first space being filled with the encapsulant.

19. The semiconductor device package of claim 18, wherein the encapsulant filling the first space extends from a first side of the memory controller layer to a second side of the memory controller layer to integrally merge with encapsulant forming a first side of the semiconductor device package corresponding to the first side of the memory controller layer and encapsulant forming a second side of the semiconductor device package corresponding to the second side of the memory controller layer.

* * * * *